United States Patent
Yamazaki et al.

(10) Patent No.: US 10,115,742 B2
(45) Date of Patent: Oct. 30, 2018

(54) SEMICONDUCTOR DEVICE AND DISPLAY DEVICE INCLUDING THE SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Kenichi Okazaki, Tochigi (JP); Masashi Tsubuku, Kasukabe (JP); Haruyuki Baba, Isehara (JP); Sachie Shigenobu, Tochigi (JP); Emi Koezuka, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/427,695

(22) Filed: Feb. 8, 2017

(65) Prior Publication Data
US 2017/0236844 A1   Aug. 17, 2017

(30) Foreign Application Priority Data

Feb. 12, 2016   (JP) .................. 2016-024579
Jun. 24, 2016   (JP) .................. 2016-125375

(51) Int. Cl.
*H01L 29/417* (2006.01)
*H01L 27/12* (2006.01)
(Continued)

(52) U.S. Cl.
CPC .... *H01L 27/1225* (2013.01); *H01L 29/41733* (2013.01); *H01L 29/42384* (2013.01); *H01L 29/7869* (2013.01)

(58) Field of Classification Search
CPC ............. H01L 27/1225; H01L 29/7869; H01L 29/41733; H01L 29/42384
See application file for complete search history.

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

CN   102184965 A   9/2011
EP   1737044 A   12/2006
(Continued)

OTHER PUBLICATIONS

International Search Report (Application No. PCT/IB2017/050554) dated May 23, 2017.
(Continued)

*Primary Examiner* — Earl Taylor
(74) *Attorney, Agent, or Firm* — Robinson Intellectual Property Law Office; Eric J. Robinson

(57) ABSTRACT

In a transistor including an oxide semiconductor, a variation in electrical characteristics is suppressed and reliability is improved. A semiconductor device includes a transistor. The transistor includes a first gate electrode, a first insulating film over the first gate electrode, an oxide semiconductor film over the first insulating film, a second insulating film over the oxide semiconductor film, a second gate electrode over the second insulating film, and a third insulating film over the oxide semiconductor film and the second gate electrode. The oxide semiconductor film includes a channel region overlapping with the second gate electrode, a source region in contact with the third insulating film, and a drain region in contact with the third insulating film. The first gate electrode and the second gate electrode are electrically connected to each other. A difference between a minimum value and a maximum value of the field-effect mobility in the case where the field-effect mobility in a saturation region of the transistor is measured.

22 Claims, 68 Drawing Sheets

(51) Int. Cl.
  *H01L 29/423* (2006.01)
  *H01L 29/786* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 9,494,830 B2 * | 11/2016 | Yamazaki ......... G02F 1/136213 |
| 9,837,547 B2 * | 12/2017 | Koezuka ............ H01L 29/7869 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0244022 A1 | 9/2010 | Takahashi et al. |
| 2011/0175674 A1 | 7/2011 | Shimizu et al. |
| 2013/0320334 A1 | 12/2013 | Yamazaki et al. |
| 2014/0124776 A1 | 5/2014 | Takahashi et al. |
| 2014/0361292 A1 | 12/2014 | Yamazaki et al. |
| 2014/0362324 A1 * | 12/2014 | Yamazaki ......... G02F 1/136213 349/47 |
| 2015/0243738 A1 | 8/2015 | Shimomura et al. |
| 2015/0349131 A1 | 12/2015 | Atsumi et al. |
| 2015/0372146 A1 | 12/2015 | Shishido et al. |
| 2016/0013321 A1 | 1/2016 | Kobayashi et al. |
| 2016/0155759 A1 | 6/2016 | Yamazaki et al. |
| 2016/0225772 A1 | 8/2016 | Tsubuku et al. |
| 2017/0170325 A1 | 6/2017 | Koezuka et al. |
| 2017/0236844 A1 * | 8/2017 | Yamazaki ........... H01L 27/1225 257/43 |
| 2017/0271378 A1 * | 9/2017 | Yamazaki ........... H01L 27/1229 |
| 2017/0350002 A1 * | 12/2017 | Yamazaki ........... C23C 14/3414 |
| 2017/0352690 A1 * | 12/2017 | Yamazaki ........... H01L 29/7869 |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-176865 A | 8/2009 |
| JP | 2009-278115 A | 11/2009 |
| JP | 2011-146574 A | 7/2011 |
| JP | 2014-007399 A | 1/2014 |
| JP | 2015-014786 A | 1/2015 |
| JP | 2015-195327 A | 11/2015 |
| TW | 201001710 | 1/2010 |
| TW | 201507163 | 2/2015 |

(56) References Cited

FOREIGN PATENT DOCUMENTS

| WO | WO-2004/114391 | 12/2004 |
|---|---|---|
| WO | WO-2009/093722 | 7/2009 |
| WO | WO-2014/196550 | 12/2014 |

OTHER PUBLICATIONS

Written Opinion (Application No. PCT/IB2017/050554) dated May 23, 2017.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973. vol. 45A. No. 2. pp. 115-116.
Costello.M et al., "Electron Microscopy of a Cholesteric Liquid Crystal and Its Blue Phase", Phys. Rev. A (Physical Review. A). May 1, 1994, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashir et al., "42.1; Invited Paper: Improved Amorphous In—Ga—Zn—O TFTs", SID Digest '08 : SID International Symposium Digest of Technical Papers, May 20, 2008. vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review, B), Oct. 4, 2007, vol. 76, No. 16, pp. 165202-1-165202-22.
Janotti.A et al., "Oxygen Vacancies in ZnO", Appl. Phys. Lett, (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTS Array", SID Digest '08 : SID International Symposium Digest of Technical Papers, May 20, 2008. vol. 39. No. 1, pp. 1-4.
Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer". Adv. Mater. (Advanced Materials), 2006, vol. 18. No. 3, pp. 339-342.
Kikuchi.H et al., "39.1:Invited Paper:Optically Isotropic Nano-Structured Liquid Crystal Composites for Display Applications". SID Digest '09 : SID International Symposium Digest Of Technical Papers, May 31. 2009, pp. 578-581.
Kikuchi.H et al., "62.2; Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry. 1985, vol. 60. pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry. Apr. 1, 1995. vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 ; SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1218-1219.
Miyasaka.M, "Suftla Flexible Microelectronics on Their Way to Business", SID Digest '07 : SID International Symposium Digest of Technecal Papers, 2007, vol. 88, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", JPN. J. Appl. Phys. (Japanese Journal of Applied Physics ) , 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID Internateonal Symposium Digest of Technecal Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et el., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009. pp. 284-287.
Ohara.H et al., "Amorphous In—Ga—Zn-Oxide TFTs with Suppressed Variation for 4.0 inch QVGA AMOLED Display", AM-FPD '09 Digest Of Technical Papers, Jun. 1, 2009, pp. 227-230, The Japan Society of Applied Physics.
Orita.M et al., "Amorphous transparent conductive oxide $InGaO_3(ZnO)_m$ (m <4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61. No. 8, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED". AM-FPD '08 Digest of Technical Papers, Jul. 2, 2008. pp. 275-278.
Park.J et al., "Dry etching of ZnO films and plasma-induced damage to optical properties", J. Vac. Sci. Technol. B (Journal of Vacuumvscience & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262103-3.
Park.S et al., "Challenge to Future Displays: Transparent AM-OLED Driven by PEALD Grown ZnO TFT", IMID '07 Digest, 2007, pp. 1249-1252.
Parksang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys, Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT", SID Digest '08 : SID International Symposeum Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett, (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

100J

100J

Raw Image

Contrast Controlled

FIG. 34

| | Line Profile | | $R = \dfrac{A-A'}{B-B', C-C'}$ | FWHM |
|---|---|---|---|---|
| | A-A' | B-B', C-C' | | |
| Single Crystal | (00$\bar{l}$), (00$l$) peaks | single peak | $R \gg 1$ | Small |
| only CAAC | (00$\bar{l}$), (00$l$) peaks | single peak | $R \gg 1$ | Relatively Small |
| CAAC + Nano-crystal | (00$\bar{l}$), (00$l$) peaks | nc, nc peaks | $R > 1$ | Middle |
| Nano-crystal | nc, nc peaks | nc, nc peaks | $R = 1$ | Relatively Large |
| Amorphous | halo, halo | halo, halo | $R = 1$ or low intensity | Large |

FIG. 35A1
Sample X1: 170°C, O$_2$=30%
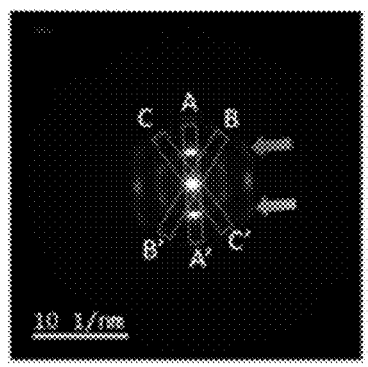
FIG. 35A2
Sample X1: 170°C, O$_2$=30%
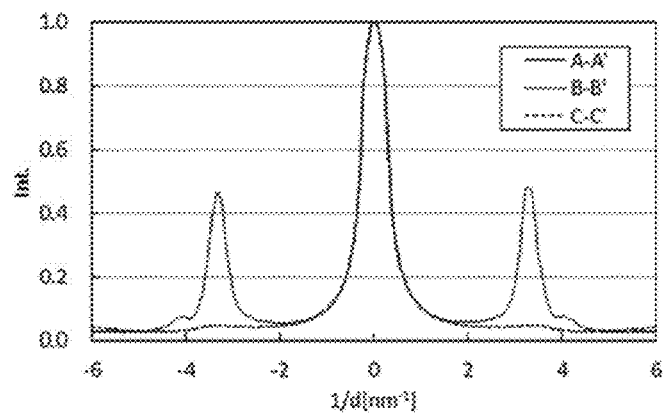
FIG. 35B1
Sample X2: 130°C, O$_2$=10%
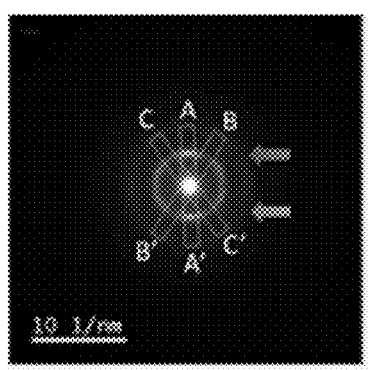
FIG. 35B2
Sample X2: 130°C, O$_2$=10%
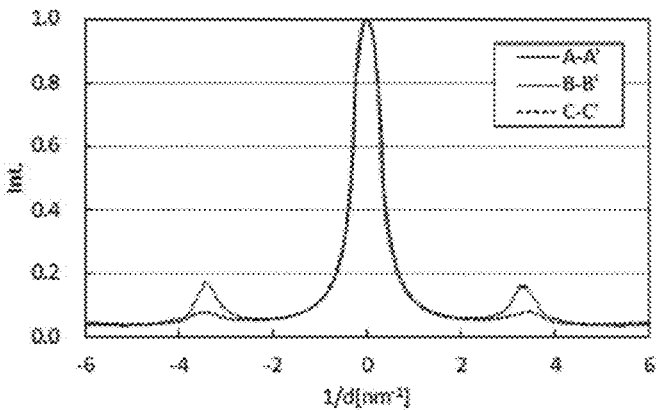
FIG. 35C1
Sample X3: R.T., O$_2$=10%
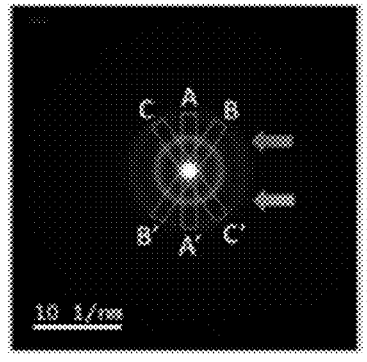
FIG. 35C2
Sample X3: R.T., O$_2$=10%
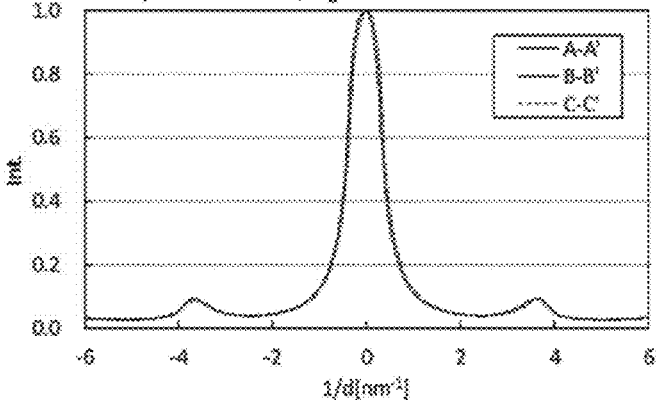

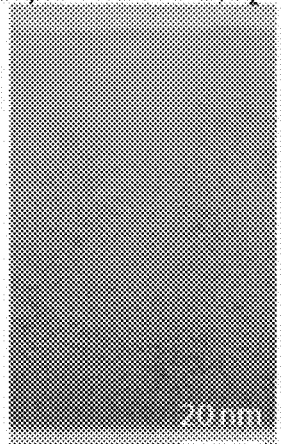
FIG. 37A1
Sample X1: 170°C, O₂=30%
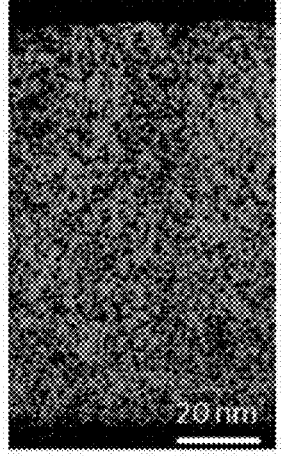
FIG. 37A2
Sample X1: 170°C, O₂=30%
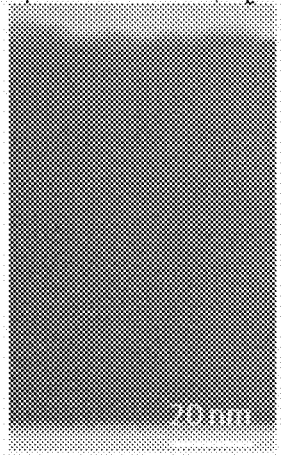
FIG. 37B1
Sample X2: 130°C, O₂=10%
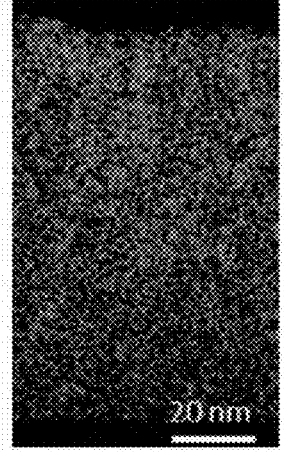
FIG. 37B2
Sample X2: 130°C, O₂=10%
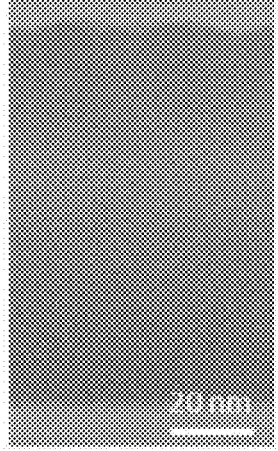
FIG. 37C1
Sample X3: R.T., O₂=10%
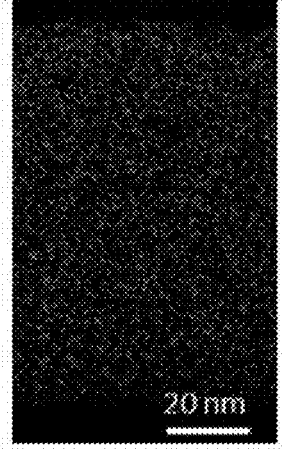
FIG. 37C2
Sample X3: R.T., O₂=10%

Sample C1: L/W=2/3 μm

Sample C2: L/W=3/3 μm

Sample C3: L/W=6/3 μm

Sample C4: L/W=10/3 μm

Sample D1: L/W=6/3 μm

Sample E1: L/W=6/3 μm

SEMICONDUCTOR DEVICE AND DISPLAY DEVICE INCLUDING THE SEMICONDUCTOR DEVICE

TECHNICAL FIELD

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. The present invention relates to a process, a machine, manufacture, or a composition of matter. In particular, one embodiment of the present invention relates to a semiconductor device, a display device, a light-emitting device, a power storage device, a storage device, a driving method thereof, and a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

BACKGROUND ART

Attention has been focused on a technique for forming a transistor using a semiconductor thin film formed over a substrate having an insulating surface (also referred to as a field-effect transistor (FET) or a thin film transistor (TFT)). Such transistors are used in a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention.

For example, a technique for forming a self-aligned top-gate transistor using an oxide thin film is disclosed (see Patent Document 1).

In addition, a semiconductor device achieving high field-effect mobility (simply referred to as mobility or µFE in some cases) with such a structure that a plurality of oxide semiconductor layers are stacked, the oxide semiconductor layer serving as a channel in the plurality of oxide semiconductor layers contains indium and gallium, and the proportion of indium is higher than the proportion of gallium (see Patent Document 2).

REFERENCE

Patent Documents

[Patent Document 1] Japanese Published Patent Application No. 2009-278115
[Patent Document 2] Japanese Published Patent Application No. 2014-007399

DISCLOSURE OF INVENTION

As a structure of a transistor including an oxide semiconductor film, a bottom-gate structure, a top-gate structure, and the like are given. In the case where a transistor including an oxide semiconductor film is used for a display device, a bottom-gate transistor is used more often than a top-gate transistor because its manufacturing process is relatively simple and its manufacturing cost is low.

However, a bottom-gate transistor has the following drawback: as the screen size of a display device increases or the resolution of an image of a display device increases, a typical example of which is a high-resolution display device with 4 k×2 k pixels (3840 pixels in the horizontal direction and 2160 pixels in the vertical direction) or 8 k×4 k pixels (7680 pixels in the horizontal direction and 4320 pixels in the vertical direction), signal delay or the like due to parasitic capacitance between a gate electrode and source and drain electrodes of the transistor becomes more severe, and accordingly, the image quality of the display device degrades. Thus, regarding a top-gate transistor including an oxide semiconductor film, a structure with stable semiconductor characteristics and high reliability is desired to be developed.

In view of the foregoing problems, an object of one embodiment of the present invention is to suppress a variation in electrical characteristics and improve reliability in a transistor including an oxide semiconductor. Another object of one embodiment of the present invention is to provide a top-gate transistor including an oxide semiconductor. Another object of one embodiment of the present invention is to provide a transistor including an oxide semiconductor and having high on-state current. Another object of one embodiment of the present invention is to provide a transistor including an oxide semiconductor and having low off-state current. Another object of one embodiment of the present invention is to provide a semiconductor device with low power consumption. Another object of one embodiment of the present invention is to provide a novel semiconductor device.

Note that the description of the above object does not disturb the existence of other objects. In one embodiment of the present invention, there is no need to achieve all the objects. Objects other than the above objects will be apparent from and can be derived from the description of the specification and the like.

One embodiment of the present invention is a semiconductor device including a transistor. The transistor includes a first gate electrode, a first insulating film over the first gate electrode, an oxide semiconductor film over the first insulating film, a second insulating film over the oxide semiconductor film, a second gate electrode over the second insulating film, and a third insulating film over the oxide semiconductor film and the second gate electrode. The oxide semiconductor film includes a channel region overlapping with the second gate electrode, a source region in contact with the third insulating film, and a drain region in contact with the third insulating film. The first gate electrode and the second gate electrode are electrically connected to each other. When the field-effect mobility in a saturation region of the transistor is measured, a difference between a minimum value and a maximum value of the field-effect mobility is less than or equal to 15 $cm^2/Vs$.

In the above embodiment, the field-effect mobility is preferably measured when voltages applied to the first gate electrode and the second gate electrode are in a range from 3 V to 10 V and a voltage applied to the drain region is in a range from 10 V to 20 V.

In the above embodiment, the oxide semiconductor film preferably contains In, M (M is Al, Ga, Y, or Sn), and Zn.

In the above embodiment, it is preferable that an atomic ratio of In to M and Zn be in a neighborhood of In:M:Zn=4:2:3, and that in the case where the proportion of In is 4, the proportion of M be greater than or equal to 1.5 and less than or equal to 2.5 and the proportion of Zn be greater than or equal to 2 and less than or equal to 4.

Another embodiment of the present invention is a display device including a display element and the semiconductor device of any one of the above embodiments. Another embodiment of the present invention is a display module including the display device and a touch sensor. Another embodiment of the present invention is an electronic device including the semiconductor device of any one of the above embodiments, the display device, or the display module; and an operation key or a battery.

According to one embodiment of the present invention, a variation in electrical characteristics can be suppressed and reliability can be improved in a transistor including an oxide semiconductor. According to one embodiment of the present invention, a top-gate transistor including an oxide semiconductor can be provided. According to one embodiment of the present invention, a transistor including an oxide semiconductor and having high on-state current can be provided. According to one embodiment of the present invention, a transistor including an oxide semiconductor and having low off-state current can be provided. According to one embodiment of the present invention, a semiconductor device with low power consumption can be provided. According to one embodiment of the present invention, a novel semiconductor device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIG. 34 shows a conceptual view illustrating line profiles of electron diffraction patterns, relative luminance R of the line profiles, and half widths of the line profiles;

FIGS. 35A1, 35A2, 35B1, 35B2, 35C1, and 35C2 show electron diffraction patterns and line profiles;

FIGS. 37A1, 37A2, 37B1, 37B2, 37C1, and 37C2 show cross-sectional TEM images of oxide semiconductor films and cross-sectional TEM images obtained through analysis thereof;

BEST MODE FOR CARRYING OUT THE INVENTION

Figure 1A:
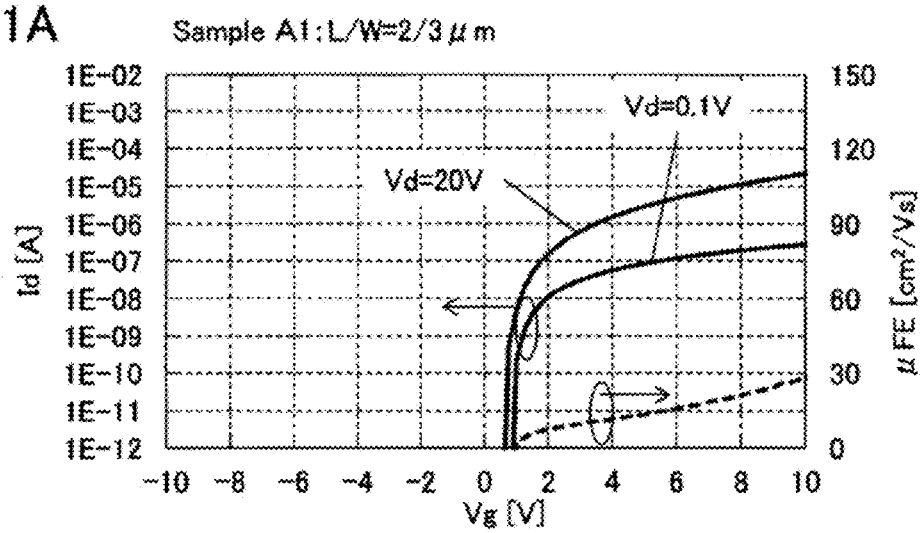
FIGS. 1A to 1C each show $I_d$-$V_g$ characteristics of a transistor.

Embodiments will be hereinafter described with reference to drawings. Note that the embodiments can be implemented in many different modes. It will be readily appreciated by those skilled in the art that modes and details can be changed in various ways without departing from the spirit and scope of the present invention. Therefore, the present invention should not be interpreted as being limited to the description in the following embodiments.

In the drawings, the size, the layer thickness, or the region is exaggerated for clarity in some cases. Therefore, embodiments of the present invention are not limited to such a scale.

Note that the drawings are schematic views showing ideal examples, and embodiments of the present invention are not limited to shapes or values shown in the drawings.

Ordinal numbers such as "first," "second," and "third" in this specification are used in order to avoid confusion among components, and the terms do not limit the components numerically.

In this specification, terms for describing arrangement, such as "over" and "under," are used for convenience for describing the positional relation between components with reference to drawings. The positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel region between the drain (a drain terminal, a drain region, or a drain electrode) and the source (a source terminal, a source region, or a source electrode) and current can flow between the source and the drain through the channel region. Note that in this specification and the like, a channel region refers to a region through which current mainly flows.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

In this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" include a switching element such as a transistor, a resistor, an inductor, a capacitor, and an element with a variety of functions, as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean there is $V_{gs}$ at which the off-state current of the transistor is lower than or equal to I. The off-state current of a transistor may refer to off-state current at a given $V_{gs}$, at $V_{gs}$ in a given range, or at $V_{gs}$ at which sufficiently low off-state current is obtained, for example.

As an example, the assumption is made of an n-channel transistor where the threshold voltage $V_{th}$ is 0.5 V and the drain current is $1 \times 10^{-9}$ A at $V_{gs}$ of 0.5 V, $1 \times 10^{-13}$ A at $V_{gs}$ of 0.1 V, $1 \times 10^{-19}$ A at $V_{gs}$ of −0.5 V, and $1 \times 10^{-22}$ A at $V_{gs}$ of −0.8 V. The drain current of the transistor is $1 \times 10^{-19}$ A or lower at $V_{gs}$ of −0.5 V or at $V_{gs}$ in the range of −0.8 V to −0.5 V; therefore, it can be said that the off-state current of the transistor is $1 \times 10^{-19}$ A or lower. Since there is $V_{gs}$ at which the drain current of the transistor is $1 \times 10^{-22}$ A or lower, it may be said that the off-state current of the transistor is $1 \times 10^{-22}$ A or lower.

In this specification and the like, the off-state current of a transistor with a channel width W is sometimes represented by a current value per channel width W or by a current value per given channel width (e.g., 1 μm). In the latter case, the off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). The state in which the off-state current of a transistor is I or lower may indicate that the off-state current of the transistor at room temperature, 60° C., 85° C., 95° C., 125° C., a temperature at which the reliability of a semiconductor device or the like including the transistor is ensured, or a temperature at which the semiconductor device or the like is used (e.g., a temperature in the range of 5° C. to 35° C.) is I or lower at a certain $V_{gs}$.

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which the reliability of a semiconductor device or the like including the transistor is ensured or $V_{ds}$ used in the semiconductor device or the like. The state in which the off-state current of a transistor is lower than or equal to I may indicate that the off-state current of the transistor at $V_{ds}$ of 0.1 V, 0.8 V, 1 V, 1.2 V, 1.8 V, 2.5 V, 3 V, 3.3 V, 10 V, 12 V, 16 V, or 20 V, at $V_{ds}$ at which the reliability of a semiconductor device or the like including the transistor is ensured, or at $V_{ds}$ used in the semiconductor device or the like is lower than or equal to I at a certain $V_{gs}$.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$-$\sqrt{I_d}$ characteristics). Alternatively, the threshold voltage of a transistor may refer to a gate voltage ($V_g$) at which the value of $I_d$ [A]×L [μm]/W [μm] is $1 \times 10^{-9}$ [A] where L is channel length and W is channel width.

In this specification and the like, a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. Alternatively, an "insulator" in this specification and the like can be called a "semi-insulator" in some cases.

In this specification and the like, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, an impurity in a semiconductor refers to an element that is not a main component of the semiconductor. For example, an element with a concentration lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of an impurity which changes the characteristics of the semiconductor include Group 1 elements, Group 2 elements, Group 14 elements, Group 15 elements, and transition metals other than the main components; specific examples are hydrogen (also included in water), lithium, sodium, silicon, boron, phosphorus, carbon, and nitrogen. In an oxide semiconductor, an oxygen vacancy may be formed by entry of an impurity such as hydrogen. Furthermore, in the case where the semiconductor includes silicon, examples of an impurity which changes the characteristics of the semiconductor include oxygen, Group 1 elements except hydrogen, Group 2 elements, Group 13 elements, and Group 15 elements.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" might be stated. CAAC refers to an example of a crystal structure, and CAC refers to an example of a function or a material composition.

An example of a crystal structure of an oxide semiconductor or a metal oxide is described. Note that an oxide semiconductor deposited by a sputtering method using an In—Ga—Zn oxide target (In:Ga:Zn=4:2:4.1 in an atomic ratio) is described below as an example. An oxide semiconductor formed by a sputtering method using the above-mentioned target at a substrate temperature of higher than or equal to 100° C. and lower than or equal to 130° C. is referred to as sIGZO, and an oxide semiconductor formed by a sputtering method using the above-mentioned target with the substrate temperature set at room temperature (R.T.) is referred to as tIGZO. For example, sIGZO has one or both crystal structures of nano crystal (nc) and CAAC. Furthermore, tIGZO has a crystal structure of nc. Note that room temperature (R.T.) herein also refers to a temperature of the time when a substrate is not heated intentionally.

In this specification and the like, CAC-OS or CAC-metal oxide has a function of a conductor in a part of the material and has a function of a dielectric (or insulator) in another part of the material; as a whole, CAC-OS or CAC-metal oxide has a function of a semiconductor. In the case where CAC-OS or CAC-metal oxide is used in an active layer of a transistor, the conductor has a function of letting electrons (or holes) serving as carriers flow, and the dielectric has a function of not letting electrons serving as carriers flow. By the complementary action of the function as a conductor and the function as a dielectric, CAC-OS or CAC-metal oxide can have a switching function (on/off function). In the CAC-OS or CAC-metal oxide, separation of the functions can maximize each function.

In this specification and the like, CAC-OS or CAC-metal oxide includes conductor regions and dielectric regions. The conductor regions have the above-described function of the conductor, and the dielectric regions have the above-described function of the dielectric. In some cases, the conductor regions and the dielectric regions in the material are separated at the nanoparticle level. In some cases, the conductor regions and the dielectric regions are unevenly distributed in the material. When observed, the conductor regions are coupled in a cloud-like manner with their boundaries blurred, in some cases.

In other words, CAC-OS or CAC-metal oxide can be called a matrix composite or a metal matrix composite.

Furthermore, in the CAC-OS or CAC-metal oxide, the conductor regions and the dielectric regions each have a size of more than or equal to 0.5 nm and less than or equal to 10 nm, preferably more than or equal to 0.5 nm and less than or equal to 3 nm and are dispersed in the material, in some cases.

Embodiment 1

In this embodiment, a semiconductor device of one embodiment of the present invention is described with reference to FIGS. 1A to 1C, FIGS. 2A and 2B, FIG. 3, FIGS. 4A to 4C, FIG. 5, FIGS. 6A to 6C, FIG. 7, FIG. 8, FIG. 9, FIGS. 10A and 10B, FIG. 11, FIG. 12, FIG. 13, FIGS. 14A and 14B, FIGS. 15A and 15B, FIGS. 16A and 16B, FIGS. 17A and 17B, FIGS. 18A and 18B, FIGS. 19A and 19B, FIGS. 20A and 20B, FIGS. 21A and 21B, and FIGS. 22A to 22C.

One embodiment of the present invention is a semiconductor device including a transistor. The transistor includes a first gate electrode, a first insulating film over the first gate electrode, an oxide semiconductor film over the first insulating film, a second insulating film over the oxide semiconductor film, a second gate electrode over the second insulating film, and a third insulating film over the oxide semiconductor film and the second gate electrode. The oxide semiconductor film includes a channel region overlapping with the second gate electrode, a source region in contact with the third insulating film, and a drain region in contact with the third insulating film. The first gate electrode and the second gate electrode are electrically connected to each other.

In a saturation region of the above transistor, a difference between a minimum value and a maximum value of the field-effect mobility is less than or equal to 15 cm$^2$/Vs.

In other words, the semiconductor device of one embodiment of the present invention is a transistor in which an oxide semiconductor film is included in a channel region, and a variation in the field-effect mobility in a saturation region of the transistor is extremely small. When such a semiconductor device is used as a transistor for a pixel of an organic EL display, for example, high reliability can be obtained.

<1-1. Characteristics of Transistor>

First, general characteristics of a transistor are described with reference to FIGS. 2A and 2B and FIG. 3.

[$I_d$-$V_g$ Characteristics of Transistor]

First, drain current-gate voltage characteristics ($I_d$-$V_g$ characteristics) of a transistor are described. FIG. 2A illustrates an example of $I_d$-$V_g$ characteristics of the transistor. FIG. 2A shows the case where polycrystalline silicon is used for an active layer of the transistor for easy understanding. In FIG. 2A, the vertical axis and the horizontal axis represent $I_d$ and $V_g$, respectively.

Figure 2A:
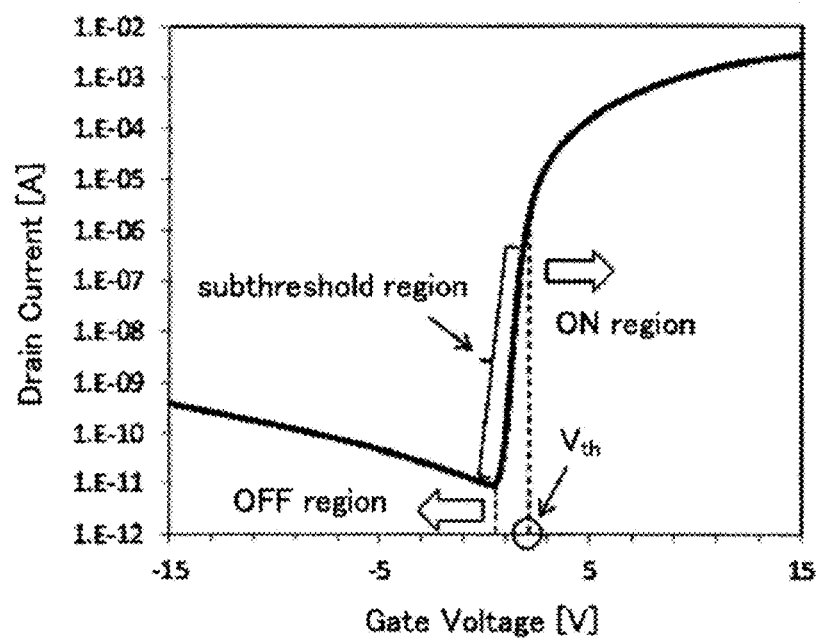
FIGS. 2A and 2B show $I_d$-$V_g$ characteristics and $I_d$-$V_d$ characteristics of a transistor.

As illustrated in FIG. 2A, $I_d$-$V_g$ characteristics are broadly divided into three regions. A first region, a second region, and a third region are referred to as an off region (OFF region), a subthreshold region, and an on region (ON region), respectively. A gate voltage at a boundary between the subthreshold region and the on region is referred to as a threshold voltage ($V_{th}$).

To obtain favorable characteristics of the transistor, it is preferable that the drain current in the off region (also referred to as off-state current or $I_{off}$) be low and the drain current in the on region (also referred to as on-state current or $I_{on}$) be high. As an index of the on-state current of the transistor, the field-effect mobility is often used. The details of the field-effect mobility are described later.

To drive the transistor at a low voltage, the slope of the $I_d$-$V_g$ characteristics in the subthreshold region is preferably steep. An index of the degree of change in the $I_d$-$V_g$ characteristics in the subthreshold region is referred to as subthreshold swing (SS) or an S value. The S value is represented by the following formula (1).

[Formula 1]

$$SS = \min\left(\frac{\partial V_g}{\partial \log_{10}(I_d)}\right) \qquad (1)$$

The S value is a minimum value of the amount of change in gate voltage which is needed for changing a drain current by an order of magnitude in the subthreshold region. As the S value is smaller, switching operation between on and off states can be performed rapidly.

[$I_d$-$V_d$ Characteristics of Transistor]

Next, drain current-drain voltage characteristics ($I_d$-$V_d$ characteristics) of a transistor are described. FIG. 2B illustrates an example of $I_d$-$V_d$ characteristics of the transistor. In FIG. 2B, the vertical axis and the horizontal axis represent $I_d$ and $V_d$, respectively.

Figure 2B:
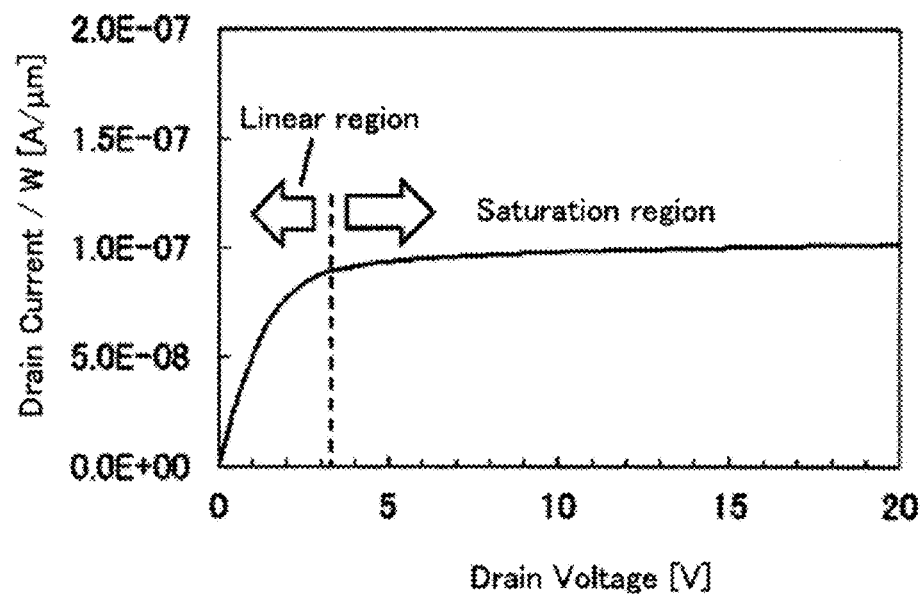

As illustrated in FIG. 2B, the on region is further divided into two regions. A first region and a second region are referred to as a linear region and a saturation region, respectively. In the linear region, drain current increases in a parabola shape in accordance with the increase in drain voltage. On the other hand, in the saturation region, drain current does not greatly change even when drain voltage changes. According to a vacuum tube, the linear region and the saturation region are referred to as a triode region and a pentode region in some cases.

The linear region indicates the state where $V_g$ is higher than $V_d$ ($V_d < V_g$) in some cases. The saturation region indicates the state where $V_d$ is higher than $V_g$ ($V_g < V_d$) in some cases. However, in practice, the threshold voltage of the transistor needs to be considered. Thus, the state where a value obtained by subtracting the threshold voltage of the transistor from the gate voltage is higher than the drain voltage ($V_d < V_g - V_{th}$) is referred to as the linear region in some cases. Similarly, the state where a value obtained by subtracting the threshold voltage of the transistor from the gate voltage is lower than the drain voltage ($V_g - V_{th} < V_d$) is referred to as the saturation region in some cases.

The $I_d$-$V_d$ characteristics of the transistor with which current in the saturation region is constant are expressed as "favorable saturation" in some cases. The favorable saturation of the transistor is important particularly when the transistor is used in an organic EL display. For example, a transistor with favorable saturation is used as a transistor of a pixel of an organic EL display, whereby a change in luminance of the pixel can be suppressed even when the drain voltage is changed.

[Analysis Model of Drain Current]

Next, an analysis model of the drain current is described. As the analysis model of the drain current, analytic formulae of drain current based on gradual channel approximation (GCA) is known. On the basis of GCA, the drain current of the transistor is represented by the following formula (2).

[Formula 2]

$$I_d = \begin{cases} \mu \dfrac{W}{L} C_{OX} \left[(V_g - V_{th})V_d - \dfrac{1}{2}V_d^2\right] & \dots (V_g - V_{th} > V_d) \\ \mu \dfrac{W}{2L} C_{OX}(V_g - V_{th})^2 & \dots (V_g - V_{th} \leq V_d) \end{cases} \quad (2)$$

In the formula (2), the upper formula is a formula for drain current in a linear region and the lower formula is a formula for drain current in a saturation region.

[Field-Effect Mobility]

Next, field-effect mobility is described. As an index of current drive capability of a transistor, the field-effect mobility is used. As described above, the on region of the transistor is divided into the linear region and the saturation region. From the characteristics in the regions, the field-effect mobility of the transistor can be calculated on the basis of the analytic formulae of the drain current based on GCA. The field-effect mobility in the linear region and the field-effect mobility in the saturation region are referred to as linear mobility and saturation mobility, respectively, when they need to be distinguished from each other. The linear mobility is represented by the following formula (3) and the saturation mobility is represented by the following formula (4).

[Formula 3]

$$\mu_{FE}^{lin} = \dfrac{L}{W C_{OX}} \dfrac{\partial I_d}{\partial V_g} \dfrac{1}{V_d} \quad (3)$$

[Formula 4]

$$\mu_{FE}^{sat} = \dfrac{2L}{W C_{OX}} \left(\dfrac{\partial \sqrt{I_d}}{\partial V_g}\right)^2 \quad (4)$$

In this specification and the like, curves calculated from the formula (3) and the formula (4) are referred to as mobility curves. FIG. 3 shows mobility curves calculated from the analytic formulae of drain current based on GCA. In FIG. 3, the $I_d$-$V_g$ characteristics of the transistor and the mobility curves of the linear mobility and the saturation mobility overlap with each other.

Figure 3:
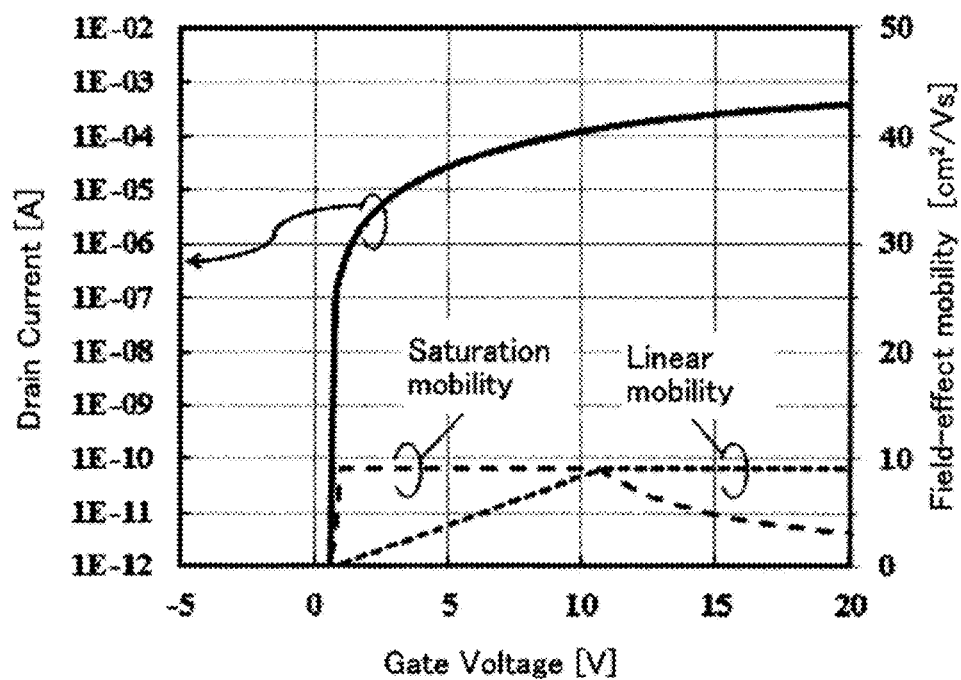
FIG. 3 shows $I_d$-$V_g$ characteristics and linear and saturation mobility curves which are calculated on the basis of GCA.

In FIG. 3, the $I_d$-$V_g$ characteristics are calculated from the analytic formulae of drain current based on GCA. The shapes of the mobility curves can be a lead to understanding the state of the inside of the transistor.

For example, the shape of the curve of the saturation mobility in FIG. 3 is focused on. When the gate voltage increases, carriers (electrons or holes) of the transistor are accelerated by an electric field to gain energy. Thus, the carriers gain certain energy by an electric field, and the saturation mobility is increased. However, the carriers are not accelerated limitlessly, and collide with thermally vibrating interstitial atoms, ionized impurity atoms, or the like to lose energy; as a result, the saturation mobility is gradually decreased.

<1-2. Fabrication of Transistor for Evaluating Characteristics>

Next, the structure of the transistor of one embodiment of the present invention is described, and evaluation results of electrical characteristics of the transistor which was fabricated are shown.

[Structure Example 1 of Transistor]

Figure 4A:
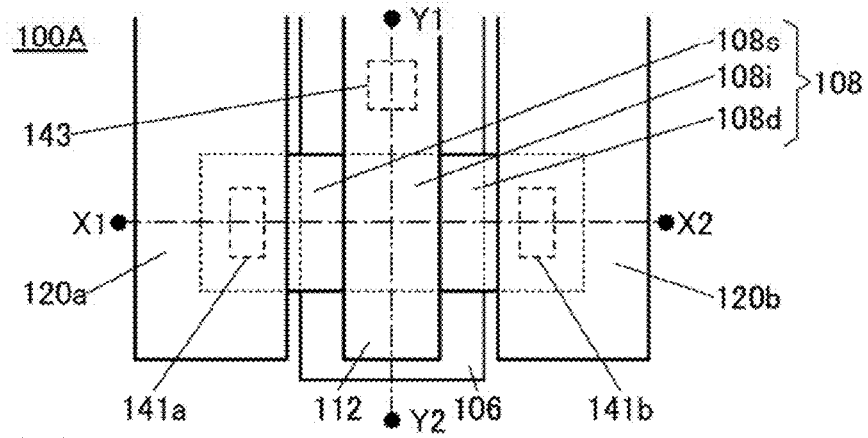
FIGS. 4A to 4C are a top view and cross-sectional views of a transistor.
Figure 4B:
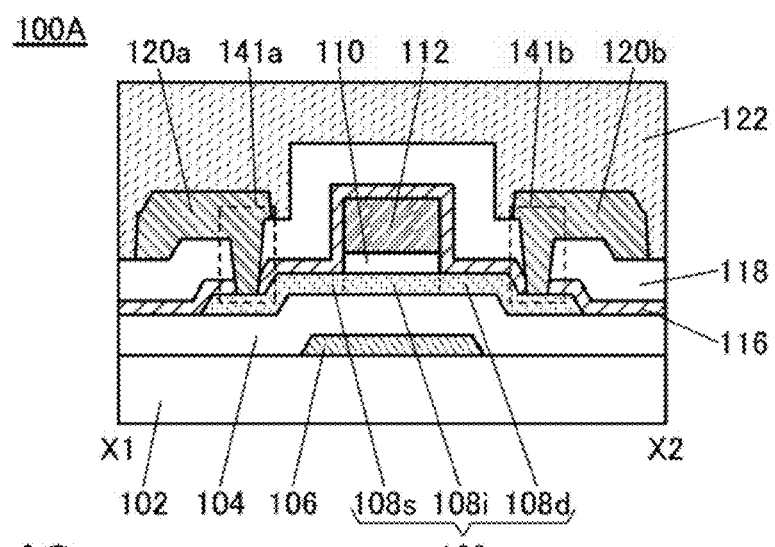
Figure 4C:
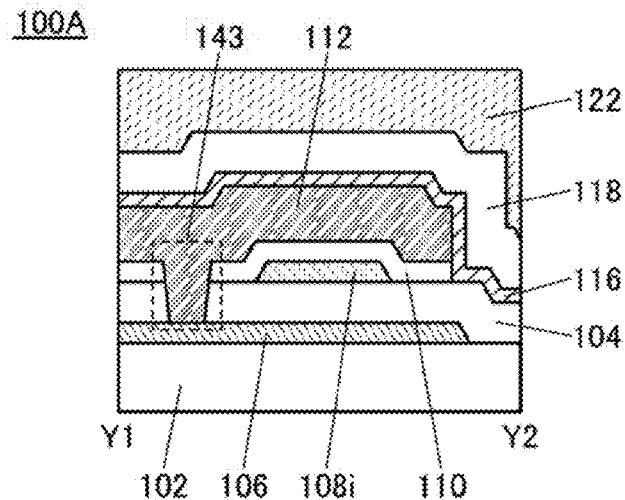

FIG. 4A is a top view of a transistor 100A. FIG. 4B is a cross-sectional view taken along the dashed-dotted line X1-X2 in FIG. 4A. FIG. 4C is a cross-sectional view taken along the dashed-dotted line Y1-Y2 in FIG. 4A. For clarity, some components such as an insulating film 110 are not illustrated in FIG. 4A. As in FIG. 4A, some components are not illustrated in some cases in top views of transistors described below. In addition, the direction of the dashed-dotted line X1-X2 may be referred to as the channel length (L) direction, and the direction of the dashed-dotted line Y1-Y2 may be referred to as the channel width (W) direction.

The transistor 100A illustrated in FIGS. 4A to 4C includes a conductive film 106 over a substrate 102, an insulating film 104 over the conductive film 106, an oxide semiconductor film 108 over the insulating film 104, the insulating film 110 over the oxide semiconductor film 108, a conductive film 112 over the insulating film 110, and an insulating film 116 over the insulating film 104, the oxide semiconductor film 108, and the conductive film 112. The oxide semiconductor film 108 includes a channel region 108i overlapping with the conductive film 112, a source region 108s in contact with the insulating film 116, and a drain region 108d in contact with the insulating film 116.

The insulating film 116 contains nitrogen or hydrogen. The insulating film 116 is in contact with the source region 108s and the drain region 108d, so that nitrogen or hydrogen that is contained in the insulating film 116 is added to the source region 108s and the drain region 108d. The source region 108s and the drain region 108d each have a high carrier density when nitrogen or hydrogen is added thereto.

The transistor 100A may further include an insulating film 118 over the insulating film 116, a conductive film 120a electrically connected to the source region 108s through an opening 141a provided in the insulating films 116 and 118, and a conductive film 120b electrically connected to the drain region 108d through an opening 141b provided in the insulating films 116 and 118. In addition, an insulating film 122 may be provided over the insulating film 118, the conductive film 120a, and the conductive film 120b. Although the structure where the insulating film 122 is provided is shown in FIGS. 4B and 4C, one embodiment of the present invention is not limited thereto, and the insulating film 122 is not necessarily provided.

In this specification and the like, the insulating film 104 may be referred to as a first insulating film, the insulating film 110 may be referred to as a second insulating film, the insulating film 116 may be referred to as a third insulating film, the insulating film 118 may be referred to as a fourth insulating film, and the insulating film 122 may be referred to as a fifth insulating film. The insulating film 104 functions as a first gate insulating film and the insulating film 110 functions as a second gate insulating film. The insulating films 116 and 118 function as a protective insulating film and the insulating film 122 functions as a planarization film.

The insulating film 110 includes an excess oxygen region. Since the insulating film 110 includes the excess oxygen region, excess oxygen can be supplied to the channel region 108i included in the oxide semiconductor film 108. As a result, oxygen vacancies that might be formed in the channel region 108i can be filled with excess oxygen, which can provide a highly reliable semiconductor device.

To supply excess oxygen to the oxide semiconductor film 108, excess oxygen may be supplied to the insulating film 104 that is formed under the oxide semiconductor film 108. In that case, excess oxygen contained in the insulating film 104 might also be supplied to the source region 108s and the drain region 108d included in the oxide semiconductor film 108. When excess oxygen is supplied to the source region 108s and the drain region 108d, the resistance of the source region 108s and the drain region 108d might be increased.

In contrast, in the structure in which the insulating film 110 formed over the oxide semiconductor film 108 contains excess oxygen, excess oxygen can be selectively supplied only to the channel region 108i. Alternatively, the carrier density of the source and drain regions 108s and 108d can be selectively increased after excess oxygen is supplied to the channel region 108i and the source and drain regions 108s and 108d, in which case an increase in the resistance of the source and drain regions 108s and 108d can be prevented.

Furthermore, each of the source region 108s and the drain region 108d included in the oxide semiconductor film 108 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element include helium, neon, argon, krypton, and xenon. The element that forms an oxygen vacancy is diffused from the insulating film 116 to the source region 108s and the drain region 108d in the case where the insulating film 116 contains one or more such elements. In addition or alternatively, the element that forms an oxygen vacancy is added to the source region 108s and the drain region 108d by impurity addition treatment.

An impurity element added to the oxide semiconductor film cuts a bond between a metal element and oxygen in the oxide semiconductor film, so that an oxygen vacancy is formed. Alternatively, when an impurity element is added to the oxide semiconductor film, oxygen bonded to a metal element in the oxide semiconductor film is bonded to the impurity element and detached from the metal element, so that an oxygen vacancy is formed. As a result, the oxide semiconductor film has a higher carrier density, and thus, the conductivity thereof becomes higher.

The conductive film 106 functions as a first gate electrode and the conductive film 112 functions as a second gate electrode. The conductive film 120a functions as a source electrode and the conductive film 120b functions as a drain electrode.

As illustrated in FIG. 4C, an opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-shielding film without providing the opening 143. For example, when the conductive film 106 is formed using a light-shielding material, light irradiation of the channel region 108i from the bottom can be reduced.

As illustrated in FIGS. 4B and 4C, the oxide semiconductor film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is larger than the length of the oxide semiconductor film 108 in the channel width direction. In the channel width direction, the whole oxide semiconductor film 108 is covered with the conductive film 112 with the insulating film 110 placed therebetween. Since the conductive film 112 is connected to the conductive film 106 through the opening 143 provided in the insulating films 104 and 110, a side surface of the oxide semiconductor film 108 in the channel width direction faces the conductive film 112 with the insulating film 110 placed therebetween.

In other words, in the channel width direction of the transistor 100A, the conductive films 106 and 112 are connected to each other through the opening 143 provided in the insulating films 104 and 110, and the conductive films 106 and 112 surround the oxide semiconductor film 108 with the insulating films 104 and 110 positioned therebetween.

Such a structure enables the oxide semiconductor film 108 included in the transistor 100A to be electrically surrounded by electric fields of the conductive film 106 functioning as a first gate electrode and the conductive film 112 functioning as a second gate electrode. A device structure of a transistor, like that of the transistor 100A, in which electric fields of a first gate electrode and a second gate electrode electrically surround the oxide semiconductor film 108 in which a channel region is formed can be referred to as a surrounded channel (S-channel) structure.

Since the transistor 100A has the S-channel structure, an electric field for inducing a channel can be effectively applied to the oxide semiconductor film 108 by the conductive film 106 or the conductive film 112; thus, the current drive capability of the transistor 100A can be improved and high on-state current characteristics can be obtained. As a result of the high on-state current, it is possible to reduce the size of the transistor 100A. Furthermore, since the transistor 100A has a structure in which the oxide semiconductor film 108 is surrounded by the conductive film 106 and the conductive film 112, the mechanical strength of the transistor 100A can be increased.

When seen in the channel width direction of the transistor 100A, an opening different from the opening 143 may be formed on the side of the oxide semiconductor film 108 on which the opening 143 is not formed.

[Fabrication of Transistors]

Next, transistors which correspond to the above-described transistor 100A were formed and the electrical characteristics of the transistors were evaluated. In this embodiment, Samples A1 to A3 described below were fabricated.

Samples A1 to A3 are each a sample in which a transistor with a channel length L of 2 µm and a channel width W of 3 µm is formed. Samples A1 and A2 are each a sample in which a transistor for comparison is formed and Sample A3 is a sample in which the transistor of one embodiment of the present invention is formed. Samples A1 to A3 were fabricated in the following manner: the deposition conditions of the oxide semiconductor films are different from each other and the other steps are the same.

[Fabrication Methods of Samples A1 to A3]

First, a 10-nm-thick titanium film and a 100-nm-thick copper film were formed over a glass substrate with a sputtering apparatus. Next, the conductive film was processed by a photolithography method.

A stack including four insulating films was formed over the substrate and the conductive film. The insulating films were formed in succession in a vacuum with a plasma-enhanced chemical deposition (PECVD) apparatus. As the insulating films, a 50-nm-thick silicon nitride film, a 300-nm-thick silicon nitride film, a 50-nm-thick silicon nitride film, and a 50-nm-thick silicon oxynitride film were used and stacked in this order.

Next, an oxide semiconductor film was formed over the insulating film and was processed into an island shape, whereby a semiconductor layer was formed. A 40-nm-thick oxide semiconductor film was formed as the oxide semiconductor film 108. Samples A1 to A3 are different from each other in the deposition condition of the oxide semiconductor film.

The oxide semiconductor film used for Sample A1 was formed under the following conditions: the substrate temperature was 170° C.; an argon gas with a flow rate of 140 sccm and an oxygen gas with a flow rate of 60 sccm were introduced into a chamber of the sputtering apparatus; the pressure was set to 0.6 Pa; and an AC power of 2.5 kW was applied to a metal oxide target containing indium, gallium, and zinc (with an atomic ration of In:Ga:Zn=4:2:4.1). The proportion of oxygen in the whole deposition gas is referred to as an oxygen flow rate percentage in some cases. The oxygen flow rate percentage in deposition of the oxide semiconductor film of Sample A1 was 30%.

The oxide semiconductor film used for Sample A2 was formed under the following conditions: the substrate temperature was 130° C.; an argon gas with a flow rate of 180 sccm and an oxygen gas with a flow rate of 20 sccm were introduced into a chamber of the sputtering apparatus; the pressure was set to 0.6 Pa; and an AC power of 2.5 kW was applied to a metal oxide target containing indium, gallium, and zinc (with an atomic ration of In:Ga:Zn=4:2:4.1). The oxygen flow rate percentage in deposition of the oxide semiconductor film of Sample A2 was 10%.

The oxide semiconductor film used for Sample A3 was formed under the following conditions: the substrate temperature was room temperature (R.T.); an argon gas with a flow rate of 180 sccm and an oxygen gas with a flow rate of 20 sccm were introduced into a chamber of the sputtering apparatus; the pressure was set to 0.6 Pa; and an AC power of 2.5 kW was applied to a metal oxide target containing indium, gallium, and zinc (with an atomic ration of In:Ga:Zn=4:2:4.1). The oxygen flow rate percentage in deposition of the oxide semiconductor film of Sample A3 was 10%.

Next, an insulating film was formed over the insulating film and the oxide semiconductor layer. As the insulating film, a 150-nm-thick silicon oxynitride film was formed with a PECVD apparatus.

Next, heat treatment was performed. The heat treatment was performed at 350° C. for one hour in a mixed gas atmosphere of nitrogen and oxygen.

An opening was formed in a desired region of the insulating film. The opening was formed by a dry etching method.

Then, a 100-nm-thick oxide semiconductor film was formed over the insulating film and in the opening and the oxide semiconductor film was processed into an island shape, whereby a conductive film was formed. In addition, the insulating film in contact with the bottom surface of the conductive film was processed in succession after the formation of the conductive film, whereby the insulating film was formed.

As the conductive film, a 10-nm-thick oxide semiconductor film, a 50-nm-thick titanium nitride film, and a 100-nm-thick copper film were formed in this order. The oxide semiconductor film was formed under the following conditions: the substrate temperature was 170° C.; an oxygen gas with a flow rate of 200 sccm was introduced into a chamber of the sputtering apparatus; the pressure was set to 0.6 Pa; and an AC power of 2.5 kW was applied to a metal oxide target containing indium, gallium, and zinc (with an atomic ratio of In:Ga:Zn=4:2:4.1). The titanium nitride film and the copper film were each formed using a sputtering apparatus.

Next, plasma treatment was performed from above the oxide semiconductor film, the insulating film, and the conductive film. The plasma treatment was performed with a PECVD apparatus at a substrate temperature 220° C. in a mixed gas atmosphere containing an argon gas and a nitrogen gas.

Next, an insulating film was formed over the oxide semiconductor film, the insulating film, and the conductive film. The insulating film was formed by stacking a 100-nm-thick silicon nitride film and a 300-nm-thick silicon oxynitride film with a PECVD apparatus.

Then, a mask was formed over the formed insulating film and an opening was formed in the insulating film with use of the mask.

A conductive film was formed to fill the opening and was processed into an island shape, whereby the conductive film serving as a source electrode and a drain electrode was formed. For the conductive films, a 10-nm-thick titanium film and a 100-nm-thick copper film were formed with a sputtering apparatus.

After that, an insulating film was formed over the insulating film and the conductive film. A 1.5-μm-thick acrylic-based photosensitive resin was used for the insulating film.

In the above manner, Samples A1 to A3 were fabricated.

[$I_d$-$V_g$ Characteristics of Transistors]

Next, $I_d$-$V_g$ characteristics of the fabricated transistors of Samples A1 to A3 were measured. As conditions for measuring the $I_d$-$V_g$ characteristics of each transistor, a voltage applied to the conductive film serving as a first gate electrode (hereinafter the voltage is also referred to as gate voltage ($V_g$)) and a voltage applied to the conductive film serving as the second gate electrode (hereinafter the voltage is also referred to as back gate voltage ($V_{bg}$)) were changed from −10 V to +10 V in increments of 0.25 V. A voltage applied to the conductive film serving as a source electrode (hereinafter the voltage is also referred to as source voltage ($V_s$)) was 0 V (comm) and voltages applied to the conductive film serving as a drain electrode (hereinafter the voltages are also referred to as drain voltage ($V_d$)) were 0.1 V and 20 V.

Figure 1B:
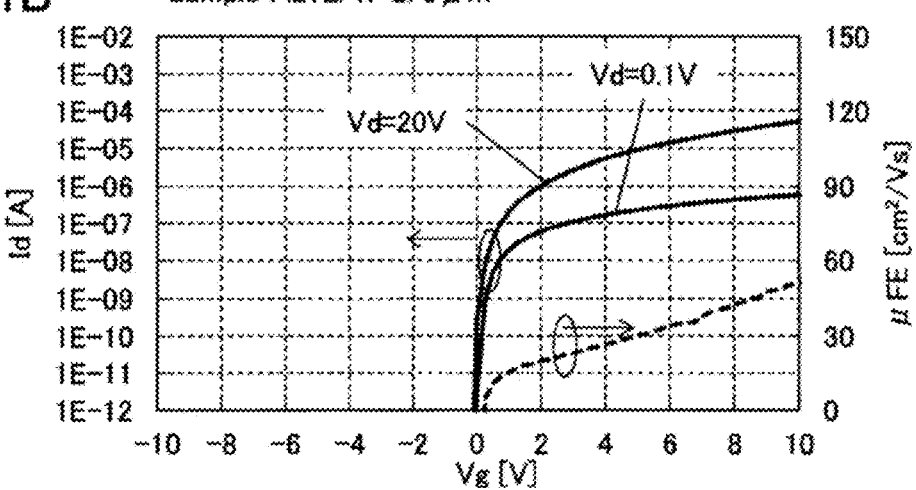
Figure 1C:
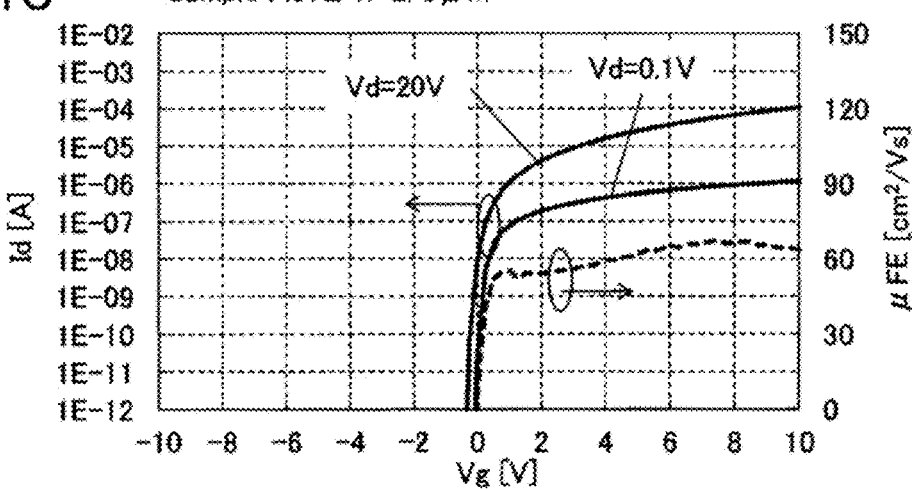

FIGS. 1A, 1B, and 1C show the results of $I_d$-$V_g$ characteristics of Samples A1, A2, and A3, respectively. In FIGS. 1A to 1C, the first vertical axis represents $I_d$ (A), the second vertical axis represents field-effect mobility (μFE) (cm²/Vs), and the horizontal axis represents $V_g$ (V). Note that the field-effect mobility was measured when $V_d$ was 20 V.

As shown in FIGS. 1A to 1C, when the deposition condition of the oxide semiconductor film is varied, $I_d$-$V_g$ characteristics of the transistors have different tendencies. In particular, there are differences between the shapes of the mobility curves of the field-effect mobilities of the transistors.

From the shapes of the mobility curves of Samples A1 to A3 shown in FIGS. 1A to 1C, the minimum values and the maximum values of the field-effect mobilities in the saturation regions of the transistors and the values each obtained by subtracting the minimum value from the maximum value are calculated. Here, the saturation region of the transistor is in a range where $V_g$ is greater than or equal to 3 V and less than or equal to 10 V. A gate voltage in this range is generally used for applications such as display.

In Sample A1, the minimum value of the field-effect mobility in the saturation region of the transistor is 9.8 cm²/Vs and the maximum value thereof is 28.3 cm²/Vs. That is, a difference between the minimum value and the maximum value of the field-effect mobility in the saturation region of the transistor of Sample A1 is 18.5 cm²/Vs. In Sample A2, the minimum value of the field-effect mobility in the saturation region of the transistor is 23.3 cm²/Vs and the maximum value thereof is 51.1 cm²/Vs. That is, a difference between the minimum value and the maximum value of the field-effect mobility in the saturation region of the transistor of Sample A2 is 27.8 cm²/Vs. In Sample A3, the minimum value of the field-effect mobility in the saturation region of the transistor is 55.8 cm²/Vs and the maximum value thereof is 67.0 cm²/Vs. That is, a difference between the minimum value and the maximum value of the field-effect mobility in the saturation region of the transistor of Sample A3 is 11.2 cm²/Vs.

In other words, in Sample A1, the minimum value of the field-effect mobility in the saturation region of the transistor is lower than the maximum value of the field-effect mobility by approximately 65.3%. In Sample A2, the minimum value of the field-effect mobility in the saturation region of the transistor is lower than the maximum value of the field-effect mobility by approximately 54.4%. In Sample A3, the minimum value of the field-effect mobility in the saturation region of the transistor is lower than the maximum value of the field-effect mobility by approximately 16.7%. As described above, Sample A3 in which the transistor of one embodiment of the present invention is formed has characteristics that the minimum value of the field-effect mobility in the saturation region of the transistor is lower than the maximum value of the field-effect mobility by 30% or lower, preferably 20% or lower.

In this manner, Sample A3 in which the transistor of one embodiment of the present invention is formed has characteristics that a difference between the minimum value and the maximum value of the field-effect mobility in the saturation region of the transistor is less than or equal to 15 cm²/Vs, which is extremely small. In addition, Sample A3 has high field-effect mobility in a low $V_g$ region (e.g., a region where $V_g$ is greater than 0 V and less than or equal to 5 V). When transistors having such characteristics are used as transistors for pixels of an organic EL display, for example, high current drive capability and high reliability can be obtained.

<1-3. Examination of Shape of Mobility Curve by Device Simulation>

There is a difference between the shapes of the mobility curves of the field-effect mobilities of the transistors shown in FIGS. 1A to 1C; thus, the shapes of mobility curves were examined by device simulation.

In the device simulation, as factors which determine the shape of the mobility curve, three factors were assumed: 1. Temperature dependence of mobility; 2. Donor density distribution in channel region; and 3. Density of shallow defect states in oxide semiconductor film.

[1. Temperature Dependence of Mobility]

In a transistor including an oxide semiconductor film, the field-effect mobility is increased rapidly due to self-heating. The temperature dependence of electron mobility ($μ_n$) of the oxide semiconductor film is represented by the following formula (5).

[Formula 5]

$$\mu_n = \mu_{n300}\left(\frac{T_L}{300}\right)^{1.5} \tag{5}$$

In the formula (5), $μ_{n300}$ represents electron mobility of the oxide semiconductor film at room temperature and $T_L$ represents lattice temperature. As shown in the formula (5), the field-effect mobility of the transistor including the oxide semiconductor film increases in proportion to approximately the temperature T to the power of 1.5.

[2. Donor Density Distribution in Channel Region]

The transistors of the fabricated Sample A1 to A3 have different donor density distributions in channel regions because the deposition conditions of the oxide semiconductor films are varied. In other words, the transistors of Samples A1 to A3 have different effective channel lengths.

Here, the effective channel lengths of the transistors of Samples A1 to A3 are described with reference to FIG. 5.

Figure 5:
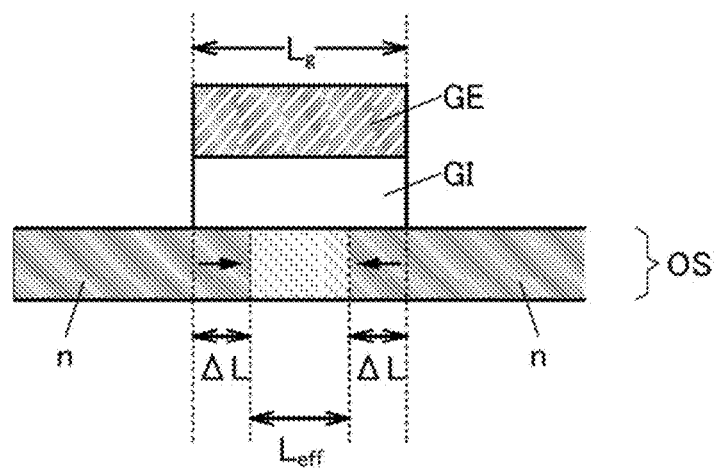
FIG. 5 is a schematic view illustrating a concept of an effective channel length of a transistor.

FIG. 5 is a schematic view illustrating a concept of an effective channel length of a transistor.

In FIG. 5, GE, GI, and OS refer to a gate electrode, a gate insulating film, and an oxide semiconductor film, respectively. In the oxide semiconductor film, an n-type region is formed. The effective channel length ($L_{eff}$) of the transistor is represented by the following formula (6).

[Formula 6]

$$L_{eff}=L_g-2\Delta L \tag{6}$$

In the formula (6), $L_g$ represents a gate length and $\Delta L$ represents a reduction width of a channel length.

The effective channel length of the transistor can be obtained by transmission line model (TLM) analysis, for example.

Figure 6A:
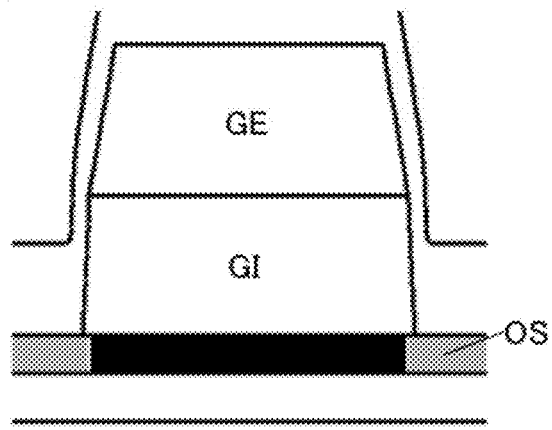
FIGS. 6A to 6C are schematic views each illustrating a donor density.
Figure 6B:
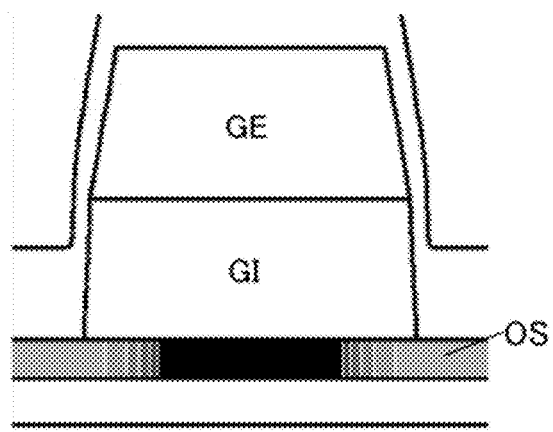
Figure 6C:
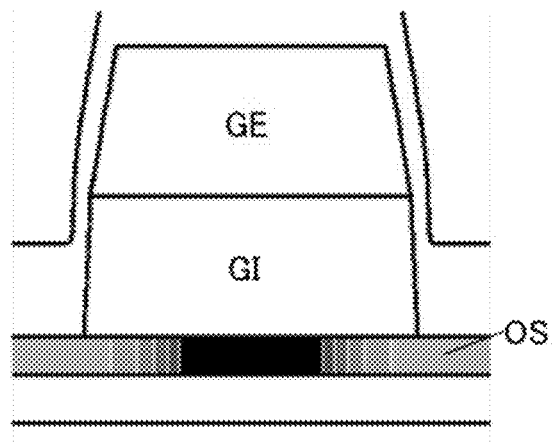

In the following description, a model in which a donor density is gradually decreased from an n-type region to a channel region is assumed on the basis of the above-described effective channel length. That is, donors are decreased toward the channel region in accordance with the Gaussian distribution. FIGS. 6A to 6C show schematic views illustrating donor densities of Samples A1 to A3. FIGS. 6A, 6B, and 6C illustrate a donor density of Sample A1, a donor density of Sample A2, and a donor density of Sample A3, respectively.

In FIGS. 6A to 6C, GE, GI, and OS refer to a gate electrode, a gate insulating film, and an oxide semiconductor film, respectively. In the oxide semiconductor films illustrated in FIGS. 6A to 6C, a region where a donor density is higher than or equal to $5 \times 10^{18}$ cm$^{-3}$ is shown in gray and a region where a donor density is lower than or equal to $1 \times 10^{16}$ cm$^{-3}$ is shown in black.

From the results shown in FIGS. 6A to 6C, the effective channel lengths in Samples A1, A2, and A3 are estimated to be 2.0 μm, 1.2 μm, and 0.8 μm, respectively. In other words, $\Delta L$ of Sample A1, $\Delta L$ of Sample A2, and $\Delta L$ of Sample A3 are estimated to be 0 μm, 0.4 μm, and 0.6 μm, respectively.

[3. Density of Shallow Defect States in Oxide Semiconductor Film]

Next, a density of shallow defect states (also referred to as sDOS) in an oxide semiconductor film is described. The sDOS of an oxide semiconductor film can be estimated from electrical characteristics of a transistor including the oxide semiconductor film. In the description below, the density of interface states of the transistor was measured. In addition, a method for estimating subthreshold leakage current in consideration of the density of interface states and the number of electrons trapped by the interface states, $N_{trap}$ is described.

The number of electrons trapped by the interface state, $N_{trap}$, can be measured by comparing drain current-gate voltage ($I_d$-$V_g$) of the transistor that was actually measured and drain current-gate voltage ($I_d$-$V_g$) characteristics that was calculated.

Figure 7:
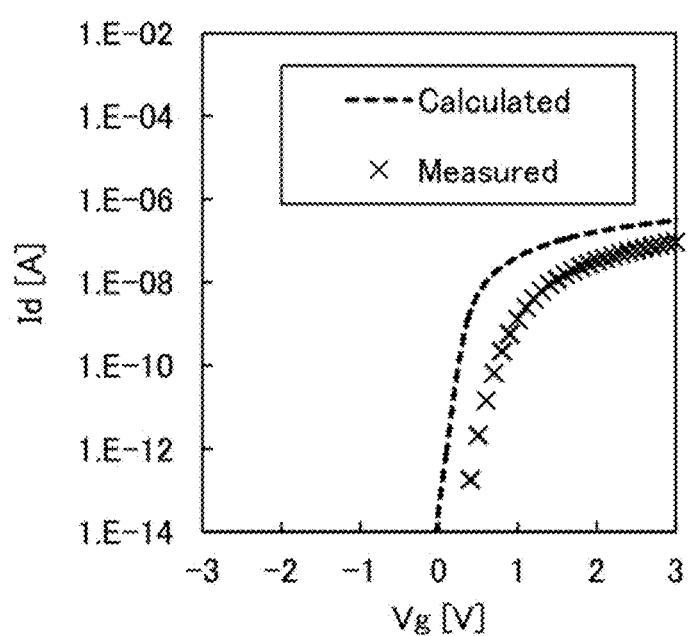
FIG. 7 shows $I_d$-$V_g$ characteristics.

FIG. 7 illustrates ideal $I_d$-$V_g$ characteristics obtained by calculation and the actually measured $I_d$-$V_g$ characteristics of the transistor when a source voltage $V_s$ is 0 V and a drain voltage $V_d$ is 0.1 V. Note that only values more than or equal to $1 \times 10^{-13}$ A at which drain voltage $I_d$ can be easily measured were plotted among the measurement results of the transistor.

A change of the drain current $I_d$ with respect to the gate voltage $V_g$ is more gradual in the actually measured $I_d$-$V_g$ characteristics than in the ideal $I_d$-$V_g$ characteristics obtained by calculation. This is probably because an electron is trapped by a shallow interface state positioned near energy at the bottom of the conduction band (represented as Ec). In this measurement, the density of interface surface $N_{it}$ can be estimated more accurately in consideration of the number of electrons (per unit area and unit energy) trapped by a shallow interface state, $N_{trap}$, with use of the Fermi distribution function.

Figure 8:
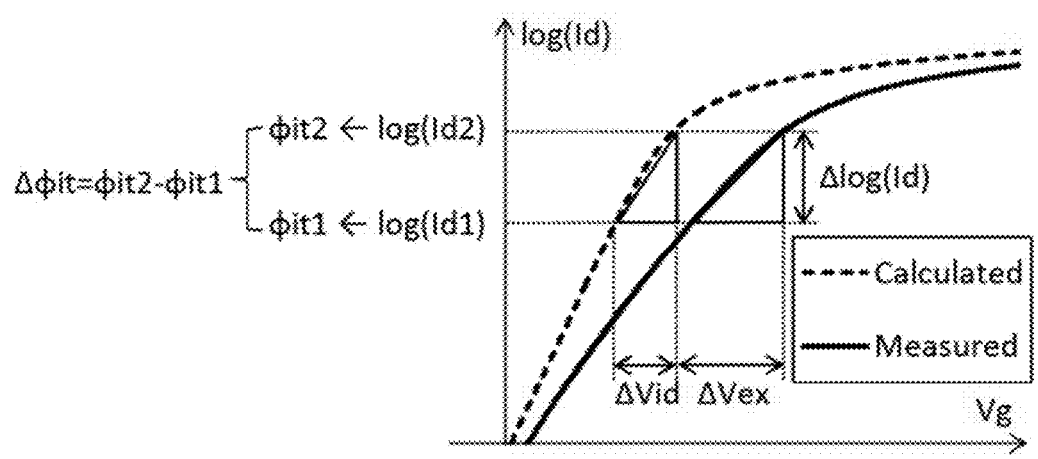
FIG. 8 shows $I_d$-$V_g$ characteristics.

First, a method for evaluating the number of electrons trapped by an interface trap state, $N_{trap}$, by using schematic $I_d$-$V_g$ characteristics illustrated in FIG. 8 is described. The dashed line indicates ideal $I_d$-$V_g$ characteristics without trap state and is obtained by the calculation. On the dashed line, a change in gate voltage $V_g$ when the drain current changes from $I_d1$ to $I_d2$ is represented by $\Delta V_{id}$. The solid line indicates the actually measured $I_d$-$V_g$ characteristics. On the solid line, a change in gate voltage $V_g$ when the drain current changes from $I_d1$ to $I_d2$ is represented by $\Delta V_{ex}$. The potential at the target interface when the drain current is $I_d1$, the potential at the target interface when the drain current is $I_d2$, and the amount of change are represented by $\phi_{it1}$, $\phi_{it2}$, and $\Delta\phi_{it}$, respectively.

The slope of the actually measured values is smaller than that of the calculated values in FIG. 8, which indicates that $\Delta V_{ex}$ is always larger than $\Delta V_{id}$. Here, a difference between $\Delta V_{ex}$ and $\Delta V_{id}$ corresponds to a potential difference that is needed for trapping of an electron in a shallow interface state. Therefore, $\Delta Q_{trap}$ which the amount of change in charge due to trapped electrons can be expressed by the following formula (7).

[Formula 7]

$$\Delta Q_{trap}=-C_{tg}(\Delta V_{ex}-\Delta V_{id}) \tag{7}$$

$C_{tg}$ is combined capacitance of an insulator and a semiconductor per unit area. In addition, $\Delta Q_{trap}$ can be expressed by the formula (8) by using the number of trapped electrons $N_{trap}$ (per unit area and per unit energy). Note that q represents elementary charge.

[Formula 8]

$$\Delta Q_{trap}=-qN_{trap}\Delta\phi_{it} \tag{8}$$

Simultaneously solving the formulae (7) and (8) gives the formula (9).

[Formula 9]

$$-C_{tg}(\Delta V_{ex}-\Delta V_{id})=-qN_{trap}\Delta\phi_{it} \tag{9}$$

Then, taking the limit zero of $\Delta\phi_{it}$ in the formula (9) gives the formula (10).

[Formula 10]

$$N_{trap}=\frac{C_{tg}}{q}\lim_{\Delta\phi_{it}\to 0}\left(\frac{\Delta V_{ex}}{\Delta\phi_{it}}-\frac{\Delta V_{id}}{\Delta\phi_{it}}\right)=C_{tg}\left(\frac{\partial V_{ex}}{\partial \phi_{it}}-\frac{\partial V_{id}}{\partial \phi_{it}}\right) \tag{10}$$

In other words, the number of electrons trapped by an interface surface, $N_{trap}$, can be estimated by using the ideal $I_d$-$V_g$ characteristics, the actually measured $I_d$-$V_g$ characteristics, and the formula (10). Note that the relationship between the drain current and the potential at the interface surface can be obtained by calculation with the device simulator described above.

The relationship between the number of electrons $N_{trap}$ per unit area and per unit energy and the density of interface surface $N_{it}$ is expressed by the formula (11).

[Formula 11]

$$N_{trap} = \frac{\partial}{\partial \phi_{it}} \int_{-\infty}^{\infty} N_{it}(E) f(E) dE \quad (11)$$

Here, f(E) is Fermi distribution function. The $N_{trap}$ obtained from the formula (10) is fitted with the formula (11) to determine $N_{it}$. The conduction characteristics including $I_d$<0.1 pA can be obtained by the device simulator to which the $N_{it}$ is set.

Figure 9:
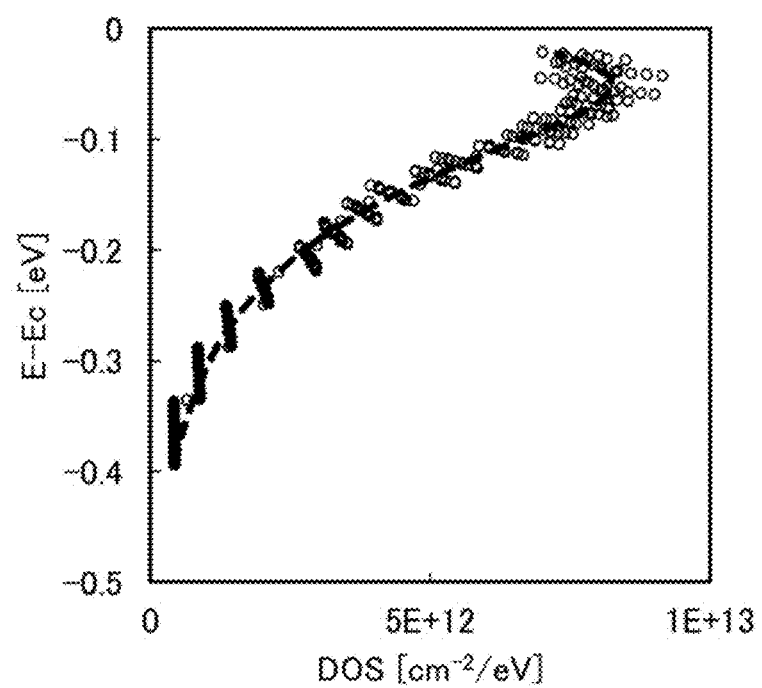
FIG. 9 shows calculation results of a density of interface states.

The actually measured $I_d$-$V_g$ characteristics in FIG. 7 is applied to the formula (10) and the results of extracting $N_{trap}$ are plotted as white circles in FIG. 9. The vertical axis in FIG. 9 represents Fermi energy Ef at the bottom of the conduction band Ec of a semiconductor. The maximum value is positioned on the dashed line just under Ec. When tail distribution of the formula (12) is assumed as $N_{it}$ of the formula (11), $N_{trap}$ can be fitted well like the dashed line in FIG. 9. As a result, the peak value $N_{ta}$=1.67×10$^{13}$ cm$^{-2}$ eV$^{-1}$ and the characteristic width $W_{ta}$=0.105 eV are obtained as the fitting parameters.

[Formula 12]

$$N_{it}(E) = N_{ta} \exp\left[\frac{E - E_c}{W_{ta}}\right] \quad (12)$$

Figure 10A:
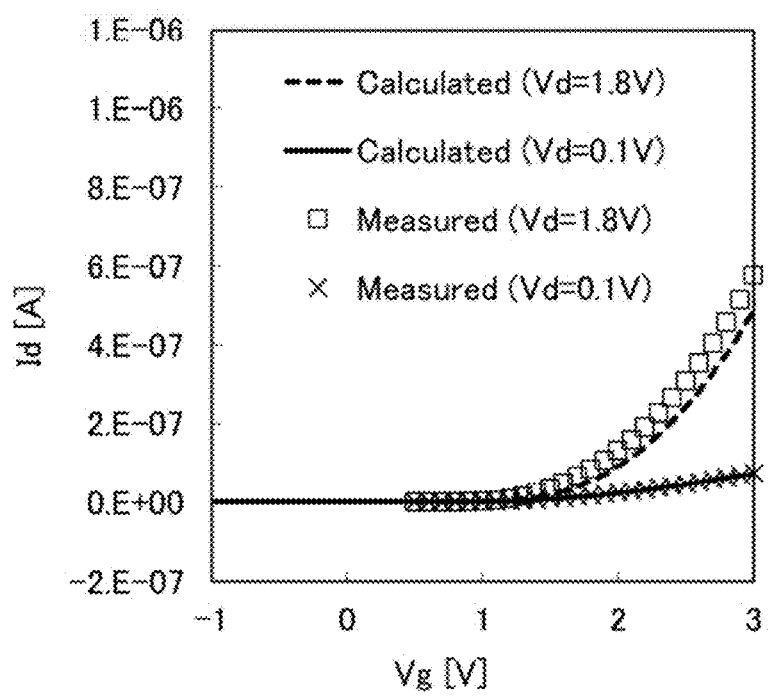
FIGS. 10A and 10B show $I_d$-$V_g$ characteristics.
Figure 10B:
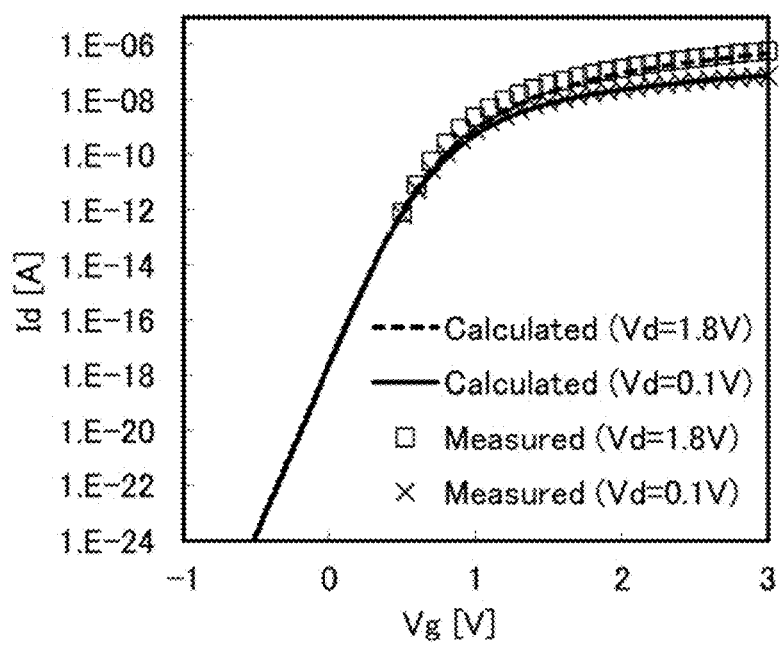

FIGS. 10A and 10B show the inverse calculation results of $I_d$-$V_g$ characteristics by feeding back the obtained fitting curve of interface state to the calculation using the device simulator. FIG. 10A shows the calculated $I_d$-$V_g$ characteristics when the drain voltage $V_d$ is 0.1 V and 1.8V and the actually measured $I_d$-$V_g$ characteristics when the drain voltage $V_d$ is 0.1 V and 1.8V. FIG. 10B is a graph in which the drain current $I_d$ is a logarithm in FIG. 10A.

The curve obtained by the calculation substantially matches with the plot of the actually measured values, which suggests that the calculated values and the measured values are highly reproducible. Accordingly, the above method is quite appropriate as a method for calculating the density of shallow defect states.

[Calculation Results of Mobility Curve]

The sDOS in the oxide semiconductor film influences the mobility curve of the field-effect mobility. In particular, in the vicinity of the threshold voltage, the shape of the mobility curve is changed because electrons are trapped by the sDOS. The sDOS in the oxide semiconductor film is represented by the product of $N_{ta}$ and $W_{ta}$ in the formula (12) and the thickness of the oxide semiconductor film ($t_{OS}$). Then, the mobility curve was calculated on the basis of the formula (12). Table 1 shows parameters used for the calculation.

TABLE 1

| | | | |
|---|---|---|---|
| Structure | L length | 2 | μm |
| | W width | 3 | μm |
| S/D electrode | Material | Cu | — |
| | Work function | 4.6 | eV |
| | Thickness | 110 | μm |
| Directly under S/D and entire Loff region | n+ | 5.00E+18 | cm$^{-3}$ |

TABLE 1-continued

| | | | |
|---|---|---|---|
| Passivation film | Material | SiON | — |
| | Relative permittivity ε | 3.9 | — |
| | Thickness | 400 | nm |
| | Material | SiN | — |
| | Relative permittivity ε | 7.5 | — |
| | Thickness | 50 | nm |
| Upper gate electrode | Material | W | — |
| | Work function | 5.0 | — |
| | Thickness | 110 | nm |
| Upper GI | Material | SiON | — |
| | Relative permittivity ε | 3.9 | — |
| | Thickness | 150 | nm |
| OS | Composition formula | IGZO (4:2:4.1) | — |
| | Electron affinity | 4.4 | eV |
| | Eg | 3.0 | eV |
| | Relative permittivity ε | 15 | — |
| | Donor density | 6.60E−09 | cm$^{-3}$ |
| | Electron mobility | 15 | cm$^2$/Vs |
| | Hole mobility | 0.01 | cm$^2$/Vs |
| | Nc | 5.00E+18 | cm$^{-3}$ |
| | Nv | 5.00E+18 | cm$^{-3}$ |
| | Thermal conductivity | 0.014 | W/cmK |
| | Thickness | 40 | nm |
| Lower GI | Material | SiON | — |
| | Relative permittivity ε | 3.9 | — |
| | Thickness | 50 | nm |
| | Material | SiN | — |
| | Relative permittivity ε | 7.5 | — |
| | Thickness | 400 | nm |
| Lower gate electrode | Material | W | — |
| | Work function | 5.0 | — |
| | Thickness | 110 | nm |

Figure 11:
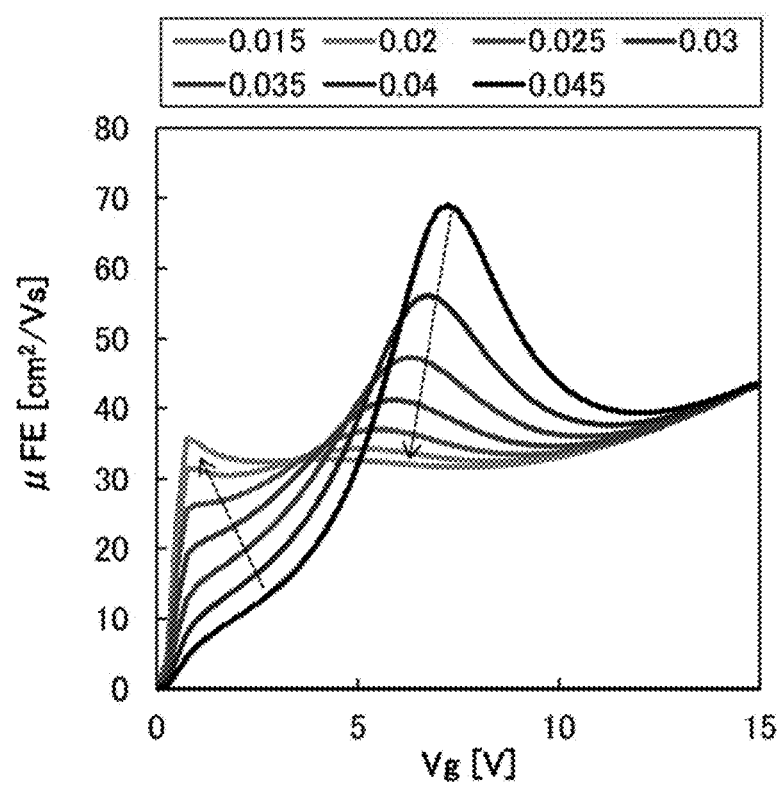
FIG. 11 shows shapes of mobility curves.

In this embodiment, the mobility curve in the case where the value of $W_{ta}$ was varied was calculated. FIG. 11 shows the shapes of the mobility curves with different values of $W_{ta}$. In FIG. 11, $N_{ta}$ is 2.5×10$^{19}$ cm$^{-3}$ eV$^{-1}$ and ΔL is 0. In addition, there were seven conditions where $W_{ta}$ was 0.015 eV, 0.02 eV, 0.025 eV, 0.03 eV, 0.035 eV, 0.04 eV, and 0.045 eV.

As shown in FIG. 11, as the value of $W_{ta}$ is smaller, that is, as the energy width of the sDOS is narrower, the mobility curve rises more steeply. In addition, it is found that as the energy width of the sDOS is narrower, the peak value of the mobility curve is shifted from the high $V_g$ side to the low $V_g$ side and reduced.

Figure 12:
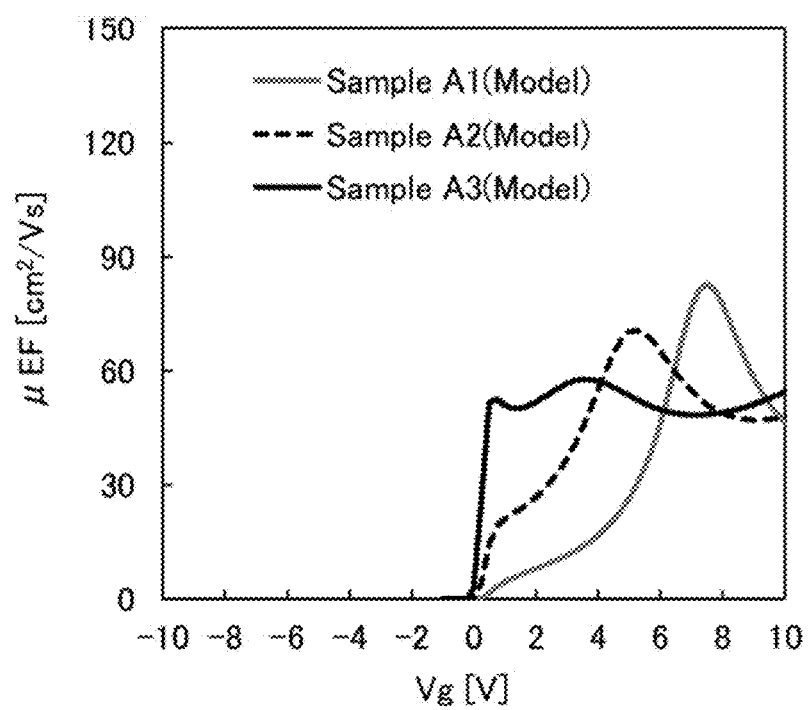
FIG. 12 shows calculation results of mobility curves.

Next, on the basis of donor density distributions of Samples A1 to A3 illustrated in FIGS. 6A to 6C and the shapes of the mobility curves shown in FIG. 11, the shapes of the mobility curves of models corresponding to Samples A1 to A3 were calculated. FIG. 12 shows calculation results of the mobility curves.

FIG. 12 shows the calculation results of the mobility curves of models corresponding to Samples A1 to A3. In Sample A1, $N_{ta}$ is 3.0×10$^{19}$ cm$^{-3}$ eV$^{-1}$, ΔL is 0, and $W_{ta}$ is 0.045 eV. In Sample A2, $N_{ta}$ is 3.0×10$^{19}$ cm$^{-3}$ eV$^{-1}$, ΔL is 0.4 μm, and $W_{ta}$ is 0.035 eV. In Sample A3, $N_{ta}$ is 2.5×10$^{19}$ cm$^{-3}$ eV$^{-1}$, ΔL is 0.6 μm, and $W_{ta}$ is 0.025 eV.

It can be thought that FIG. 12 shows results substantially reflecting the shapes of the mobility curves of Samples A1 to A3 shown in FIGS. 1A to 1C.

As described above, it is indicated that the sDOS greatly influences the shape of the mobility curve of the field-effect mobility of the transistor. Thus, Samples A1 to A3 described above may have different values of sDOS in the oxide semiconductor films.

Then, to measure sDOS in the oxide semiconductor films of Samples A1 to A3, Samples B1 to B3 were fabricated. Samples B1 to B3 were different from Samples A1 to A3 only in the size of the transistor. Samples B1, B2, and B3 were fabricated using the same methods as those of Samples A1, A2, and A3, respectively.

Figure 13:
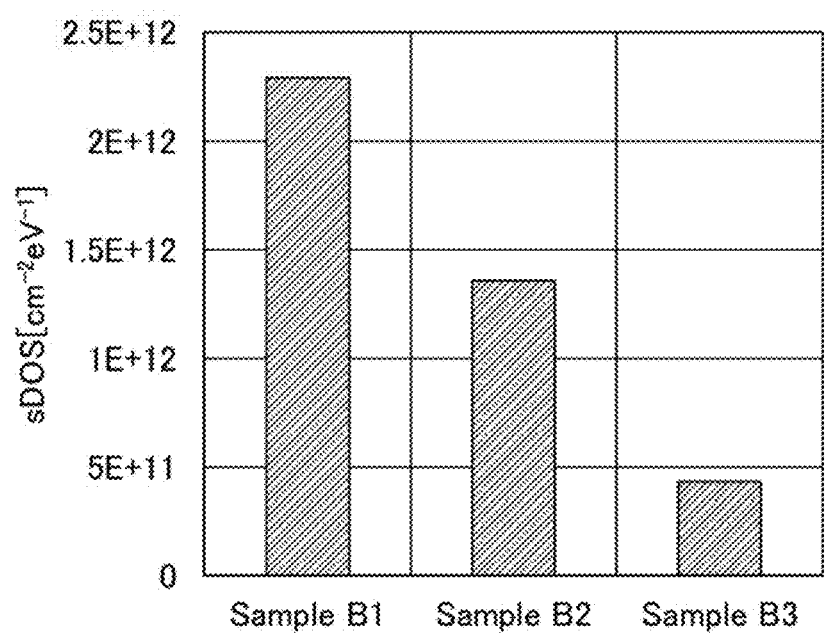
FIG. 13 shows results of sDOS.

FIG. 13 shows results of sDOS of Samples B1 to B3. The size of the transistor in each of Samples B1 to B3 was L/W=6 µm/50 µm.

As shown in FIG. 13, the highest sDOS in the oxide semiconductor film was observed from Sample B1, followed by Sample B2 and then Sample B3. That is, it is found that the highest sDOS in the oxide semiconductor film was observed from Sample A1, followed by Sample A2 and then Sample A3 and the results of device simulation that is shown above are valid.

Furthermore, in each of Samples B1 to B3, the peak value of sDOS is lower than $5 \times 10^{12}$ cm$^{-2}$ eV$^{-1}$, which indicates that Samples B1 to B3 each have extremely low sDOS. The peak value of sDOS in the oxide semiconductor film is preferably lower than $2.5 \times 10^{12}$ cm$^{-2}$ eV$^{-1}$, further preferably lower than $1.5 \times 10^{12}$ cm$^{-2}$ eV$^{-1}$, and still further preferably lower than $1.0 \times 10^{12}$ cm$^{-2}$ eV$^{-1}$.

In this manner, when sDOS in the oxide semiconductor film is reduced, the mobility curve can rise steeply. In addition, the peak value of the mobility curve on the high $V_g$ side can be shifted to the low $V_g$ side and reduced. That is, when sDOS in the oxide semiconductor film is reduced, the mobility curve of the field-effect mobility of the transistor including the oxide semiconductor film can rise steeply and the saturation of the mobility curve can be improved.

<1-4. Components of Transistor>

Next, details of the components of the transistor in FIGS. 4A to 4C will be described.

[Substrate]

The substrate 102 can be formed using a material having heat resistance high enough to withstand heat treatment in the manufacturing process.

Specifically, non-alkali glass, soda-lime glass, potash glass, crystal glass, quartz, sapphire, or the like can be used. Alternatively, an inorganic insulating film may be used. Examples of the inorganic insulating film include a silicon oxide film, a silicon nitride film, a silicon oxynitride film, and an aluminum oxide film.

The non-alkali glass may have a thickness of greater than or equal to 0.2 mm and less than or equal to 0.7 mm, for example. The non-alkali glass may be polished to obtain the above thickness.

As the non-alkali glass, a large-area glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, as the substrate 102, a single-crystal semiconductor substrate or a polycrystalline semiconductor substrate made of silicon or silicon carbide, a compound semiconductor substrate made of silicon germanium or the like, an SOI substrate, or the like may be used.

For the substrate 102, an inorganic material such as a metal may be used. Examples of the inorganic material such as a metal include stainless steel and aluminum.

Alternatively, for the substrate 102, an organic material such as a resin, a resin film, or plastic may be used. Examples of the resin film include polyester, polyolefin, polyamide (e.g., nylon or aramid), polyimide, polycarbonate, polyurethane, an acrylic resin, an epoxy resin, polyethylene terephthalate (PET), polyethylene naphthalate (PEN), polyether sulfone (PES), and a resin having a siloxane bond such as silicone.

For the substrate 102, a composite material of an inorganic material and an organic material may be used. Examples of the composite material include a resin film to which a metal plate or a thin glass plate is bonded, a resin film into which a fibrous or particulate metal or a fibrous or particulate glass is dispersed, and an inorganic material into which a fibrous or particulate resin is dispersed.

The substrate 102 can at least support films or layers formed thereover or thereunder and may be one or more of an insulating film, a semiconductor film, and a conductive film.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure of an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the channel region 108$i$ of the oxide semiconductor film 108 can be reduced.

For example, the insulating film 104 can be formed to have a single-layer structure or stacked-layer structure of a silicon oxide film, a silicon oxynitride film, a silicon nitride oxide film, a silicon nitride film, an aluminum oxide film, a hafnium oxide film, a gallium oxide film, a Ga—Zn oxide film, or the like. In this embodiment, the insulating film 104 has a stacked-layer structure of a silicon nitride film and a silicon oxynitride film. With the insulating film 104 having such a layered structure including a silicon nitride film as a lower layer and a silicon oxynitride film as an upper layer, oxygen can be efficiently introduced into the oxide semiconductor film 108.

[Oxide Semiconductor Film]

The oxide semiconductor film 108 is described in detail in Embodiment 2.

[Second Insulating Film]

The insulating film 110 has a function of supplying oxygen to the oxide semiconductor film 108, particularly to the channel region 108$i$. The insulating film 110 can be formed to have a single-layer structure or a stacked-layer structure of an oxide insulating film or a nitride insulating film, for example. To improve the interface properties with the oxide semiconductor film 108, a region which is in the insulating film 110 and in contact with the oxide semiconductor film 108 is preferably formed using at least an oxide insulating film. For example, a silicon oxide film, a silicon oxynitride film, a silicon nitride oxide film, or a silicon nitride film may be used as the insulating film 110.

The thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3\times10^{17}$ spins/cm$^3$ and preferably lower than or equal to $5\times10^{16}$ spins/cm$^3$ may be used.

In addition to the above-described signal, a signal due to nitrogen dioxide (NO$_2$) might be observed in the insulating film 110. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density of a signal due to nitrogen dioxide (NO$_2$) is higher than or equal to $1\times10^{17}$ spins/cm$^3$ and lower than $1\times10^{18}$ spins/cm$^3$ as the insulating film 110, for example.

Note that a nitrogen oxide (NO$_x$) such as nitrogen dioxide (NO$_2$) forms a state in the insulating film 110. The state is positioned in the energy gap of the oxide semiconductor film 108. Thus, when nitrogen oxide (NO$_x$) is diffused to the interface between the insulating film 110 and the oxide semiconductor film 108, an electron might be trapped by the state on the insulating film 110 side. As a result, the trapped electron remains in the vicinity of the interface between the insulating film 110 and the oxide semiconductor film 108, leading to a positive shift of the threshold voltage of the transistor. Accordingly, the use of a film with a low nitrogen oxide content as the insulating film 110 can reduce a shift of the threshold voltage of the transistor.

As an insulating film that releases a small amount of nitrogen oxide (NO$_x$), for example, a silicon oxynitride film can be used. The silicon oxynitride film releases more ammonia than nitrogen oxide (NO$_x$) in thermal desorption spectroscopy (TDS); the typical released amount of ammonia is greater than or equal to $1\times10^{18}$ cm$^{-3}$ and less than or equal to $5\times10^{19}$ cm$^{-3}$. Note that the released amount of ammonia is the total amount of ammonia released by heat treatment in a range of 50° C. to 650° C. or 50° C. to 550° C. in TDS.

Since nitrogen oxide (NO$_x$) reacts with ammonia and oxygen in heat treatment, the use of an insulating film that releases a large amount of ammonia reduces nitrogen oxide (NO$_x$).

Note that in the case where the insulating film 110 is analyzed by SIMS, nitrogen concentration in the film is preferably lower than or equal to $6\times10^{20}$ atoms/cm$^3$.

The insulating film 110 may be formed using a high-k material such as hafnium silicate (HfSiO$_x$), hafnium silicate containing nitrogen (HfSi$_x$O$_y$N$_z$), hafnium aluminate containing nitrogen (HfAl$_x$O$_y$N$_z$), or hafnium oxide. The use of such a high-k material enables a reduction in gate leakage current of a transistor.

[Third Insulating Film]

The insulating film 116 contains nitrogen or hydrogen. The insulating film 116 may contain fluorine. As the insulating film 116, for example, a nitride insulating film can be used. The nitride insulating film can be formed using silicon nitride, silicon nitride oxide, silicon oxynitride, silicon nitride fluoride, silicon fluoronitride, or the like. The hydrogen concentration in the insulating film 116 is preferably higher than or equal to $1\times10^{22}$ atoms/cm$^3$. Furthermore, the insulating film 116 is in contact with the source region 108s and the drain region 108d of the oxide semiconductor film 108. Thus, the concentration of an impurity (nitrogen or hydrogen) in the source region 108s and the drain region 108d in contact with the insulating film 116 is increased, leading to an increase in the carrier density of the source region 108s and the drain region 108d.

[Fourth Insulating Film]

As the insulating film 118, an oxide insulating film can be used. Alternatively, a layered film of an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

[Fifth Insulating Film]

The insulating film 122 has an insulating property and is formed using an inorganic material or an organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

[Conductive Film]

The conductive films 106, 112, 120a, and 120b can be formed by a sputtering method, a vacuum evaporation method, a PLD method, a thermal CVD method, or the like. As each of the conductive films 106, 112, 120a, and 120b, a conductive metal film, a conductive film that has a function of reflecting visible light, or a conductive film having a function of transmitting visible light may be used.

A material containing a metal element selected from aluminum, gold, platinum, silver, copper, chromium, tantalum, titanium, molybdenum, tungsten, nickel, iron, cobalt, palladium, and manganese can be used for the metal film having conductivity. Alternatively, an alloy containing any of the above metal elements may be used.

For the metal film having conductivity, specifically a two-layer structure in which a copper film is stacked over a titanium film, a two-layer structure in which a copper film is stacked over a titanium nitride film, a two-layer structure in which a copper film is stacked over a tantalum nitride film, a three-layer structure in which a titanium film, a copper film, and a titanium film are stacked in this order, or the like may be used. In particular, a conductive film containing a copper element is preferably used because the resistance can be reduced. As an example of the conductive film containing a copper element, an alloy film containing copper and manganese is given. The alloy film is favorable because it can be processed by a wet etching method.

Note that a tantalum nitride film is preferably used for the conductive films 106, 112, 120a, and 120b. A tantalum nitride film has conductivity and a high barrier property against copper or hydrogen. Because a tantalum nitride film releases little hydrogen from itself, it can be favorably used as a metal film in contact with the oxide semiconductor film 108 or a metal film in the vicinity of the oxide semiconductor film 108.

As the conductive film having conductivity, a conductive macromolecule or a conductive polymer may be used.

For the conductive film having a function of reflecting visible light, a material containing a metal element selected from gold, silver, copper, and palladium can be used. In particular, a conductive film containing a silver element is preferably used because reflectance of visible light can be improved.

For the conductive film having a function of transmitting visible light, a material containing an element selected from indium, tin, zinc, gallium, and silicon can be used. Specifically, an In oxide, a Zn oxide, an In—Sn oxide (also referred to as ITO), an In—Sn—Si oxide (also referred to as ITSO), an In—Zn oxide, an In—Ga—Zn oxide, or the like can be used.

As the conductive film having a function of transmitting visible light, a film containing graphene or graphite may be used. The film containing graphene can be formed in the following manner: a film containing graphene oxide is formed and is reduced. As a reducing method, a method with application of heat, a method using a reducing agent, or the like can be employed.

The conductive films 112, 120a, and 120b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

When the conductive film is formed by electroless plating, a diffusion prevention film may be formed under the conductive film to prevent component elements of the conductive film from diffusing outward. A seed layer that can make the conductive film grow may be formed between the diffusion prevention film and the conductive film. The diffusion prevention film can be formed by sputtering, for example. For the diffusion prevention film, a tantalum nitride film or a titanium nitride film can be used, for example. The seed layer can be formed by electroless plating. For the seed layer, a material similar to the material for the conductive film that can be formed by electroless plating can be used.

Note that an oxide semiconductor typified by an In—Ga—Zn oxide may be used for the conductive film 112. The oxide semiconductor can have a high carrier density when nitrogen or hydrogen is supplied from the insulating film 116. In other words, the oxide semiconductor functions as an oxide conductor (OC). Accordingly, the oxide semiconductor can be used for a gate electrode.

The conductive film 112 can have, for example, a single-layer structure of an oxide conductor (OC), a single-layer structure of a metal film, or a stacked-layer structure of an oxide conductor (OC) and a metal film.

Note that it is suitable that the conductive film 112 has a single-layer structure of a light-shielding metal film or a stacked-layer structure of an oxide conductor (OC) and a light-shielding metal film because the channel region 108i formed under the conductive film 112 can be shielded from light. In the case where the conductive film 112 has a stacked-layer structure of an oxide semiconductor or an oxide conductor (OC) and a light-shielding metal film, formation of a metal film (e.g., a titanium film or a tungsten film) over the oxide semiconductor or the oxide conductor (OC) produces any of the following effects: the resistance of the oxide semiconductor or the oxide conductor (OC) is reduced by the diffusion of the constituent element of the metal film to the oxide semiconductor or oxide conductor (OC) side, the resistance is reduced by damage (e.g., sputtering damage) during the deposition of the metal film, and the resistance is reduced when oxygen vacancies are formed by the diffusion of oxygen in the oxide semiconductor or the oxide conductor (OC) to the metal film.

The thickness of the conductive films 106, 112, 120a, and 120b can be greater than or equal to 30 nm and less than or equal to 500 nm, or greater than or equal to 100 nm and less than or equal to 400 nm.

<1-5. Structure Example 2 of Transistor>

Next, structures of transistors different from the structure of the transistor illustrated in FIGS. 4A to 4C will be described with reference to FIGS. 14A and 14B, FIGS. 15A and 15B, and FIGS. 16A and 16B.

Figure 14A:
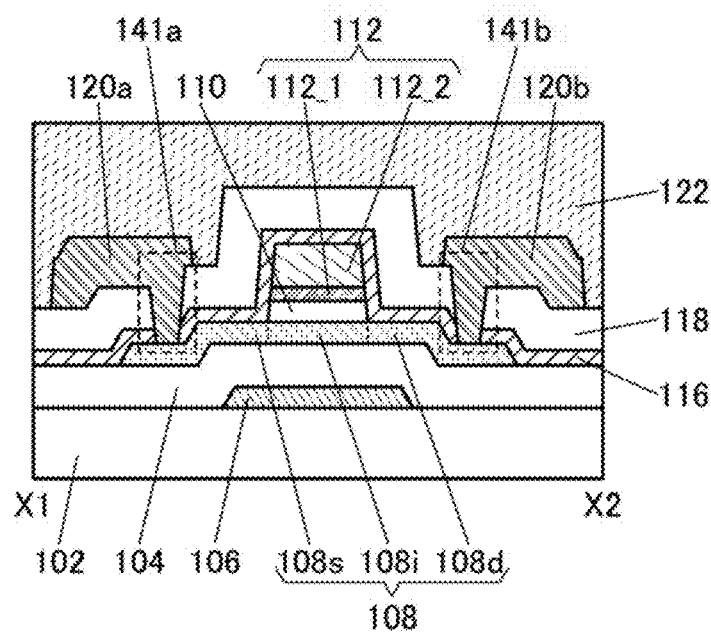
FIGS. 14A and 14B are cross-sectional views illustrating a semiconductor device.
Figure 14B:
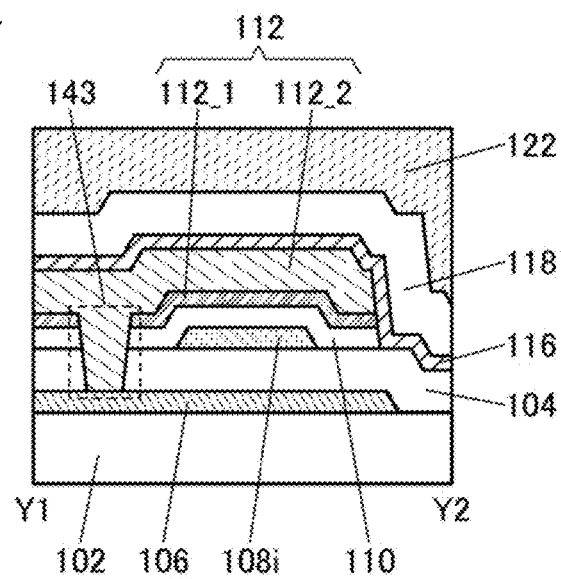
Figure 15A:
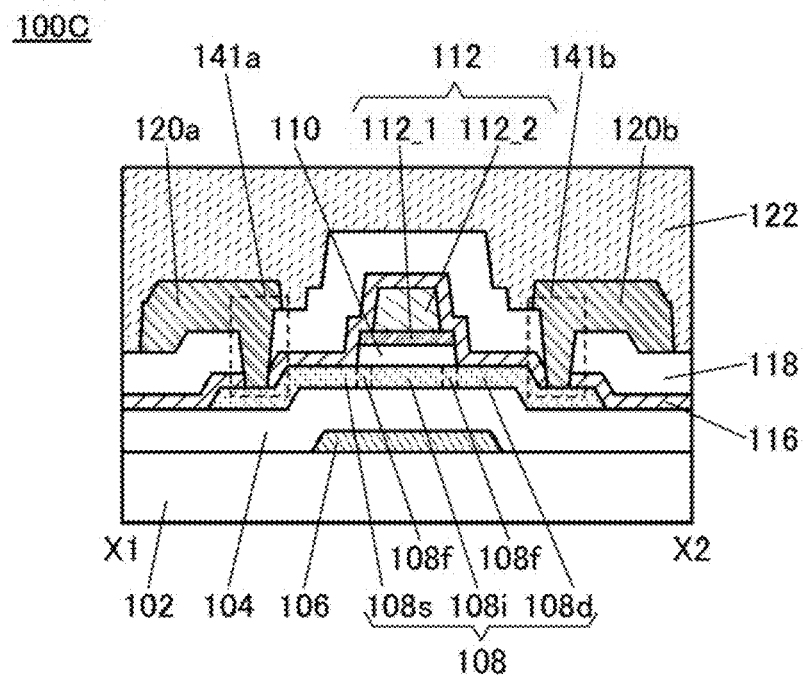
FIGS. 15A and 15B are cross-sectional views illustrating a semiconductor device.
Figure 15B:
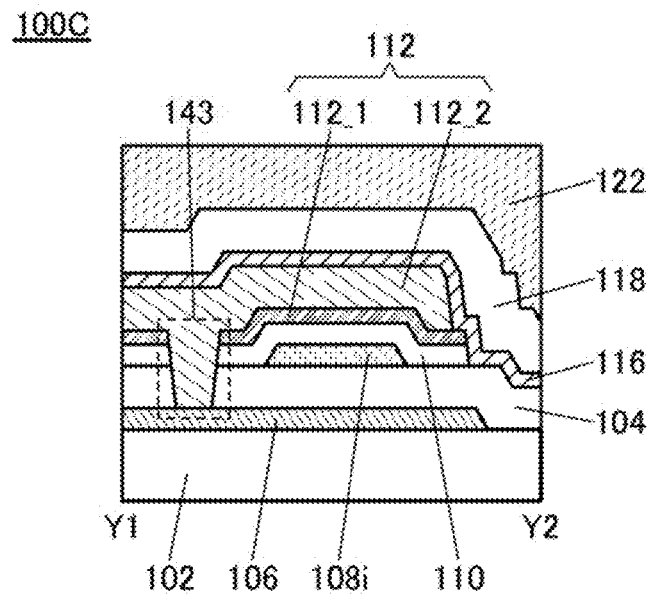
Figure 16A:
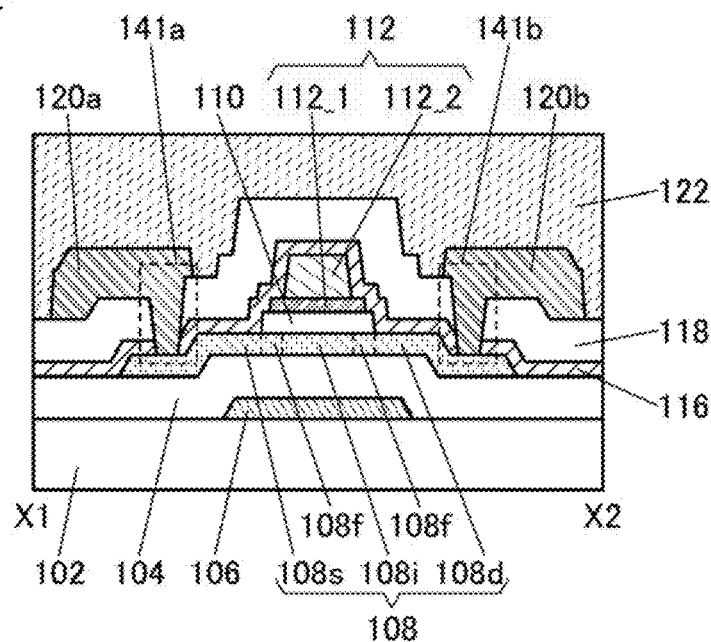
FIGS. 16A and 16B are cross-sectional views illustrating a semiconductor device.
Figure 16B:
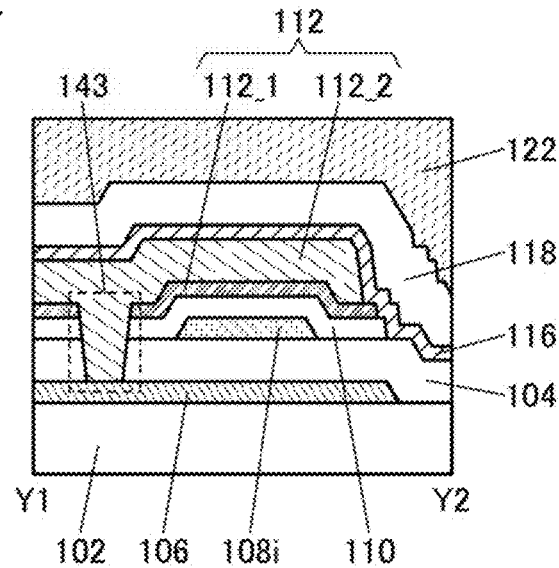

FIGS. 14A and 14B are cross-sectional views of a transistor 100B. FIGS. 15A and 15B are cross-sectional views of a transistor 100C. FIGS. 16A and 16B are cross-sectional views of a transistor 100D. The top views of the transistors 100B, 100C, and 100D are not illustrated because they are similar to the top view of the transistor 100A in FIG. 4A.

The transistor 100B illustrated in FIGS. 14A and 14B is different from the transistor 100A in the layered structure of the conductive film 112, the shape of the conductive film 112, and the shape of the insulating film 110.

The conductive film 112 in the transistor 100B includes a conductive film 112_1 over the insulating film 110 and the conductive film 112_2 over the conductive film 112_1. For example, an oxide conductive film is used as the conductive film 112_1, so that excess oxygen can be added to the insulating film 110. The oxide conductive film can be formed by a sputtering method in an atmosphere containing an oxygen gas. As the oxide conductive film, an oxide film containing indium and tin, an oxide film containing tungsten and indium, an oxide film containing tungsten, indium, and zinc, an oxide film containing titanium and indium, an oxide film containing titanium, indium, and tin, an oxide film containing indium and zinc, an oxide film containing silicon, indium, and tin, or an oxide film containing indium, gallium, and zinc can be used, for example.

As illustrated in FIG. 14B, the conductive film 112_2 is connected to the conductive film 106 through the opening 143. By forming the opening 143 after a conductive film to be the conductive film 112_1 is formed, the shape illustrated in FIG. 14B can be obtained. In the case where an oxide conductive film is used as the conductive film 112_1, the structure in which the conductive film 112_2 is connected to the conductive film 106 can decrease the contact resistance between the conductive film 112 and the conductive film 106.

The conductive film 112 and the insulating film 110 in the transistor 100B have a tapered shape. More specifically, the lower edge portion of the conductive film 112 is positioned outside the upper edge portion of the conductive film 112. The lower edge portion of the insulating film 110 is positioned outside the upper edge portion of the insulating film 110. In addition, the lower edge portion of the conductive film 112 is formed in substantially the same position as that of the upper edge portion of the insulating film 110.

It is suitable that the conductive film 112 and the insulating film 110 have tapered shapes as in the transistor 100B, because the coverage with the insulating film 116 can be high as compared with the case of the transistor 100A in which the conductive film 112 and the insulating film 110 are rectangular.

The other components of the transistor 100B are similar to those of the transistor 100A described above and have similar effects.

The transistor 100C illustrated in FIGS. 15A and 15B is different from the transistor 100A in the layered structure of the conductive film 112, the shape of the conductive film 112, and the shape of the insulating film 110.

The conductive film 112 in the transistor 100C includes the conductive film 112_1 over the insulating film 110 and the conductive film 112_2 over the conductive film 112_1. A lower end portion of the conductive film 112_1 is located outward from a lower end portion of the conductive film 112_2. The conductive film 112_1, the conductive film 112_2, and the insulating film 110 can be formed by processing with the same mask. To obtain the above structure, for example, the conductive film 112_2 is processed by a wet etching method and the conductive film 112_1 and the insulating film 110 are processed by a dry etching method.

With the structure of the transistor 100C, regions 108f are formed in the oxide semiconductor film 108 in some cases. The regions 108f are formed between the channel region 108i and the source region 108s and between the channel region 108i and the drain region 108d.

The regions 108f function as high-resistance regions or low-resistance regions. The high-resistance regions have the same level of resistance as the channel region 108i and do not overlap with the conductive film 112 functioning as a gate electrode. In the case where the regions 108f are high-resistance regions, the regions 108f function as offset regions. To suppress a decrease in the on-state current of the transistor 100C, the regions 108f functioning as offset regions may each have a length of 1 μm or less in the channel length (L) direction.

The low-resistance regions have a resistance that is lower than that of the channel region 108i and higher than that of the source region 108s and the drain region 108d. In the case where the regions 108f are low-resistance regions, the regions 108f function as lightly doped drain (LDD) regions. The regions 108f functioning as LDD regions can relieve an electric field in the drain region, thereby reducing a change in the threshold voltage of the transistor due to the electric field in the drain region.

Note that in the case where the regions 108f serve as LDD regions, for example, the regions 108f are formed by supplying one or more of nitrogen, hydrogen, and fluorine from the insulating film 116 to the regions 108f or by adding an impurity element from above the conductive film 112_1 using the insulating film 110 and the conductive film 112_1 as a mask so that the impurity element is added to the oxide semiconductor film 108 through the conductive film 112_1 and the insulating film 110.

As illustrated in FIG. 15B, the conductive film 112_2 is connected to the conductive film 106 through the opening 143.

The other components of the transistor 100C are similar to those of the transistor 100A described above and have similar effects.

The transistor 100D illustrated in FIGS. 16A and 16B is different from the transistor 100A in the layered structure of the conductive film 112, the shape of the conductive film 112, and the shape of the insulating film 110.

The conductive film 112 in the transistor 100D includes the conductive film 112_1 over the insulating film 110 and the conductive film 112_2 over the conductive film 112_1. A lower end portion of the conductive film 112_1 is located outward from a lower end portion of the conductive film 112_2. Furthermore, a lower end portion of the insulating film 110 is located outward from the lower end portion of the conductive film 112_1. The conductive film 112_1, the conductive film 112_2, and the insulating film 110 can be formed by processing with the same mask. To obtain the above structure, for example, the conductive film 112_2 and the conductive film 112_1 are processed by a wet etching method and the insulating film 110 is processed by a dry etching method.

Like the transistor 100C, regions 108f are formed in the oxide semiconductor film 108 in the transistor 100D, in some cases. The regions 108f are formed between the channel region 108i and the source region 108s and between the channel region 108i and the drain region 108d.

As illustrated in FIG. 16B, the conductive film 112_2 is connected to the conductive film 106 through the opening 143.

The other components of the transistor 100D are similar to those of the transistor 100A described above and have similar effects.

<1-6. Structure Example 3 of Transistor>

Next, structures of transistors different from the structure of the transistor 100A illustrated in FIGS. 4A to 4C will be described with reference to FIGS. 17A and 17B, FIGS. 18A and 18B, FIGS. 19A and 19B, FIGS. 20A and 20B, and FIGS. 21A and 21B.

Figure 17A:
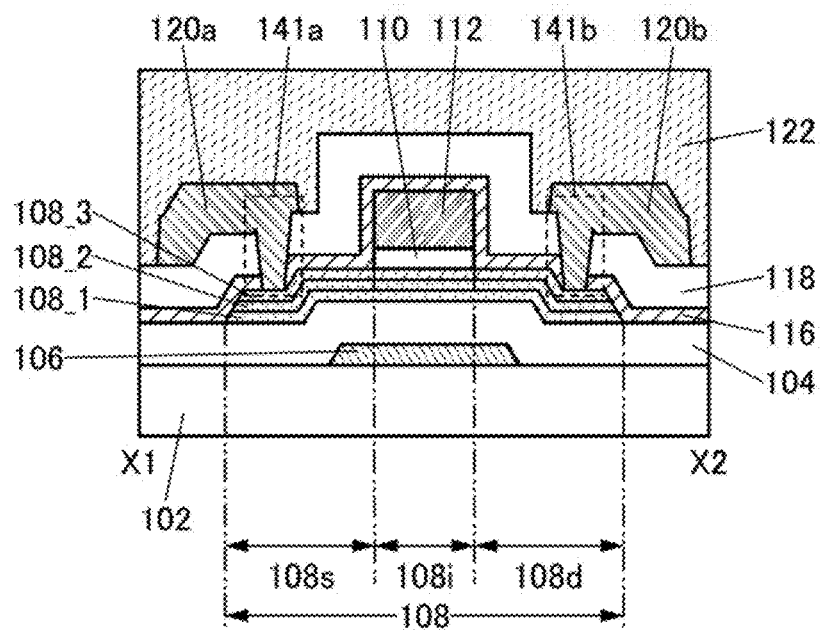
FIGS. 17A and 17B are cross-sectional views illustrating a semiconductor device.
Figure 17B:
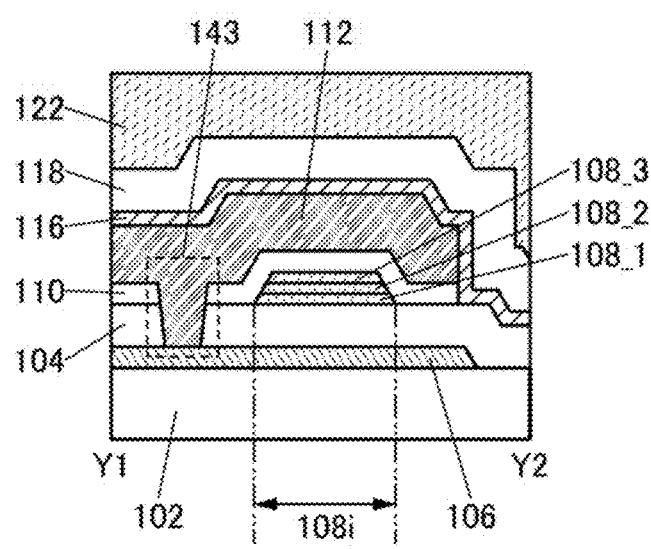
Figure 18A:
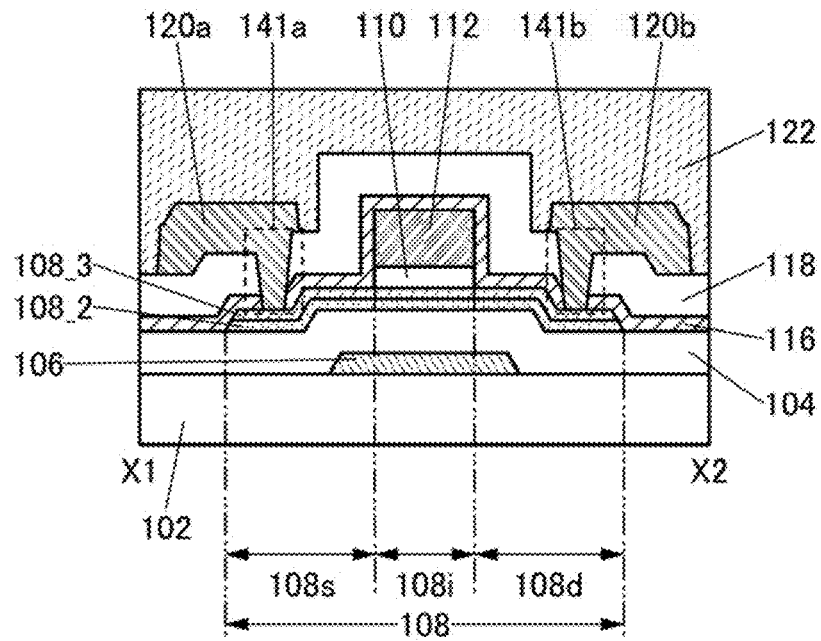
FIGS. 18A and 18B are cross-sectional views illustrating a semiconductor device.
Figure 18B:
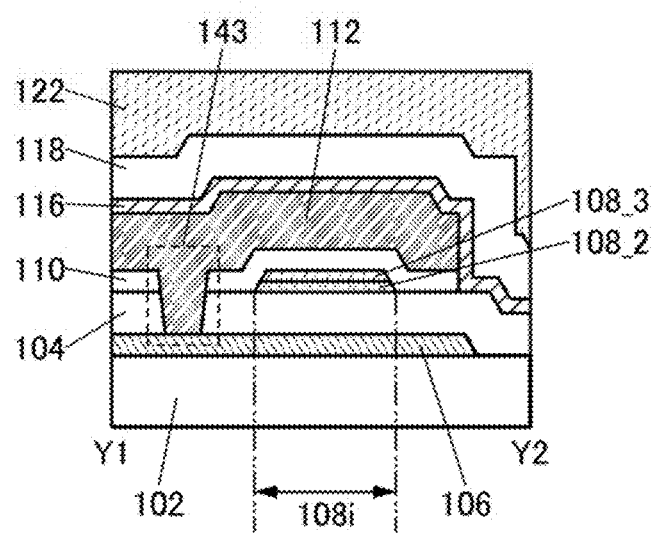
Figure 19A:
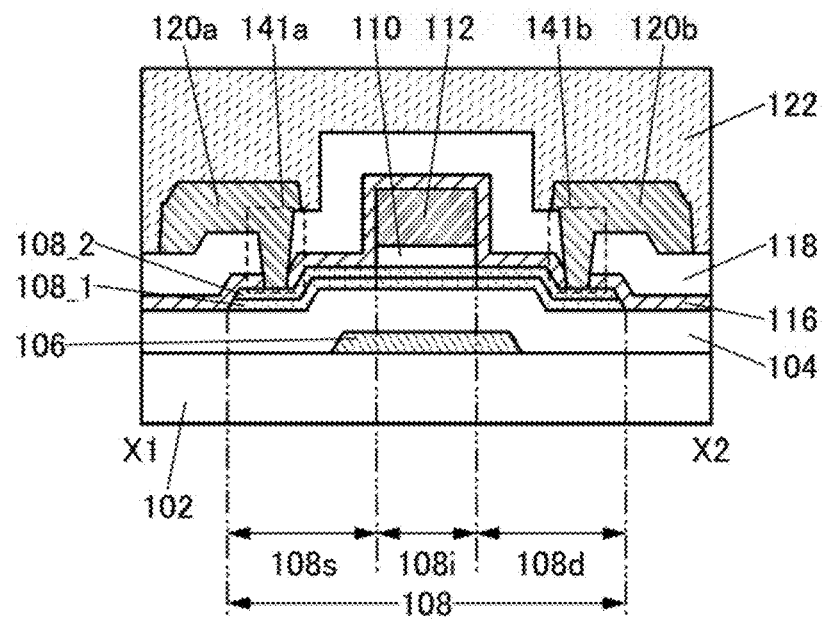
FIGS. 19A and 19B are cross-sectional views illustrating a semiconductor device.
Figure 19B:
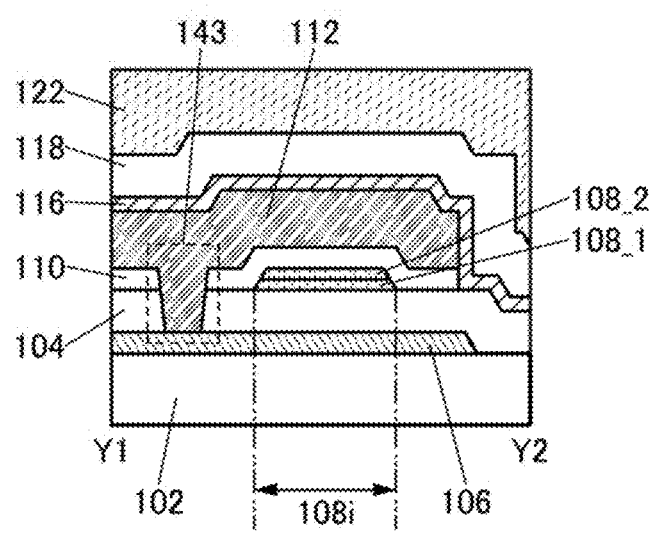
Figure 20A:
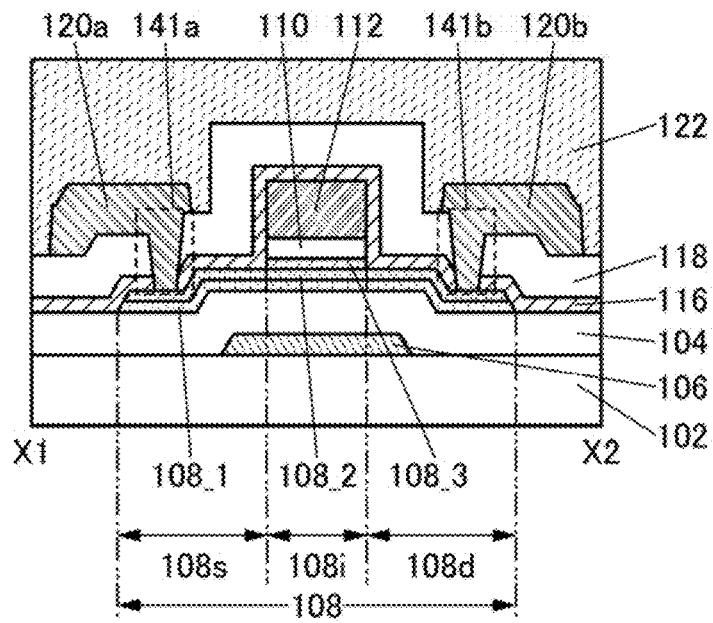
FIGS. 20A and 20B are cross-sectional views illustrating a semiconductor device.
Figure 20B:
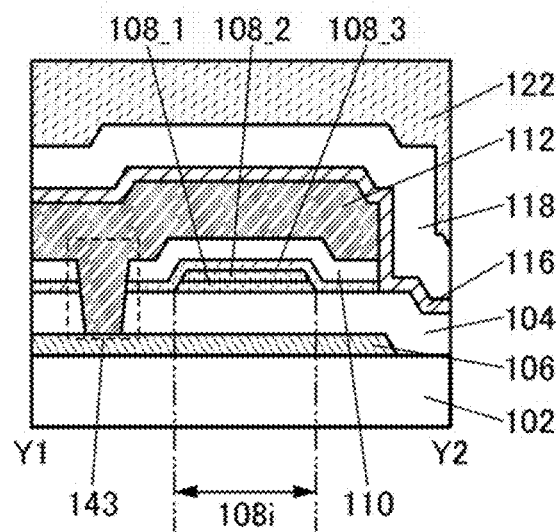
Figure 21A:
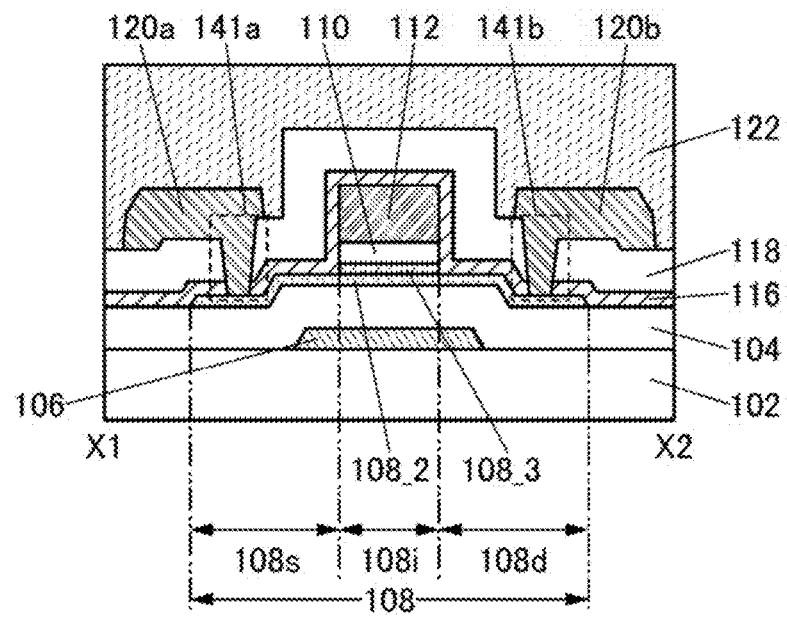
FIGS. 21A and 21B are cross-sectional views illustrating a semiconductor device.
Figure 21B:
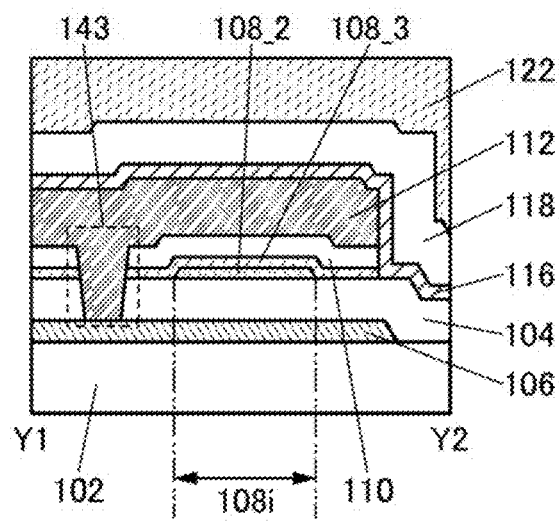

FIGS. 17A and 17B are cross-sectional views of a transistor 100E. FIGS. 18A and 18B are cross-sectional views of a transistor 100F. FIGS. 19A and 19B are cross-sectional views of a transistor 100G. FIGS. 20A and 20B are cross-sectional views of a transistor 100H. FIGS. 21A and 21B are cross-sectional views of a transistor 100J. The top views of the transistors 100E, 100F, 100G, 100H, and 100J are not illustrated because they are similar to the top view of the transistor 100A in FIG. 4A.

The transistors 100E, 100F, 100G, 100H, and 100J are different from the above-described the transistor 100A in the structure of the oxide semiconductor film 108. The other components are similar to those of the transistor 100A and have similar effects.

The oxide semiconductor film 108 of the transistor 100E illustrated in FIGS. 17A and 17B includes an oxide semiconductor film 108_1 over the insulating film 104, an oxide semiconductor film 108_2 over the oxide semiconductor film 108_1, and an oxide semiconductor film 108_3 over the oxide semiconductor film 108_2. The channel region 108i, the source region 108s, and the drain region 108d each have a three-layer structure of the oxide semiconductor film 108_1, the oxide semiconductor film 108_2, and the oxide semiconductor film 108_3.

The oxide semiconductor film 108 of the transistor 100F illustrated in FIGS. 18A and 18B includes the oxide semiconductor film 108_2 over the insulating film 104, and the oxide semiconductor film 108_3 over the oxide semiconductor film 108_2. The channel region 108i, the source region 108s, and the drain region 108d each have a two-layer structure of the oxide semiconductor film 108_2 and the oxide semiconductor film 108_3.

The oxide semiconductor film 108 of the transistor 100G illustrated in FIGS. 19A and 19B includes the oxide semiconductor film 108_1 over the insulating film 104, and the oxide semiconductor film 108_2 over the oxide semiconductor film 108_1. The channel region 108i, the source region 108s, and the drain region 108d each have a two-layer structure of the oxide semiconductor film 108_1 and the oxide semiconductor film 108_2.

The oxide semiconductor film 108 of the transistor 100H illustrated in FIGS. 20A and 20B includes the oxide semiconductor film 108_1 over the insulating film 104, the oxide semiconductor film 108_2 over the oxide semiconductor film 108_1, and the oxide semiconductor film 108_3 over the oxide semiconductor film 108_2. The channel region 108i has a three-layer structure of the oxide semiconductor film 108_1, the oxide semiconductor film 108_2, and the oxide semiconductor film 108_3. The source region 108s and the drain region 108d each have a two-layer structure of the oxide semiconductor film 108_1 and the oxide semiconductor film 108_2. Note that in the cross section of the transistor 100H in the channel width (W) direction, the oxide semiconductor film 108_3 covers side surfaces of the oxide semiconductor film 108_1 and the oxide semiconductor film 108_2.

The oxide semiconductor film 108 of the transistor 100J illustrated in FIGS. 21A and 21B includes the oxide semiconductor film 108_2 over the insulating film 104, and the oxide semiconductor film 108_3 over the oxide semiconductor film 108_2. The channel region 108i has a two-layer structure of the oxide semiconductor film 108_2 and the oxide semiconductor film 108_3. The source region 108s and the drain region 108d each have a single-layer structure of the oxide semiconductor film 108_2. Note that in the cross section of the transistor 100J in the channel width (W) direction, the oxide semiconductor film 108_3 covers side surfaces of the oxide semiconductor film 108_2.

A side surface of the channel region 108i in the channel width (W) direction or a region in the vicinity of the side surface is easily damaged by processing, resulting in a defect (e.g., oxygen vacancy), or easily contaminated by an impurity attached thereto. Therefore, even when the channel region 108i is substantially intrinsic, stress such as an electric field applied thereto activates the side surface of the channel region 108i in the channel width (W) direction or the region in the vicinity of the side surface and turns it into a low-resistance (n-type) region easily. Moreover, if the side surface of the channel region 108i in the channel width (W) direction or the region in the vicinity of the side surface is an n-type region, a parasitic channel may be formed because the n-type region serves as a carrier path.

Thus, in the transistor 100H and the transistor 100J, the channel region 108i has a stacked-layer structure and side surfaces of the channel region 108i in the channel width (W) direction are covered with one layer of the stacked layers. With such a structure, defects on or in the vicinity of the side surfaces of the channel region 108i can be suppressed or adhesion of an impurity to the side surfaces of the channel region 108i or to regions in the vicinity of the side surfaces can be reduced.

[Band Structure]

Here, a band structure of the insulating film 104, the oxide semiconductor films 108_1, 108_2, and 108_3, and the insulating film 110, a band structure of the insulating film 104, the oxide semiconductor films 108_2 and 108_3, and the insulating film 110, and a band structure of the insulating film 104, the oxide semiconductor films 108_1 and 108_2, and the insulating film 110 will be described with reference to FIGS. 22A to 22C. Note that FIGS. 22A to 22C are each a band structure of the channel region 108i.

Figure 22A:
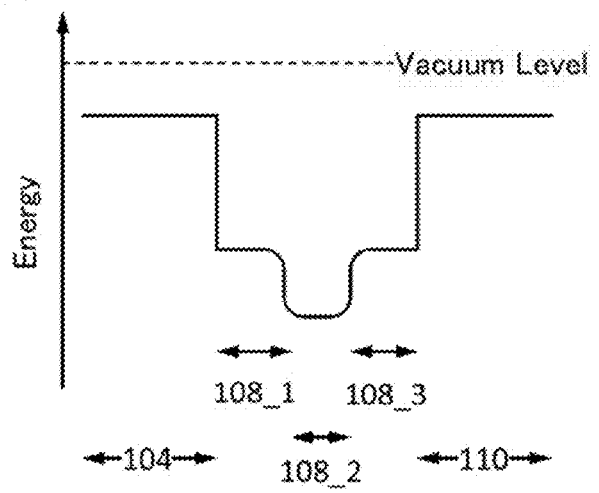
FIGS. 22A to 22C each illustrate a band structure of a transistor.

FIG. 22A shows an example of a band structure in the thickness direction of a stack including the insulating film 104, the oxide semiconductor films 108_1, 108_2, and 108_3, and the insulating film 110. FIG. 22B shows an example of a band structure in the thickness direction of a stack including the insulating film 104, the oxide semiconductor films 108_2 and 108_3, and the insulating film 110. FIG. 22C shows an example of a band structure in the thickness direction of a stack including the insulating film 104, the oxide semiconductor films 108_1 and 108_2, and the insulating film 110. For easy understanding, the band structures show the conduction band minimum ($E_c$) of the insulating film 104, the oxide semiconductor films 108_1, 108_2, and 108_3, and the insulating film 110.

In the band structure of FIG. 22A, a silicon oxide film is used as each of the insulating films 104 and 110, an oxide semiconductor film formed using a metal oxide target whose atomic ratio of In to Ga and Zn is 1:3:2 is used as the oxide semiconductor film 108_1, an oxide semiconductor film formed using a metal oxide target whose atomic ratio of In to Ga and Zn is 4:2:4.1 is used as the oxide semiconductor film 108_2, and an oxide semiconductor film formed using a metal oxide target whose atomic ratio of In to Ga and Zn is 1:3:2 is used as the oxide semiconductor film 108_3.

Figure 22B:
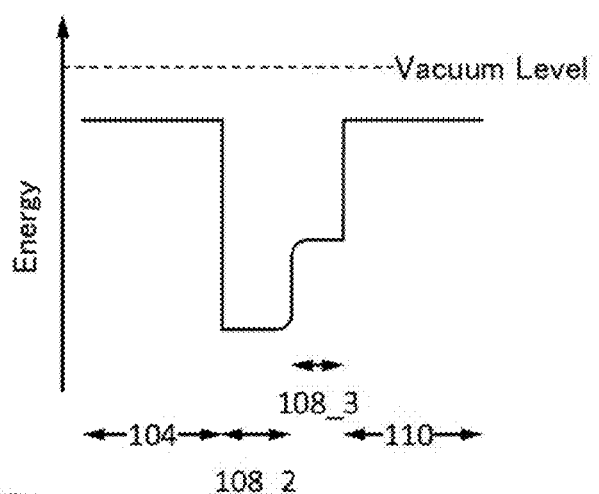
Figure 22C:
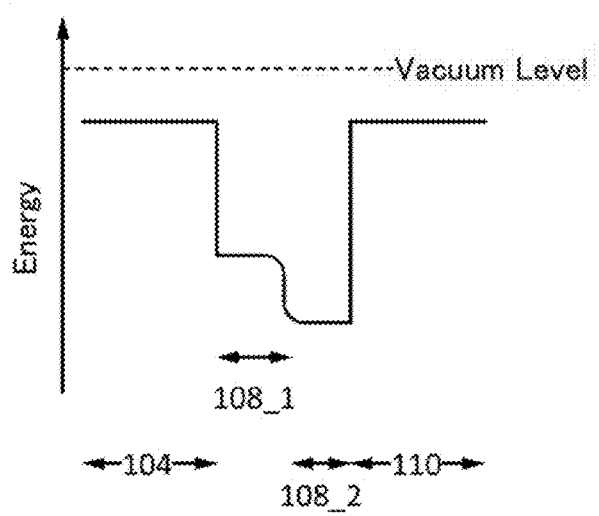

In the band structure of FIG. 22B, a silicon oxide film is used as each of the insulating films 104 and 110, an oxide semiconductor film formed using a metal oxide target whose atomic ratio of In to Ga and Zn is 4:2:4.1 is used as the oxide semiconductor film 108_2, and an oxide semiconductor film formed using a metal oxide target whose atomic ratio of In to Ga and Zn is 1:3:2 is used as the oxide semiconductor film 108_3.

In the band structure of FIG. 22C, a silicon oxide film is used as each of the insulating films 104 and 110, an oxide semiconductor film formed using a metal oxide target whose atomic ratio of In to Ga and Zn is 1:3:2 is used as the oxide semiconductor film 108_1, and an oxide semiconductor film formed using a metal oxide target whose atomic ratio of In to Ga and Zn is 4:2:4.1 is used as the oxide semiconductor film 108_2.

As illustrated in FIG. 22A, the conduction band minimum gradually varies between the oxide semiconductor films 108_1, 108_2, and 108_3. As illustrated in FIG. 22B, the conduction band minimum gradually varies between the oxide semiconductor films 108_2 and 108_3. As illustrated in FIG. 22C, the conduction band minimum gradually varies between the oxide semiconductor films 108_1 and 108_2. In other words, the conduction band minimum is continuously changed or continuously connected. To obtain such a band structure, there exists no impurity, which forms a defect state such as a trap center or a recombination center, at the interface between the oxide semiconductor films 108_1 and 108_2 or the interface between the oxide semiconductor films 108_2 and 108_3.

To form a continuous junction between the oxide semiconductor films 108_1, 108_2, and 108_3, it is necessary to form the films successively without exposure to the air with a multi-chamber deposition apparatus (sputtering apparatus) provided with a load lock chamber.

With the band structure of FIG. 22A, FIG. 22B, or FIG. 22C, the oxide semiconductor film 108_2 serves as a well, and a channel region is formed in the oxide semiconductor film 108_2 in the transistor with the stacked-layer structure.

By providing the oxide semiconductor films 108_1 and 108_3, the oxide semiconductor film 108_2 can be distanced away from defect states.

In addition, the defect states might be more distant from the vacuum level than the conduction band minimum ($E_c$) of the oxide semiconductor film 108_2 functioning as a channel region, so that electrons are likely to be accumulated in the defect states. When the electrons are accumulated in the defect states, the electrons become negative fixed electric charge, so that the threshold voltage of the transistor is shifted in the positive direction. Therefore, it is preferable that the defect states be closer to the vacuum level than the conduction band minimum ($E_c$) of the oxide semiconductor film 108_2. Such a structure inhibits accumulation of electrons in the defect states. As a result, the on-state current and the field-effect mobility of the transistor can be increased.

The conduction band minimum of each of the oxide semiconductor films 108_1 and 108_3 is closer to the vacuum level than that of the oxide semiconductor film 108_2. A typical difference between the conduction band minimum of the oxide semiconductor film 108_2 and the conduction band minimum of each of the oxide semiconductor films 108_1 and 108_3 is 0.15 eV or more or 0.5 eV or more and 2 eV or less or 1 eV or less. That is, the difference between the electron affinity of each of the oxide semiconductor films 108_1 and 108_3 and the electron affinity of the oxide semiconductor film 108_2 is 0.15 eV or more or 0.5 eV or more and 2 eV or less or 1 eV or less.

In such a structure, the oxide semiconductor film 108_2 serves as a main path of a current. In other words, the oxide semiconductor film 108_2 serves as a channel region, and the oxide semiconductor films 108_1 and 108_3 serve as oxide insulating films. It is preferable that the oxide semiconductor films 108_1 and 108_3 each include one or more metal elements constituting a part of the oxide semiconductor film 108_2 in which a channel region is formed. With such a structure, interface scattering hardly occurs at the interface between the oxide semiconductor film 108_1 and the oxide semiconductor film 108_2 or at the interface between the oxide semiconductor film 108_2 and the oxide semiconductor film 108_3. Thus, the transistor can have high field-effect mobility because the movement of carriers is not hindered at the interface.

To prevent each of the oxide semiconductor films 108_1 and 108_3 from functioning as part of a channel region, a material having sufficiently low conductivity is used for the oxide semiconductor films 108_1 and 108_3. Thus, the oxide semiconductor films 108_1 and 108_3 can be referred to as oxide insulating films for such properties and/or functions. Alternatively, a material that has a smaller electron affinity (a difference between the vacuum level and the conduction band minimum) than the oxide semiconductor film 108_2 and has a difference in the conduction band minimum from the oxide semiconductor film 108_2 (band offset) is used for the oxide semiconductor films 108_1 and 108_3. Furthermore, to inhibit generation of a difference in threshold voltage due to the value of the drain voltage, it is preferable to form the oxide semiconductor films 108_1 and 108_3 using a material whose conduction band minimum is closer to the vacuum level than that of the oxide semiconductor film 108_2. For example, a difference between the conduction band minimum of the oxide semiconductor film 108_2 and the conduction band minimum of each of the oxide semiconductor films 108_1 and 108_3 is preferably greater than or equal to 0.2 eV, further preferably greater than or equal to 0.5 eV.

It is preferable that the oxide semiconductor films 108_1 and 108_3 not have a spinel crystal structure. This is because if the oxide semiconductor films 108_1 and 108_3 have a spinel crystal structure, constituent elements of the conductive films 120a and 120b might be diffused into the oxide semiconductor film 108_2 at the interface between the spinel crystal structure and another region. Note that each of the oxide semiconductor films 108_1 and 108_3 is preferably a CAAC-OS film described later, in which case a higher blocking property against constituent elements of the conductive films 120a and 120b, for example, copper elements, can be obtained.

Although the example where an oxide semiconductor film formed using a metal oxide target whose atomic ratio of In to Ga and Zn is 1:3:2, is used as each of the oxide semiconductor films 108_1 and 108_3 is described in this embodiment, one embodiment of the present invention is not limited thereto. For example, an oxide semiconductor film formed using a metal oxide target whose atomic ratio of In to Ga and Zn is 1:1:1, 1:1:1.2, 1:3:4, 1:3:6, 1:4:5, 1:5:6, or 1:10:1 may be used as each of the oxide semiconductor films 108_1 and 108_3. Alternatively, oxide semiconductor films formed using a metal oxide target whose atomic ratio of Ga to Zn is 10:1 may be used as the oxide semiconductor films 108_1 and 108_3. It is suitable that an oxide semiconductor film formed using a metal oxide target whose atomic ratio of In to Ga and Zn is 1:1:1 is used as the oxide semiconductor film 108_2 and an oxide semiconductor film formed using a metal oxide target whose atomic ratio of Ga to Zn is 10:1 is used as each of the oxide semiconductor films 108_1 and 108_3 because the difference between the conduction band minimum of the oxide semiconductor film 108_2 and the conduction band minimum of the oxide semiconductor film 108_1 or 108_3 can be 0.6 eV or more.

When the oxide semiconductor films 108_1 and 108_3 are formed using a metal oxide target whose atomic ratio of In to Ga and Zn is 1:1:1, the atomic ratio of In to Ga and Zn in the oxide semiconductor films 108_1 and 108_3 might be 1:$\beta$1:$\beta$2 (0<$\beta$1≤2, 0<$\beta$2≤2). When the oxide semiconductor films 108_1 and 108_3 are formed using a metal oxide target whose atomic ratio of In to Ga and Zn is 1:3:4, the atomic ratio of In to Ga and Zn in the oxide semiconductor films 108_1 and 108_3 might be 1:$\beta$3:$\beta$4 (1≤$\beta$3≤5, 2≤$\beta$4≤6). When the oxide semiconductor films 108_1 and 108_3 are formed using a metal oxide target whose atomic ratio of In to Ga and Zn is 1:3:6, the atomic ratio of In to Ga and Zn in the oxide semiconductor films 108_1 and 108_3 might be 1:$\beta$5:$\beta$6 (1≤$\beta$5≤5, 4≤$\beta$6≤8).

At least part of this embodiment can be implemented in combination with any of the other embodiments described in this specification as appropriate.

Embodiment 2

In this embodiment, the composition, the structure, and the like of an oxide semiconductor film that can be used in one embodiment of the present invention are described with reference to FIGS. 23A to 23C, FIG. 24, FIG. 25, FIGS. 26A to 26C, FIGS. 27A to 27C, FIGS. 28A to 28C, FIGS. 29A to 29C, FIGS. 30A to 30C, FIGS. 31A to 31C, FIGS. 32A and 32B, FIG. 33, FIG. 34, FIGS. 35A1 to 35C2, FIG. 36, FIGS. 37A1 to 37C2, and FIGS. 38A to 38C.

<2-1. Composition of Oxide Semiconductor Film>

First, the composition of an oxide semiconductor film is described.

An oxide semiconductor film preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor film contains indium, an element M, and zinc is considered. The element M is aluminum, gallium, yttrium, tin, or the like.

Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

First, preferred ranges of the atomic ratio of indium, the element M, and zinc contained in an oxide semiconductor film according to an embodiment of the present invention are described with reference to FIGS. 23A to 23C. Note that the proportion of oxygen atoms is not shown. The terms of the atomic ratio of indium, the element M, and zinc contained in the oxide semiconductor film are denoted by [In], [M], and [Zn], respectively.

Figure 23A:
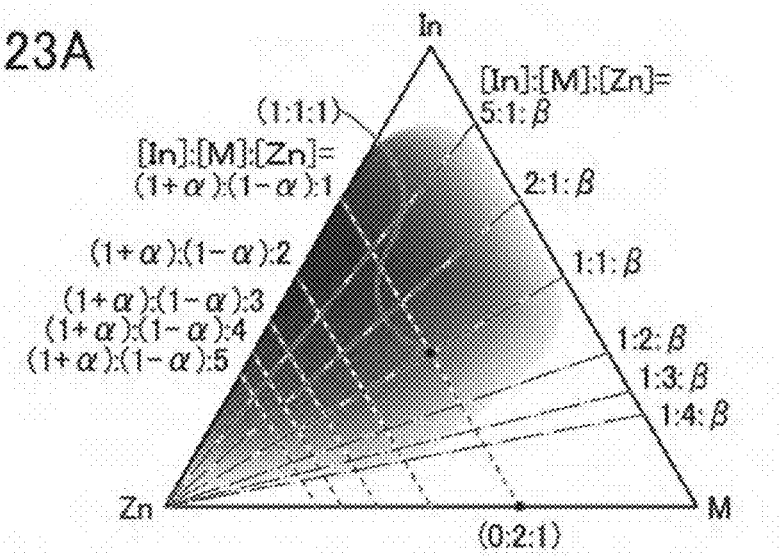
FIGS. 23A to 23C each show the range of the atomic ratio of an oxide semiconductor.
Figure 23B:
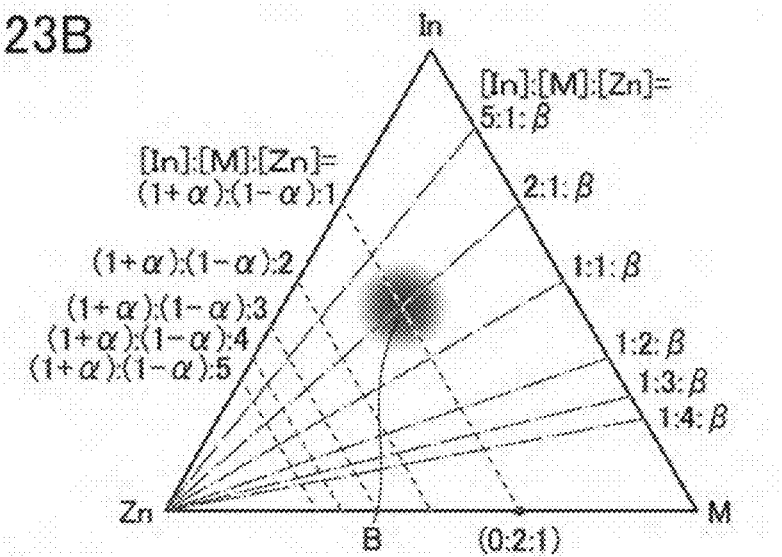
Figure 23C:
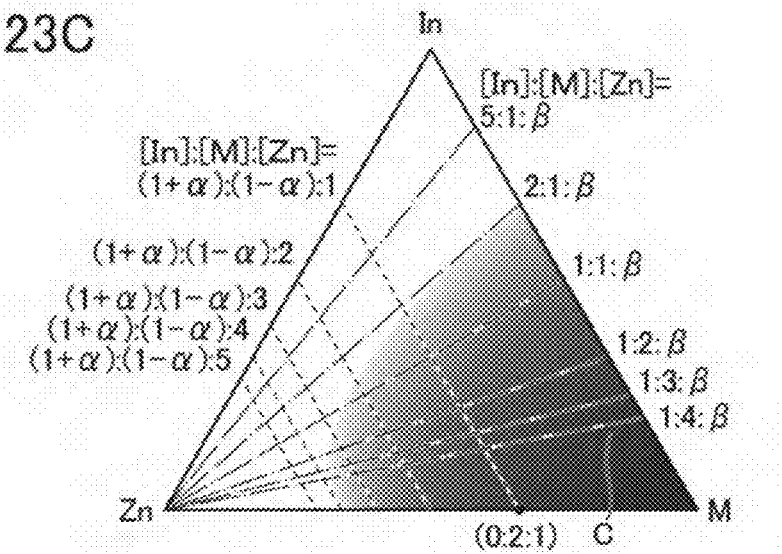

In FIGS. 23A to 23C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

Dashed-double dotted lines is a line indicating the atomic ratio [In]:[M]:[Zn]=$(1+\gamma):2:(1-\gamma)$ $(-1 \leq \gamma \leq 1)$. The oxide semiconductor film shown in FIGS. 23A to 23C with an atomic ratio of [In]:[M]:[Zn]=0:2:1 or an atomic ratio that is in the neighborhood thereof is likely to have a spinel crystal structure.

FIGS. 23A and 23B show examples of the preferred ranges of the atomic ratio of indium, the element M, and zinc contained in an oxide semiconductor film in one embodiment of the present invention.

Figure 24:
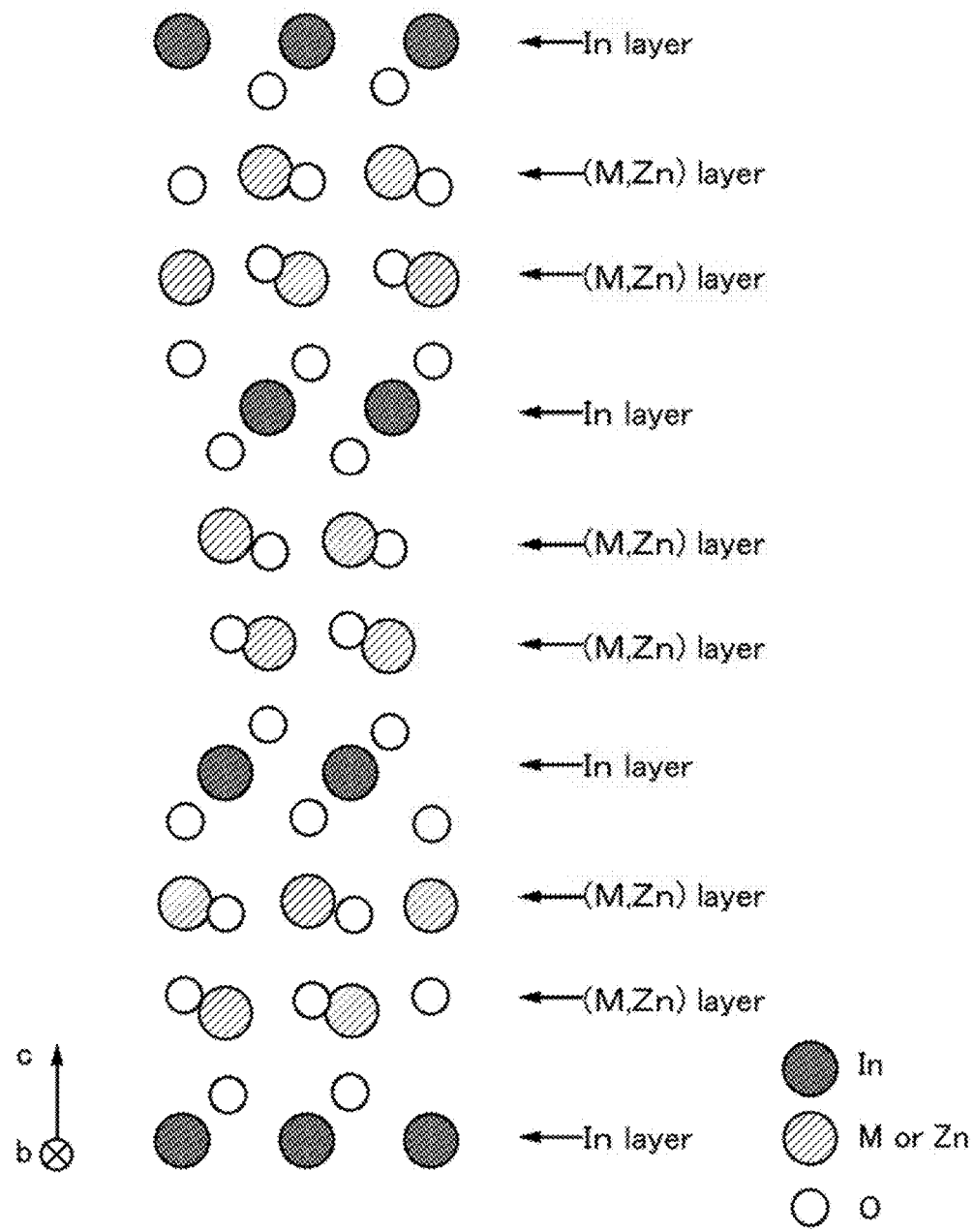
FIG. 24 illustrates a crystal of $InMZnO_4$.

FIG. 24 shows an example of the crystal structure of InMZnO$_4$ whose atomic ratio [In]:[M]:[Zn] is 1:1:1. The crystal structure shown in FIG. 24 is InMZnO$_4$ observed from a direction parallel to a b-axis. Note that a metal element in a layer that contains M, Zn, and oxygen (hereinafter, this layer is referred to as an "(M,Zn) layer") in FIG. 24 represents the element M or zinc. In that case, the proportion of the element M is the same as the proportion of zinc. The element M and zinc can be replaced with each other, and their arrangement is random.

InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 24.

Indium and the element M can be replaced with each other. Thus, when the element M in the (M,Zn) layer is replaced with indium, the layer can also be referred to as an (In,M,Zn) layer. In that case, a layered structure that contains one In layer for every two (In,M,Zn) layers is obtained.

An oxide whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the oxide is crystallized.

Note that in the case where the number of (M,Zn) layers with respect to one In layer is not an integer in the oxide, the oxide might have a plurality of kinds of layered structures where the number of (M,Zn) layers with respect to one In layer is an integer. For example, in the case of [In]:[M]:[Zn]=1:1:1.5, the oxide may have a mix of a layered structure including one In layer for every two (M,Zn) layers and a layered structure including one In layer for every three (M,Zn) layers.

For example, in the case where the oxide is formed with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have high carrier mobility (electron mobility).

In contrast, when the indium content and the zinc content in an oxide become lower, carrier mobility becomes lower. Thus, with atomic ratios of [In]:[M]:[Zn]=0:1:0 and in the vicinity thereof (e.g., a region C in FIG. 23C), insulation performance becomes better.

Accordingly, an oxide in one embodiment of the present invention preferably has an atomic ratio represented by a region A in FIG. 23A. With the atomic ratio, a layered structure with high carrier mobility and a few grain boundaries is easily obtained.

A region B in FIG. 23B represents an atomic ratio of [In]:[M]:[Zn]=4:2:3 to 4:2:4.1 and the vicinity thereof. The vicinity includes an atomic ratio of [In]:[M]:[Zn]=5:3:4. An oxide with an atomic ratio represented by the region B is an excellent oxide that has particularly high crystallinity and high carrier mobility.

In the case where the oxide semiconductor film is an In-M-Zn oxide, it is preferable that the atomic ratio of metal elements of a sputtering target used for forming a film of the In-M-Zn oxide satisfy In≥M and Zn≥M. As the atomic ratio of metal elements in such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, and In:M:Zn=5:1:7 are preferable. Note that the atomic ratio of metal elements in the formed oxide semiconductor film may vary from the above atomic ratio of metal elements in the sputtering target within a range of approximately ±40%. For example, when a sputtering target with an atomic ratio of In to Ga and Zn of 4:2:4.1 is used, an atomic ratio of In to Ga and Zn in the formed oxide semiconductor film may be 4:2:3 or in the neighborhood of 4:2:3.

In this specification and the like, "neighborhood" means a range of ±1, preferably ±0.5 with respect to the proportion of atoms of the metal element M. For example, in the case where the oxide semiconductor film has a composition in the neighborhood of In:Ga:Zn=4:2:3, the proportion of Ga may be greater than or equal to 1 and less than or equal to 3 (1≤Ga≤3) and the proportion of Zn is greater than or equal to 2 and less than or equal to 4 (2≤Zn≤4), preferably the proportion of Ga is greater than or equal to 1.5 and less than or equal to 2.5 (1.5≤Ga≤2.5) and the proportion of Zn is greater than or equal to 2 and less than or equal to 4 (2≤Zn≤4).

A condition where an oxide semiconductor film forms a layered structure is not uniquely determined by an atomic ratio. There is a difference in the degree of difficulty in forming a layered structure among atomic ratios. Even with the same atomic ratio, whether a layered structure is formed or not depends on a formation condition. Thus, the illustrated regions each represent an atomic ratio with which an oxide semiconductor film has a layered structure, and boundaries of the regions A to C are not clear.

<2-2. Carrier Density of Oxide Semiconductor Film>

Next, the carrier density of an oxide semiconductor film will be described below.

Examples of a factor affecting the carrier density of an oxide semiconductor film include oxygen vacancy ($V_O$) and impurities in the oxide semiconductor film.

As the amount of oxygen vacancy in the oxide semiconductor film increases, the density of defect states increases when hydrogen is bonded to the oxygen vacancy (this state is also referred to as $V_OH$). The density of defect states also increases with an increase in the amount of impurity in the oxide semiconductor film. Hence, the carrier density of an oxide semiconductor film can be controlled by controlling the density of defect states in the oxide semiconductor film.

A transistor using the oxide semiconductor film in a channel region will be described below.

The carrier density of the oxide semiconductor film is preferably reduced in order to inhibit the negative shift of the threshold voltage of the transistor or reduce the off-state current of the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor film is lower than $8 \times 10^{15}$ cm$^{-3}$, preferably lower than $1 \times 10^{11}$ cm$^{-3}$, and further preferably lower than $1 \times 10^{10}$ cm$^{-3}$ and is higher than or equal to $1 \times 10^{-9}$ cm$^{-3}$.

In contrast, the carrier density of the oxide semiconductor film is preferably increased in order to improve the on-state current of the transistor or improve the field-effect mobility of the transistor. In order to increase the carrier density of the oxide semiconductor film, the impurity concentration or the density of defect states in the oxide semiconductor film is slightly increased. Alternatively, the bandgap of the oxide semiconductor film is preferably narrowed. For example, an oxide semiconductor film that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor film that has a high electron affinity and thus has a narrow bandgap so as to increase the density of thermally excited electrons (carriers) can be regarded as substantially intrinsic. Note that a transistor using an oxide semiconductor film with higher electron affinity has lower threshold voltage.

The carrier density of a substantially intrinsic oxide semiconductor film is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^{-3}$ and lower than or equal to $5 \times 10^{16}$ cm$^{-3}$, yet further preferably higher than or equal to $1 \times 10^{10}$ cm$^{-3}$ and lower than or equal to $1 \times 10^{16}$ cm$^{-3}$, and yet still preferably higher than or equal to $1 \times 10^{11}$ cm$^{-3}$ and lower than or equal to $1 \times 10^{15}$ cm$^{-3}$.

Figure 25:
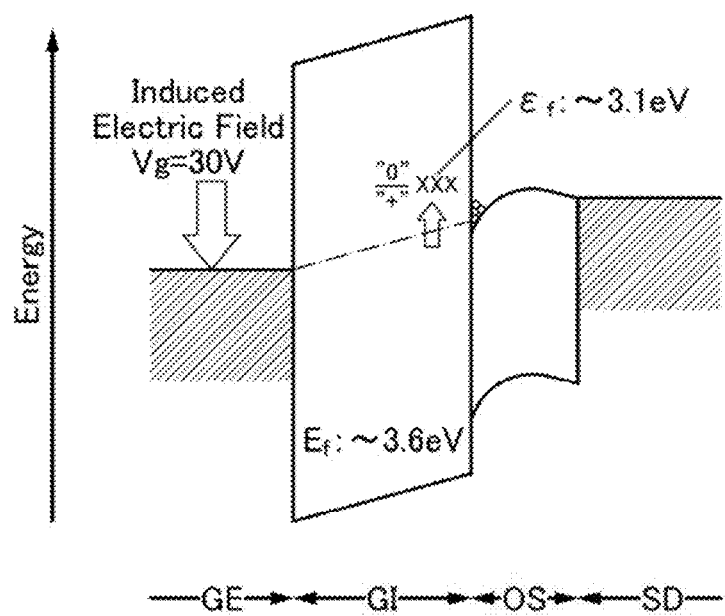
FIG. 25 is an energy band diagram of a transistor including an oxide semiconductor in a channel region.

The use of the substantially intrinsic oxide semiconductor film may improve the reliability of a transistor. Here, the reason for the improvement in the reliability of a transistor which uses the oxide semiconductor film in its channel region is described with reference to FIG. 25. FIG. 25 is an energy band diagram of the transistor which uses the oxide semiconductor film in its channel region.

In FIG. 25, GE, GI, OS, and SD refer to a gate electrode, a gate insulating film, an oxide semiconductor film, and a source/drain electrode, respectively. In other words, FIG. 25 shows an example of energy bands of the gate electrode, the gate insulating film, the oxide semiconductor film, and the source/drain electrode in contact with the oxide semiconductor film.

In FIG. 25, a silicon oxide film and an In—Ga—Zn oxide are used as the gate insulating film and the oxide semiconductor film, respectively. The transition level ($\epsilon f$) of a defect that might be formed in the silicon oxide film is assumed to be formed at a position approximately 3.1 eV away from the conduction band minimum of the gate insulating film. Furthermore, the Fermi level (Ef) of the silicon oxide film at the interface between the oxide semiconductor film and the silicon oxide film when the gate voltage ($V_g$) is 30 V is assumed to be formed at a position approximately 3.6 eV away from the conduction band minimum of the gate insulating film. Note that the Fermi level of the silicon oxide film changes depending on the gate voltage. For example, the Fermi level (Ef) of the silicon oxide film at the interface between the oxide semiconductor film and the silicon oxide film is lowered as the gate voltage is increased. A white circle and x in FIG. 25 represent an electron (carrier) and a defect state in the silicon oxide film, respectively.

As shown in FIG. 25, when thermal excitation of carriers occurs during the application of a gate voltage, the carriers are trapped by the defect states (x in the diagram) and the charge state of each of the defect states is changed from positive ("+") to neutral ("0"). In other words, when the value obtained by adding the thermal excitation energy to the Fermi level ($E_f$) of the silicon oxide film becomes greater than the transition level ($\epsilon_f$) of the defect, the charge state of the defect states in the silicon oxide film is changed from positive to neutral, so that the threshold voltage of the transistor shifts in the positive direction.

When an oxide semiconductor film with a different electron affinity is used, the Fermi level of the interface between the gate insulating film and the oxide semiconductor film might be changed. When an oxide semiconductor film with a higher electron affinity is used, the conduction band minimum of the gate insulating film becomes relatively high at the interface between the gate insulating film and the oxide semiconductor film or in the vicinity of the interface. In that case, the defect state (x in FIG. 25) which might be formed in the gate insulating film also becomes relatively high, so that the energy difference between the Fermi level of the gate insulating film and the Fermi level of the oxide semiconductor film is increased. The increase in energy difference leads to a reduction in the amount of charge trapped in the gate insulating film. For example, a change in the charge state of the defect states which might be formed in the silicon oxide film becomes smaller, so that a change in the threshold voltage of the transistor by gate bias temperature (GBT) stress can be reduced.

Note that when the oxide semiconductor film is used for a channel region of a transistor, carrier scattering or the like at a grain boundary can be reduced; thus, the transistor can have high field-effect mobility. In addition, the transistor can have high reliability.

Charge trapped by the defect states in the oxide semiconductor film takes a long time to be released and may behave like fixed charge. Thus, the transistor in which a channel region is formed in the oxide semiconductor film having a high density of defect states might have unstable electrical characteristics.

To obtain stable electrical characteristics of the transistor, it is effective to reduce the concentration of impurities in the oxide semiconductor film. In order to reduce the concentration of impurities in the oxide semiconductor film, the concentration of impurities in a film which is adjacent to the oxide semiconductor film is preferably reduced. As examples of the impurities, hydrogen, nitrogen, alkali metal, alkaline earth metal, iron, nickel, silicon, and the like are given.

Here, the influence of impurities in the oxide semiconductor film is described.

When silicon or carbon that is one of Group 14 elements is contained in the oxide semiconductor film, defect states are formed. Thus, the concentration of silicon or carbon in the oxide semiconductor film and around an interface with the oxide semiconductor film (measured by secondary ion mass spectrometry (SIMS)) is set lower than or equal to $2 \times 10^{18}$ atoms/cm$^3$, and preferably lower than or equal to $2 \times 10^{17}$ atoms/cm$^3$.

When the oxide semiconductor film contains alkali metal or alkaline earth metal, defect states are formed and carriers are generated, in some cases. Thus, a transistor including an oxide semiconductor film that contains alkali metal or alkaline earth metal is likely to be normally-on. Therefore, it is preferable to reduce the concentration of alkali metal or alkaline earth metal in the oxide semiconductor film. Specifically, the concentration of alkali metal or alkaline earth metal in the oxide semiconductor film measured by SIMS is set lower than or equal to $1 \times 10^{18}$ atoms/cm$^3$, and preferably lower than or equal to $2 \times 10^{16}$ atoms/cm$^3$.

Hydrogen contained in an oxide semiconductor film reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally-on. Accordingly, it is preferable that hydrogen in the oxide semiconductor film be reduced as much as possible. Specifically, the hydrogen concentration of the oxide semiconductor film measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide semiconductor film with sufficiently reduced impurity concentration is used for a channel formation region in a transistor, the transistor can have stable electrical characteristics.

The energy gap of the oxide semiconductor film is preferably 2 eV or more or 2.5 eV or more.

The thickness of the oxide semiconductor film is greater than or equal to 3 nm and less than or equal to 200 nm, preferably greater than or equal to 3 nm and less than or equal to 100 nm, further preferably greater than or equal to 3 nm and less than or equal to 60 nm.

<2-3. Structure of Oxide Semiconductor>

Next, a structure of an oxide semiconductor is described.

An oxide semiconductor is classified into a single-crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single-crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

[CAAC-OS]

First, a CAAC-OS is described.

A CAAC-OS is one of oxide semiconductors and has a plurality of c-axis aligned crystal parts (also referred to as pellets).

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (e.g., silicon) having stronger bonding force to oxygen than a metal element constituting a part of an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

[nc-OS]

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

The nc-OS is an oxide semiconductor that has higher regularity than an amorphous oxide semiconductor. Thus, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS in some cases.

[a-Like OS]

An a-like OS has a structure between the structure of an nc-OS and the structure of an amorphous oxide semiconductor.

The a-like OS contains a void or a low-density region. The a-like OS has an unstable structure because it contains a void.

The a-like OS has a lower density than the nc-OS and the CAAC-OS because it contains a void. Specifically, the density of the a-like OS is higher than or equal to 78.6% and lower than 92.3% of the density of the single-crystal oxide semiconductor having the same composition. The density of the nc-OS and the density of the CAAC-OS are each higher than or equal to 92.3% and lower than 100% of the density of the single-crystal oxide semiconductor having the same composition. It is difficult to deposit an oxide semiconductor having a density lower than 78% of the density of the single-crystal oxide semiconductor.

For example, in the case of an oxide semiconductor whose atomic ratio of In to Ga and Zn is 1:1:1, the density of single-crystal InGaZnO$_4$ with a rhombohedral crystal structure is 6.357 g/cm$^3$. Accordingly, in the case of the oxide semiconductor whose atomic ratio of In to Ga and Zn is 1:1:1, the density of the a-like OS is higher than or equal to 5.0 g/cm$^3$ and lower than 5.9 g/cm$^3$, for example. In the case of the oxide semiconductor whose atomic ratio of In to Ga and Zn is 1:1:1, the density of the nc-OS and the density of the CAAC-OS are each higher than or equal to 5.9 g/cm$^3$ and lower than 6.3 g/cm$^3$, for example.

In the case where an oxide semiconductor having a certain composition does not exist in a single-crystal state, single-crystal oxide semiconductors with different compositions are combined at an adequate ratio, which makes it possible to calculate a density equivalent to that of a single-crystal oxide semiconductor with the desired composition. The density of a single-crystal oxide semiconductor having the desired composition may be calculated using a weighted average with respect to the combination ratio of the single-crystal oxide semiconductors with different compositions. Note that it is preferable to use as few kinds of single-crystal oxide semiconductors as possible to calculate the density.

As described above, oxide semiconductors have various structures and various properties. In the oxide semiconductor film of one embodiment of the present invention, two or more of an amorphous oxide semiconductor, an a-like OS, an nc-OS, and a CAAC-OS may be mixed. An example of such a case is described below.

The oxide semiconductor film of one embodiment of the present invention can include two kinds of crystal parts. That is, two kinds of crystal parts are mixed in the oxide semiconductor film. One is a crystal part (also referred to as a first crystal part) having orientation in the thickness direction (also referred to as a film-plane direction, or a direction perpendicular to a formation surface or a film surface), i.e., a crystal part having c-axis alignment. The other is a crystal part (also referred to as a second crystal part) which does not have c-axis alignment and has random orientation.

Although crystal parts are divided into the two categories for simplicity: the first crystal part having c-axis alignment and the second crystal part having no c-axis alignment, the first crystal part and the second crystal part cannot be distinguished from each other in some cases because there is not much difference in crystallinity, crystal size, and the like. That is, the oxide semiconductor film of one embodiment of the present invention can be described without a distinction between the first crystal part and the second crystal part.

For example, the oxide semiconductor film of one embodiment of the present invention includes a plurality of crystal parts, and at least one of the crystal parts may have c-axis alignment. Furthermore, in the crystal parts existing in the film, the proportion of crystal parts having no c-axis alignment may be higher than that of crystal parts having c-axis alignment. For example, in a transmission electron microscope image of a cross section of the oxide semiconductor film which is one embodiment of the present invention in the thickness direction, a plurality of crystal parts are observed and the second crystal parts having no c-axis alignment are observed at a higher proportion than the first crystal parts having c-axis alignment in some cases. In other words, the oxide semiconductor film of one embodiment of the present invention has a high proportion of second crystal parts having no c-axis alignment.

When the oxide semiconductor film has a high proportion of second crystal parts having no c-axis alignment, the following effects can be obtained.

In the case where a source which supplies sufficient oxygen is provided in the vicinity of the oxide semiconductor film, the second crystal part having no c-axis alignment can serve as an oxygen diffusion path. Thus, in the case where a source which supplies sufficient oxygen is provided in the vicinity of the oxide semiconductor film, oxygen can be supplied from the source to the first crystal part having c-axis alignment through the second crystal part having no c-axis alignment. Accordingly, the amount of oxygen vacancy in the oxide semiconductor film can be reduced. When such an oxide semiconductor film is used as a semiconductor film of a transistor, high reliability and high field-effect mobility can be obtained.

In the first crystal part, particular crystal planes are aligned in the thickness direction. Accordingly, when an X-ray diffraction (XRD) measurement is performed in a direction substantially perpendicular to the top surface of the oxide semiconductor film including the first crystal parts, a diffraction peak derived from the first crystal parts is observed at a predetermined diffraction angle (2θ). However, even when the oxide semiconductor film includes the first crystal parts, a diffraction peak is not sufficiently observed in some cases because of x-rays scattering or increase in background due to a support substrate. Note that the higher the proportion of the first crystal parts in the oxide semiconductor film is, the higher the diffraction peak becomes; thus, the height (intensity) of the diffraction peak can be an indicator of crystallinity of the oxide semiconductor film.

As an example of a method for evaluating crystallinity of the oxide semiconductor film, electron diffraction can be given. For example, in the case where an electron diffraction measurement is performed on a cross section of the oxide semiconductor film of one embodiment of the present invention and an electron diffraction pattern thereof is observed, first regions including diffraction spots derived from the first crystal parts and second regions including diffraction spots derived from the second crystal parts are observed.

The first regions including diffraction spots derived from the first crystal parts are derived from crystal parts having c-axis alignment. The second regions including diffraction spots derived from the second crystal parts are derived from crystal parts having no orientation or crystal parts having random orientation. Therefore, different patterns are observed in accordance with the diameter of an electron beam, i.e., the area of an observed region in some cases. Note that in this specification and the like, electron diffraction with an electron beam having a diameter of 1 nmφ to 100 nmφ inclusive is referred to as nanobeam electron diffraction (NBED).

Note that the crystallinity of the oxide semiconductor film of one embodiment of the present invention may be evaluated by a method different from NBED. As examples of a method for evaluating crystallinity of the oxide semiconductor film, electron diffraction, x-ray diffraction, neutron diffraction, and the like can be given. Among the electron diffractions, transmission electron microscopy (TEM), scanning electron microscopy (SEM), convergent beam electron diffraction (CBED), selected-area electron diffraction (SAED), and the like can be favorably used in addition to the above NBED.

In NBED, a ring-like pattern is observed in a nanobeam electron diffraction pattern obtained by using an electron beam having a large diameter (e.g., greater than or equal to 25 nmφ and less than or equal to 100 nmφ, or greater than or equal to 50 nmφ and less than or equal to 100 nmφ). The ring-like pattern has luminance distribution in a radial direction in some cases. On the other hand, in an electron diffraction pattern of NBED obtained by using an electron beam having a sufficiently small diameter (e.g., greater than or equal to 1 nmφ and less than or equal to 10 nmφ), a plurality of spots distributed in a circumferential direction (also referred to as θ direction) are observed at the position of the ring-like pattern. That is, the ring-like pattern obtained by using an electron beam having a large diameter is formed from an aggregate of the plurality of spots.

<2-4. Evaluation of Crystallinity of Oxide Semiconductor Film>

Three samples (Samples X1 to X3) each including an oxide semiconductor film were fabricated and the crystallinity of each of the samples was evaluated. Three kinds of oxide semiconductor films were formed in different conditions. First, methods for fabricating Samples X1 to X3 are described.

[Sample X1]

Sample X1 is a sample in which an approximately 100-nm-thick oxide semiconductor film is formed over a glass substrate. The oxide semiconductor film contains indium, gallium, and zinc. The oxide semiconductor film used for Sample X1 was formed under the following conditions: the substrate temperature was 170° C.; an argon gas with a flow rate of 140 sccm and an oxygen gas with a flow rate of 60 sccm were introduced into a chamber of the sputtering apparatus; the pressure was set to 0.6 Pa; and an AC power of 2.5 kW was applied to a metal oxide target containing indium, gallium, and zinc (with an atomic ratio of In:Ga:Zn=4:2:4.1). Note that the oxygen flow rate percentage under the formation conditions for Sample X1 was 30%.

[Sample X2]

Sample X2 is a sample in which an approximately 100-nm-thick oxide semiconductor film is formed over a glass substrate. The oxide semiconductor film used for Sample X2 was formed under the following conditions: the substrate temperature was 130° C.; and an argon gas with a flow rate of 180 sccm and an oxygen gas with a flow rate of 20 sccm were introduced into a chamber of the sputtering apparatus. The oxygen flow rate percentage under the formation conditions for Sample X2 was 10%. Note that the conditions other than the substrate temperature and the oxygen flow rate percentage are the same as those for Sample X1.

[Sample X3]

Sample X3 is a sample in which an approximately 100-nm-thick oxide semiconductor film is formed over a glass substrate. The oxide semiconductor film used for Sample X3 was formed under the following conditions: the substrate temperature was room temperature (R.T.); an argon gas with a flow rate of 180 sccm and an oxygen gas with a flow rate of 20 sccm were introduced into a chamber of the sputtering apparatus. The oxygen flow rate percentage under the formation conditions for Sample X3 was 10%. Note that the conditions other than the substrate temperature and the oxygen flow rate percentage are the same as those for Sample X1.

The conditions for forming Samples X1 to X3 are shown in Table 2.

TABLE 2

| | Target [atomic ratio] | Substrate temperature [° C.] | Pressure [Pa] | Oxygen flow rate percentage [%] |
|---|---|---|---|---|
| Sample X1 | In:Ga:Zn = 4:2:4.1 | 170 | 0.6 | 30 |
| Sample X2 | In:Ga:Zn = 4:2:4.1 | 130 | 0.6 | 10 |
| Sample X3 | In:Ga:Zn = 4:2:4.1 | R.T. | 0.6 | 10 |

Next, the crystallinity of Samples X1 to X3 was evaluated. In this embodiment, cross-sectional TEM observation, XRD measurement, and electron diffraction were performed to evaluate crystallinity.

[Cross-Sectional TEM Observation]

Figure 26A:
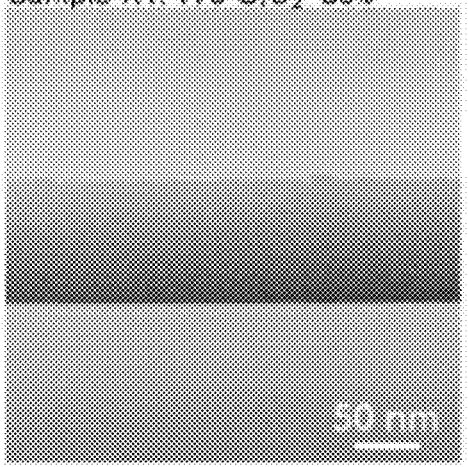
FIGS. 26A to 26C are cross-sectional TEM images and a cross-sectional HR-TEM image of an oxide semiconductor film.
Figure 26B:
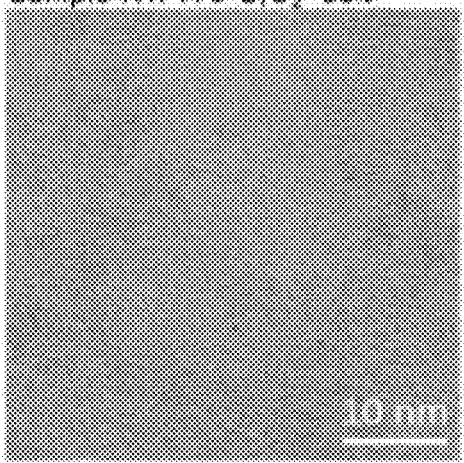
Figure 26C:
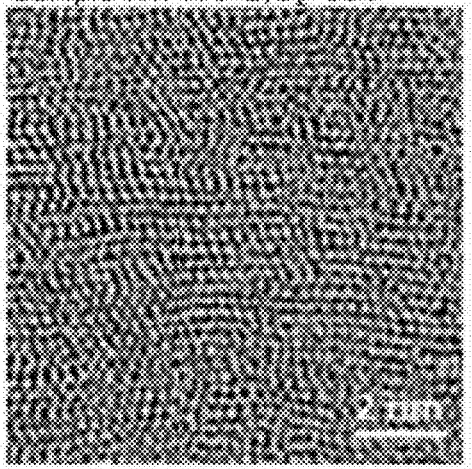
Figure 27A:
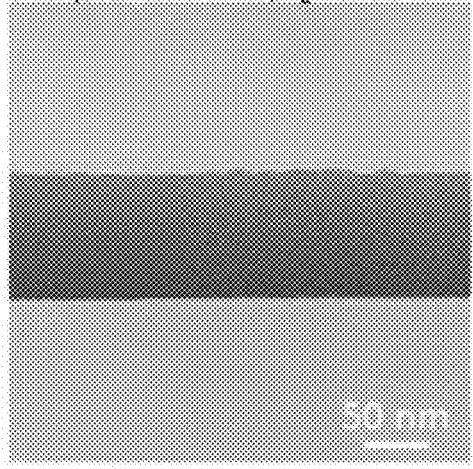
FIGS. 27A to 27C are cross-sectional TEM images and a cross-sectional HR-TEM image of an oxide semiconductor film.
Figure 27B:
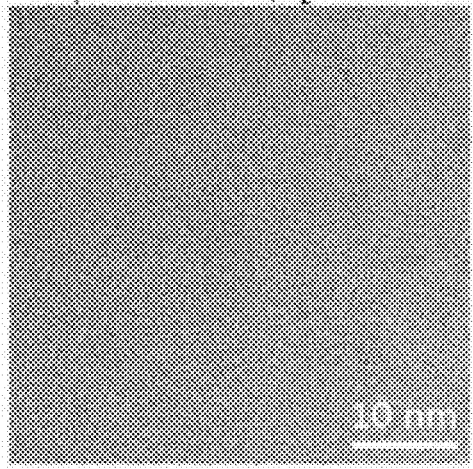
Figure 27C:
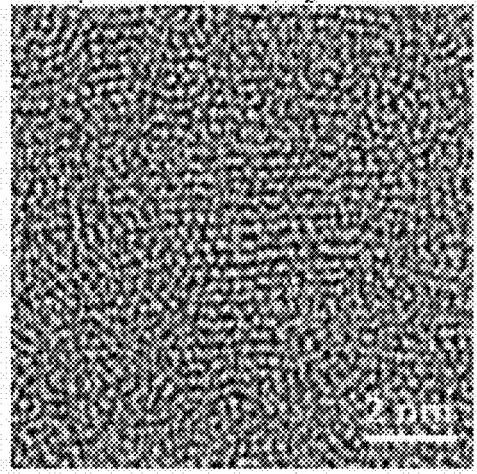
Figure 28A:
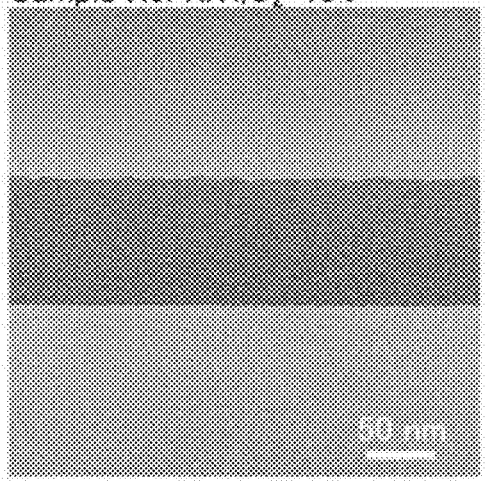
FIGS. 28A to 28C are cross-sectional TEM images and a cross-sectional HR-TEM image of an oxide semiconductor film.
Figure 28B:
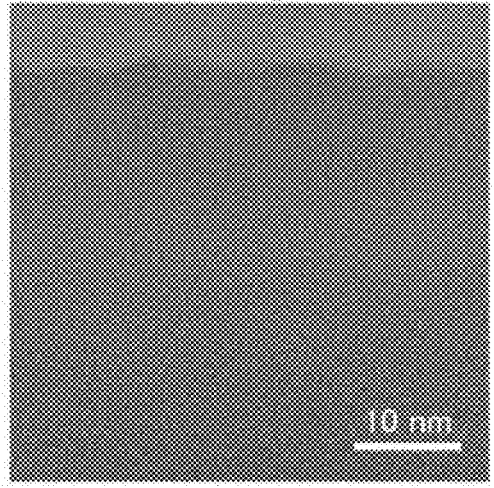

FIGS. 26A to 26C, FIGS. 27A to 27C, and FIGS. 28A to 28C show cross-sectional TEM observation results of Samples X1 to X3. FIGS. 26A and 26B are cross-sectional TEM images of Sample X1. FIGS. 27A and 27B are cross-sectional TEM images of Sample X2. FIGS. 28A and 28B are cross-sectional TEM images of Sample X3.

Figure 28C:
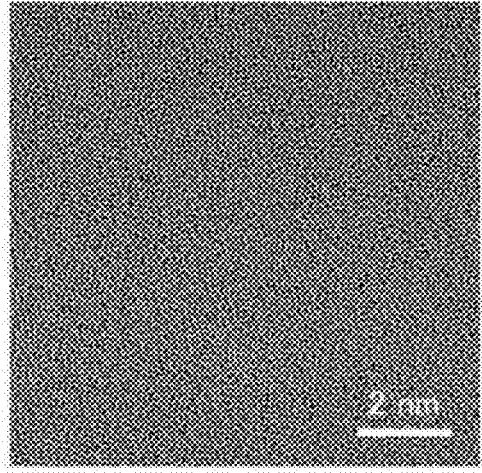

FIG. 26C, FIG. 27C, and FIG. 28C are cross-sectional high resolution transmission electron microscope (HR-TEM) images of Sample X1, Sample X2, and Sample X3, respectively. The cross-sectional HR-TEM images may be obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

As shown in FIGS. 26A to 26C and FIGS. 27A to 27C, crystal parts in which atoms are aligned in a layered manner in the thickness direction are observed in Sample X1 and Sample X2. In particular, in HR-TEM images, crystal parts in which atoms are aligned in a layered manner are easily observed. As shown in FIGS. 28A to 28C, the state where atoms are aligned in a layered manner in the thickness direction is unlikely to be observed in Sample X3.

[XRD Measurement]

Next, XRD measurement results of the samples will be described.

Figure 29A:
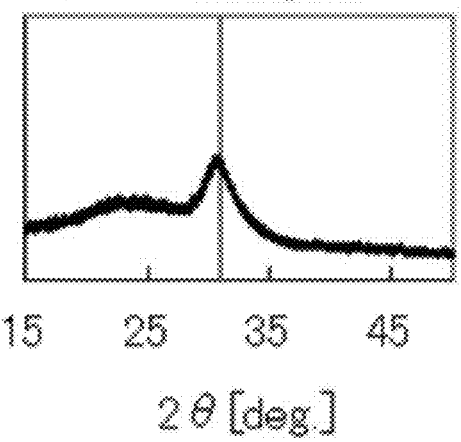
FIGS. 29A to 29C show XRD measurement results and electron diffraction patterns of an oxide semiconductor film.
Figure 30A:
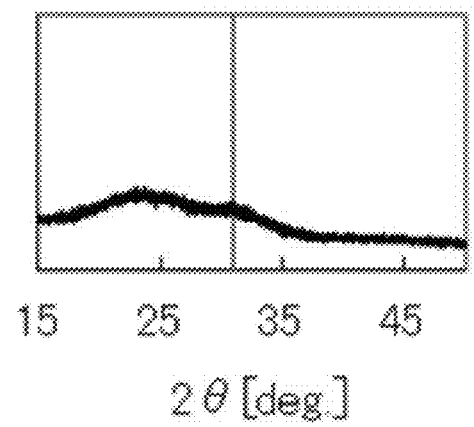
FIGS. 30A to 30C show XRD measurement results and electron diffraction patterns of an oxide semiconductor film.
Figure 31A:
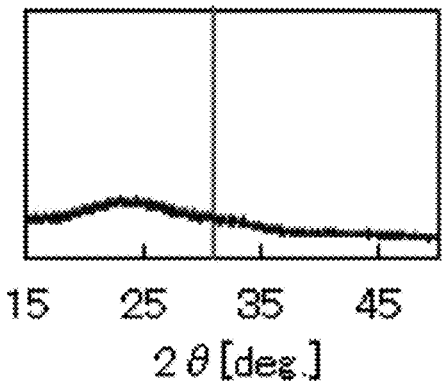
FIGS. 31A to 31C show XRD measurement results and electron diffraction patterns of an oxide semiconductor film.

FIG. 29A, FIG. 30A, and FIG. 31A show XRD measurement results of Sample X1, Sample X2, and Sample X3, respectively.

The XRD measurement was conducted by a powder method (also referred to as a θ-2θ method) which is a kind of an out-of-plane method. Note that in a θ-2θ method, X-ray diffraction intensity is measured while an incident angle of an X-ray is changed and the angle of a detector facing an X-ray source is equal to the incident angle. Note that a grazing-incidence XRD (GIXRD) method (also referred to as a thin film method or a Seemann-Bohlin method) may be used. The GIXRD method is a kind of an out-of-plane method for measuring X-ray diffraction intensity in which X-ray is incident at an angle approximately 0.40° from a film surface with use of a variable-angle detector. In FIG. 29A, FIG. 30A, and FIG. 31A, the vertical axis represents diffraction intensity in arbitrary unit and the horizontal axis represents the angle 2θ.

As shown in FIG. 29A and FIG. 30A, a peak of diffraction intensity is observed at around 2θ=31° in each of Sample X1 and Sample X2. In contrast, as shown in FIG. 31A, in Sample X3, a peak of diffraction intensity at around 2θ=31° is unlikely to be observed. Alternatively, a peak of diffraction intensity at around 2θ=31° is extremely small or does not exist.

The diffraction angle (at around 2θ=31°) at which the peak of the diffraction intensity was observed corresponds to a diffraction angle on the (009) plane of the structure model of single crystal InGaZnO$_4$. Accordingly, the above peaks indicate that each of Samples X1 and X2 includes a crystal part where the c-axes are aligned in the thickness direction (hereinafter also referred to as a crystal part having c-axis alignment or a first crystal part). Note that it is difficult to determine, by XRD measurement, whether a crystal part having c-axis alignment is included in Sample X3.

[Electron Diffraction]

Next, electron diffraction measurement results of Samples X1 to X3 are described below. In the electron diffraction measurement, an electron diffraction pattern was obtained in such a manner that each of the samples is irradiated with an electron beam incident in a direction perpendicular to its cross section. The electron-beam diameters were set to 1 nmφ and 100 nmφ.

In electron diffraction, as the diameter of an incident electron beam is larger and the thickness of sample is larger, information of the sample in the depth direction is likely to be shown in the electron diffraction pattern. Therefore, the information of local regions can be obtained by reducing not only the diameter of the electron beam but also the thickness of the sample in the depth direction. In contrast, when the thickness of the sample in the depth direction is too small (e.g., the thickness of the sample in the depth direction is less than or equal to 5 nm), information of only submicroscopic region is obtained. Thus, an electron diffraction pattern obtained when a crystal exists in the submicroscopic region is similar to an electron diffraction pattern of a single crystal in some cases. When the aim is not to analyze the submicroscopic region, the thickness of the sample in the depth direction is preferably greater than or equal to 10 nm and less than or equal to 100 nm, typically greater than or equal to 10 nm and less than or equal to 50 nm.

Figure 29B:
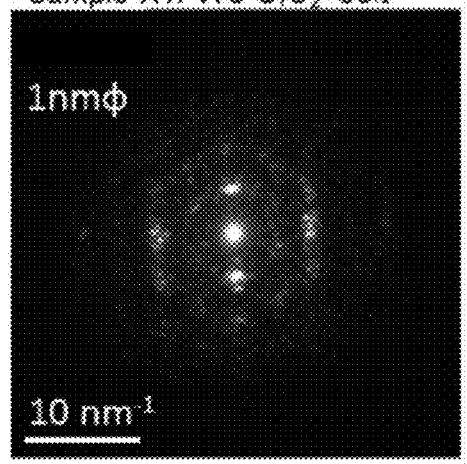
Figure 29C:
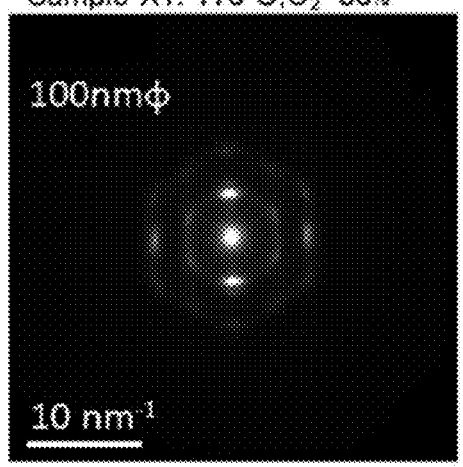
Figure 30B:
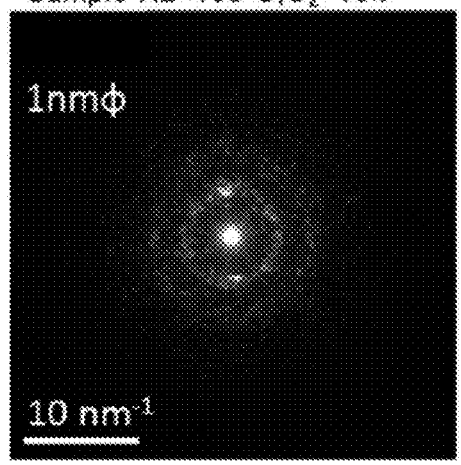
Figure 30C:
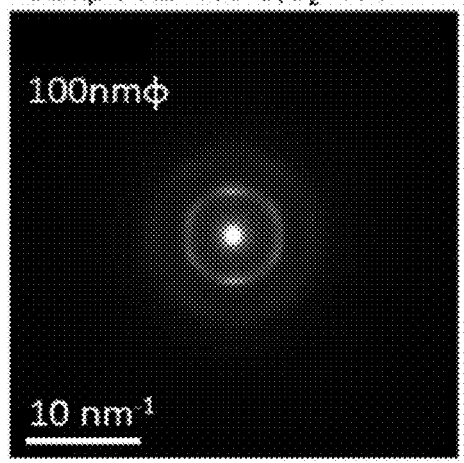
Figure 31B:
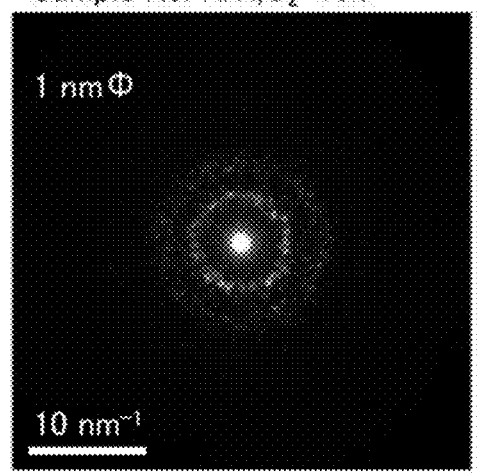
Figure 31C:
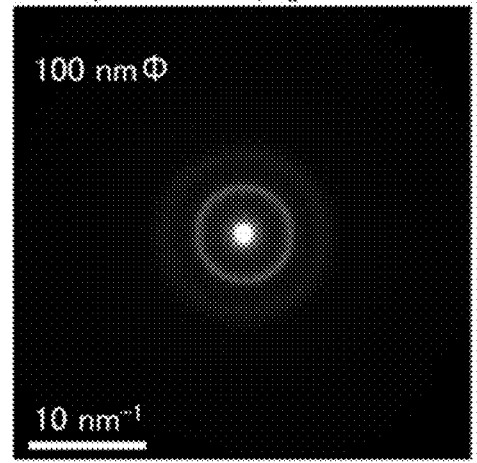

FIGS. 29B and 29C show electron diffraction patterns of Sample X1. FIGS. 30B and 30C show electron diffraction patterns of Sample X2. FIGS. 31B and 31C show electron diffraction patterns of Sample X3.

The contrast of the electron diffraction patterns shown in FIGS. 29B and 29C, FIGS. 30B and 30C, and FIGS. 31B and 31C is adjusted for clarity. In FIGS. 29B and 29C, FIGS. 30B and 30C, and FIGS. 31B and 31C, the brightest luminescent spot at the center of the pattern is derived from the incident electron beam and is the center of the electron diffraction pattern (also referred to as a direct spot or a transmitted wave).

As shown in FIG. 29B, when the diameter of the incident electron beam is set to 1 nmφ, a plurality of spots circumferentially distributed can be observed. This indicates that the oxide semiconductor film contains a plurality of submicroscopic crystal parts having random surface orientation. As shown in FIG. 29C, when the diameter of the incident electron beam is set to 100 nmφ, the luminances of a sequence of a plurality of diffraction spots derived from these plurality of crystal parts are averaged to be a ring-like diffraction pattern. Two ring-like diffraction patterns with different radii are observed in FIG. 29C. The rings are referred to as a first ring and a second ring in ascending order of radius. It is observed that the luminance of the first ring is higher than that of the second ring. In addition, two spots (referred to as first regions) with high luminance are observed at a position overlapping with the first ring.

The distance from the center to the first ring in a radial direction substantially corresponds to the distance from the center to a diffraction spot on the (009) plane of the structure model of single crystal InGaZnO$_4$ in a radical direction. The first regions are diffraction spots derived from c-axis alignment.

As shown in FIG. 29C, the observations of the ring-like diffraction patterns indicate that crystal parts having random orientation (hereinafter also referred to as crystal parts having no c-axis alignment or second crystal parts) exist in the oxide semiconductor film.

In addition, two first regions are presumed to have two-hold symmetry because the regions are disposed symmetrically with respect to the center point of the electron diffraction pattern and the luminances of the regions are substantially equal to each other. As described above, since the two first regions are diffraction spots which are derived from the c-axis alignment, the orientation of a straight line which passes through the two first regions and the center is aligned with that of the c-axis of the crystal part. The thickness direction is the vertical direction of FIG. 29C, which suggests the presence of crystal part in which the c-axis is aligned in the thickness direction in the oxide semiconductor film.

As described above, the oxide semiconductor film of Sample X1 is confirmed to be a film including both crystal parts having c-axis alignment and crystal parts having no c-axis alignment.

The results of the electron diffraction patterns shown in FIGS. 30B and 30C and FIGS. 31B and 31C are substantially the same as those of the electron diffraction patterns shown in FIGS. 29B and 29C. The luminance of the two spots (first regions) derived from c-axis alignment is high in the order of Sample X1, Sample X2 and Sample X3. This indicates that the proportion of crystal parts having c-axis alignment is high in that order.

[Quantification Method of Crystallinity of Oxide Semiconductor Film]

Next, an example of a quantification method of crystallinity of an oxide semiconductor film is described with reference to FIGS. 32A and 32B, FIG. 33, and FIG. 34.

Figure 32A:
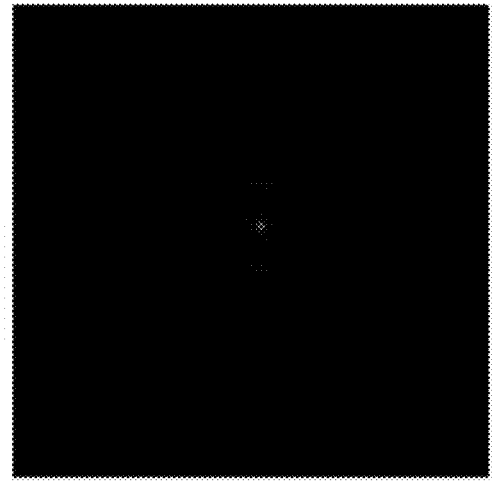
FIGS. 32A and 32B show an electron diffraction pattern.

First, an electron diffraction pattern is prepared (see FIG. 32A).

Figure 32B:
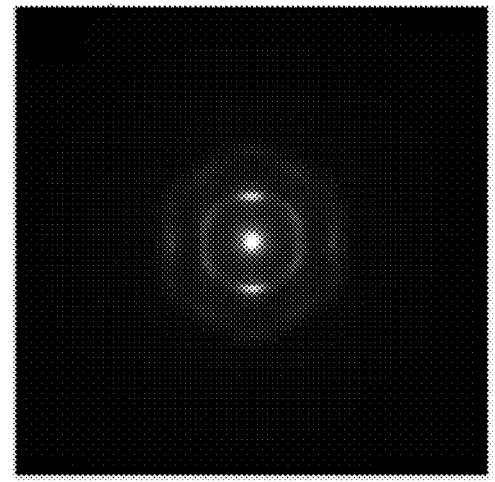

FIG. 32A shows an electron diffraction pattern obtained by measuring a 100-nm-thick oxide semiconductor film using an electron beam with a diameter of 100 nmφ. FIG. 32B shows an electron diffraction pattern obtained by adjusting contrast of the electron diffraction pattern shown in FIG. 32A.

In FIG. 32B, two clear spots (first regions) are observed over and under a direct spot. The two spots (first regions) are derived from diffraction spots corresponding to (001) in a structure model of InGaZnO$_4$, that is, crystal parts having c-axis alignment. In addition to the first regions, a ring-like pattern (second regions) with a low luminance positioned on an approximately concentric circle of the first region is observed. The ring-like pattern is obtained when the luminances of spots derived from structures of crystal parts having no c-axis alignment (second crystal parts) are averaged by using the electron beam with a diameter of 100 nmφ.

Here, in the electron diffraction pattern, the first regions including diffraction spots derived from the crystal parts having c-axis alignment and the second regions including diffraction spots derived from the second crystal parts are observed to overlap with each other. Thus, a line profile including the first regions and line profiles including the second regions are obtained and compared with each other, whereby the crystallinity of the oxide semiconductor film can be quantified.

The line profile including the first regions and the line profiles including the second regions are described with reference to FIG. 33.

Figure 33:
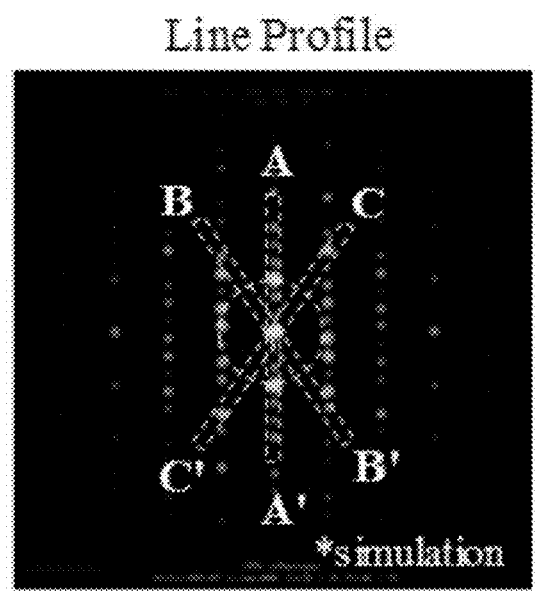
FIG. 33 shows line profiles of an electron diffraction pattern.

FIG. 33 shows a simulation pattern of electron diffraction that is obtained when an electron beam is emitted to the (100) plane of the structure model of $InGaZnO_4$. In the simulation pattern, auxiliary lines of a region A-A', a region B-B', and a region C-C' are drawn.

The region A-A' in FIG. 33 includes a straight line passing through two diffraction spots derived from the first crystal parts having c-axis alignment and a direct spot. The regions B-B' and C-C' in FIG. 33 each include a straight line passing through regions where no diffraction spot derived from the first crystal part having c-axis alignment is observed and a direct spot. An angle between the region A-A' and the region B-B' or C-C' is approximately 34°, specifically, larger than or equal to 30° and smaller than or equal to 38°, preferably larger than or equal to 32° and smaller than or equal to 36°, further preferably larger than or equal to 33° and smaller than or equal to 35°.

The line profiles have the tendencies shown in FIG. 34 in accordance with the structure of the oxide semiconductor film. FIG. 34 shows image diagrams of line profiles, relative luminance R, and a half width (FWHM: full width at half maximum) of a spectrum derived from c-axis alignment that is obtained from an electron diffraction pattern of each structure.

Relative luminance R in FIG. 34 is obtained by dividing the integrated intensity of luminance of the region A-A' by the integrated intensity of luminance of the region B-B' or the integrated intensity of luminance of the region C-C'. Note that the integrated intensity of luminance of each of the regions A-A', B-B', and C-C' is obtained by removing the luminance of background derived from the direct spot which appears at the center.

When the relative luminance R is calculated, the intensity of c-axis alignment can be quantitatively defined. For example, as shown in FIG. 34, in a single-crystal oxide semiconductor film, the peak intensity of diffraction spots derived from the first crystal parts having c-axis alignment in the region A-A' is high and there is no diffraction spot derived from the first crystal part having c-axis alignment in the regions B-B' and C-C'; thus, the relative luminance R is much larger than 1. The relative luminance R decreases in the order of single crystal, only CAAC (details of CAAC will be described later), CAAC+nanocrystal, nanocrystal, and amorphous. In particular, in nanocrystal and amorphous, which have no particular orientation, the relative luminance R is equal to 1.

As the periodicity of the crystal is higher, the intensity of the spectrum derived from the first crystal part having c-axis alignment becomes high and the half width of the spectrum becomes small. Thus, the half width of single crystal is the smallest, and the half width is increased in the order of only CAAC, CAAC+nanocrystal, and nanocrystal. The half width of amorphous is extremely large and the profile thereof is called a "halo".

[Analysis Using Line Profile]

As described above, the ratio of the integrated intensity of luminance of the first regions to the integrated intensity of luminance of the second regions is important information to presume the proportion of crystal parts having orientation.

Then, from electron diffraction patterns of Samples X1 to X3 that are described above, analysis with line profiles was performed.

FIGS. 35A1 and 35A2 show results of analysis with line profiles of Sample X1. FIGS. 35B1 and 35B2 show results of analysis with line profiles of Sample X2. FIGS. 35C1 and 35C2 show results of analysis with line profiles of Sample X3.

FIG. 35A1 shows the electron diffraction pattern in FIG. 29C in which the regions A-A', B-B', and C-C' are drawn. FIG. 35B1 shows the electron diffraction pattern in FIG. 30C in which the regions A-A', B-B', and C-C' are drawn. FIG. 35C1 shows the electron diffraction pattern in FIG. 31C in which the regions A-A', B-B', and C-C' are drawn.

The regions A-A', B-B', and C-C' can each be obtained by normalizing line profiles using the luminance of the direct spot as a reference. Note that the direct spot appears at the center of an electron diffraction pattern. With the regions, Samples X1 to X3 can be relatively compared.

When the profile of the luminance is calculated, a component of the luminance derived from inelastic scatterings and the like from Sample is subtracted as the background, in which case comparison with higher accuracy can be performed. Because the component of the luminance derived from inelastic scatterings shows an extremely broad profile in a radial direction, the luminance of the background may be obtained by a linear approximation. For example, a straight line is drawn along the tails of a target peak, and a region positioned on the luminance side lower than the straight line can be subtracted as the background.

Here, the integrated intensity of the luminance of each of the regions A-A', B-B', and C-C' is calculated from data in which the background is subtracted by the method described above. Then, the relative luminance R is obtained by dividing the integrated intensity of the luminance of the region A-A' by the integrated intensity of the luminance of the region B-B' or the integrated intensity of the luminance of the region C-C'.

Figure 36:
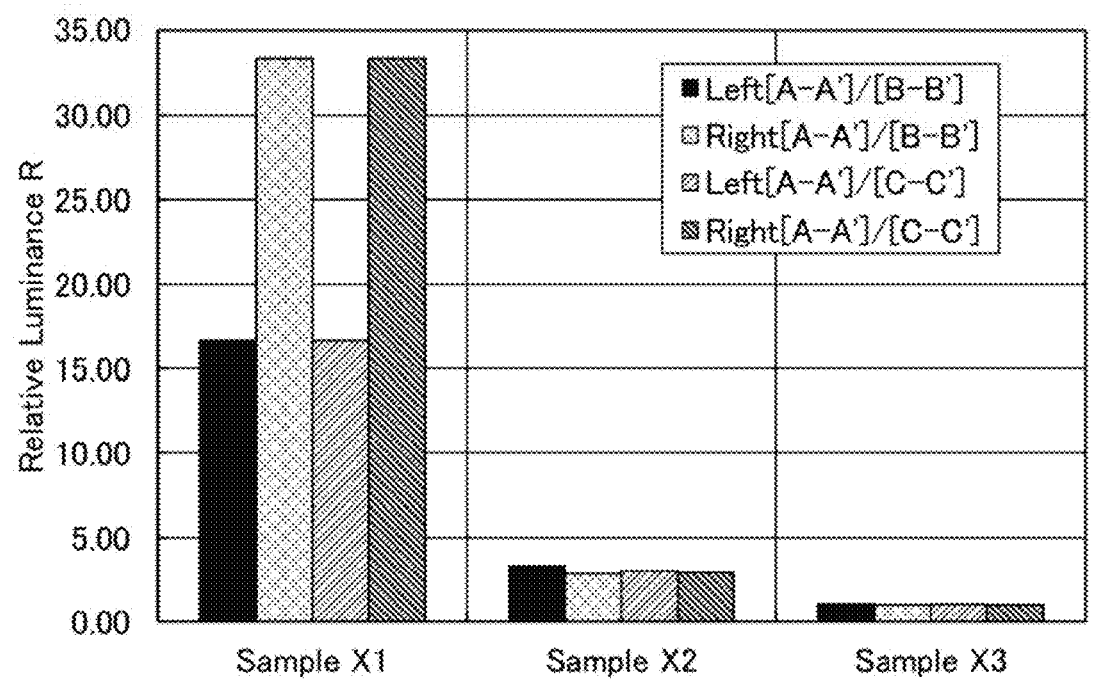
FIG. 36 shows relative luminance estimated from electron diffraction patterns of oxide semiconductor films.

FIG. 36 shows the relative luminance R of Samples X1 to X3. In FIG. 36, in a spectrum on the left side and the right side of the direct spot in the profiles of the luminance in each of FIGS. 35A2, 35B2, and 35C2, a value obtained by dividing the integrated intensity of the luminance of the region A-A' by the integrated intensity of the luminance of the region B-B' and a value obtained by dividing the integrated intensity of the luminance of the region A-A' by the integrated intensity of the luminance of the region C-C' are calculated.

As shown in FIG. 36, the relative luminance of Samples X1 to X3 is as follows. The relative luminance R of Sample X1 is 25.00. The relative luminance R of Sample X2 is 3.04. The relative luminance R of Sample X3 is 1.05. Note that the relative luminance R is an average value of relative luminances at four points. As described above, the relative luminance R is high in the order of Sample X1, Sample X2, and Sample X3.

When the oxide semiconductor film of one embodiment of the present invention is used as a semiconductor film in which a channel of a transistor is formed, the relative luminance R is preferably greater than 1 and less than or equal to 40, further preferably greater than 1 and less than or equal to 10, still further preferably greater than 1 and less than or equal to 3. With use of such an oxide semiconductor film as a semiconductor film, both high stability of electrical characteristics and high field-effect mobility in a low-gate-voltage region can be achieved.

<2-5. Proportion of Crystal Part>

The proportion of crystal parts in an oxide semiconductor film can be estimated by analyzing its cross-sectional TEM image.

A method for analyzing the image is described. An image is analyzed as follows. First, a high-resolution TEM image is subjected to two-dimensional fast Fourier transform (FFT), whereby an FFT image is obtained. The obtained FFT image is subjected to a mask processing so that a region other than a region having a periodic structure is removed. After the mask processing, the FFT image is subjected to two-dimensional inverse fast Fourier transform (IFFT), whereby an FFT filtering image is obtained.

In this manner, a real-space image in which only crystal parts are extracted can be obtained. Then, the proportion of crystal parts can be estimated from the proportion of area of the remaining image. Moreover, the proportion of area other than the crystal parts can be estimated by subtracting the remaining region from the area of the region used for calculation (also referred to as the area of the original image).

FIG. 37A1 shows a cross-sectional TEM image of Sample X1. FIG. 37A2 shows an image obtained through the analysis of the cross-sectional TEM image of Sample X1. FIG. 37B1 shows a cross-sectional TEM image of Sample X2. FIG. 37B2 shows an image obtained through the analysis of the cross-sectional TEM image of Sample X2. FIG. 37C1 shows a cross-sectional TEM image of Sample X3. FIG. 37C2 shows an image obtained through the analysis of the cross-sectional TEM image of Sample X3.

White regions in the oxide semiconductor film in the images obtained through the analysis correspond to regions including crystal parts having orientation. Black regions correspond to regions including crystal parts having no orientation or crystal parts with random orientation.

From the result shown in FIG. 37A2, the proportion of the area other than the region including crystal parts having orientation is approximately 43.1% in Sample X1. From the result shown in FIG. 37B2, the proportion of the area other than the region including crystal parts having orientation is approximately 61.7% in Sample X2. From the result shown in FIG. 37C2, the proportion of the area other than the region including crystal parts having orientation is approximately 89.5% in Sample X3.

The proportion of the region other than crystal parts having orientation in an oxide semiconductor film, which is estimated in the above manner, is preferably greater than or equal to 5% and less than 40% because the oxide semiconductor film has extremely high crystallinity and extremely high stability of electrical characteristics and hardly generates oxygen vacancies. In contrast, when the proportion of the region other than crystal parts having orientation in an oxide semiconductor film is higher than or equal to 40% and lower than 100%, preferably higher than or equal to 60% and lower than or equal to 90%, the oxide semiconductor film includes both the crystal parts having orientation and the crystal parts having no orientation at an appropriate ratio and thus can achieve both high stability of electrical characteristics and high mobility.

Here, a region other than the crystal parts that can be easily observed in a cross-sectional TEM image or a cross-sectional TEM image obtained through analysis can be referred to as a lateral growth buffer region (LGBR).

<2-6. Oxygen Diffusion to Oxide Semiconductor Film>

Next, the evaluation results of ease of oxygen diffusion to oxide semiconductor films are described.

The following three samples (Samples Y1 to Y3) were fabricated.

[Sample Y1]

First, an approximately 50-nm-thick oxide semiconductor film was formed over a glass substrate in a manner similar to that of Sample X1. Next, an approximately 30-nm-thick silicon oxynitride film, an approximately 100-nm-thick silicon oxynitride film, and an approximately 20-nm-thick silicon oxynitride film were stacked over the oxide semiconductor film by a plasma CVD method. Note that in the following description, an oxide semiconductor film and a silicon oxynitride film are referred to as OS and GI, respectively, in some cases.

Then, heat treatment was performed at 350° C. for one hour in a nitrogen atmosphere.

Next, a 5-nm-thick In—Sn—Si oxide film was formed by a sputtering method.

Next, oxygen was added to the silicon oxynitride film. The oxygen addition treatment was performed with an ashing apparatus under the conditions where the substrate temperature was 40° C., an oxygen gas ($^{16}$O) at a flow rate of 150 sccm and an oxygen gas ($^{18}$O) at a flow rate of 100 sccm were introduced into a chamber, the pressure was 15 Pa, and an RF power of 4500 W was supplied for 600 sec. between parallel-plate electrodes provided in the ashing apparatus so that a bias would be applied to the substrate side. Since the silicon oxynitride film contained oxygen ($^{16}$O) at a main component level, an oxygen gas ($^{18}$O) was used to exactly measure the amount of oxygen added by the oxygen addition treatment.

Then, an approximately 100-nm-thick silicon nitride film was formed by a plasma CVD method.

[Sample Y2]

Sample Y2 is a sample whose oxide semiconductor film was formed in different conditions from those of Sample Y1. In Sample Y2, an approximately 50-nm-thick oxide semiconductor film was formed in a manner similar to that of Sample X2.

[Sample Y3]

Sample Y3 is a sample whose oxide semiconductor film was formed in different conditions from those of Sample Y1. In Sample Y3, an approximately 50-nm-thick oxide semiconductor film was formed in a manner similar to that of Sample X3.

Through the above process, Samples Y1 to Y3 were fabricated.

[SIMS Analysis]

The concentration of $^{18}$O in Samples Y1 to Y3 was measured by secondary ion mass spectrometry (SIMS) analysis. The SIMS analysis was performed under three conditions: a condition in which Samples Y1 to Y3 were not subjected to heat treatment; a condition in which Samples Y1 to Y3 were subjected to heat treatment at 350° C. for one hour in a nitrogen atmosphere; and a condition in which Samples Y1 to Y3 were subjected to heat treatment at 450° C. for one hour in a nitrogen atmosphere.

Figure 38A:
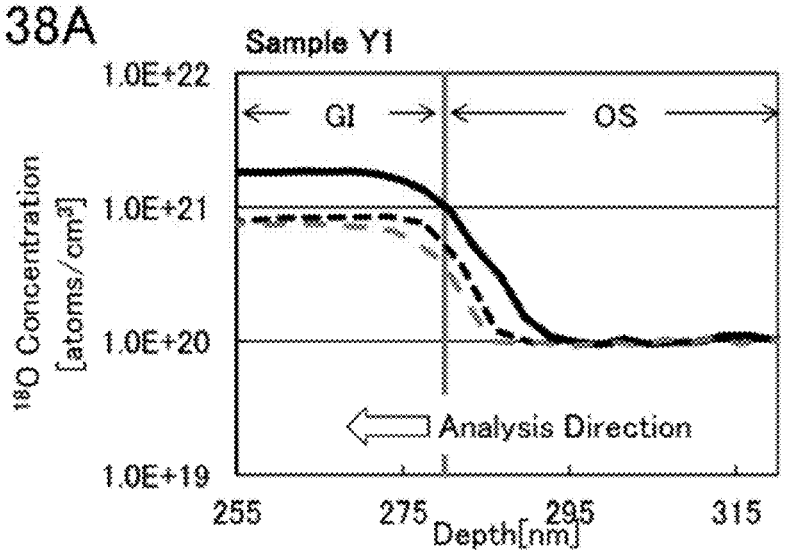
FIGS. 38A to 38C show SIMS measurement results of oxide semiconductor films.
Figure 38B:
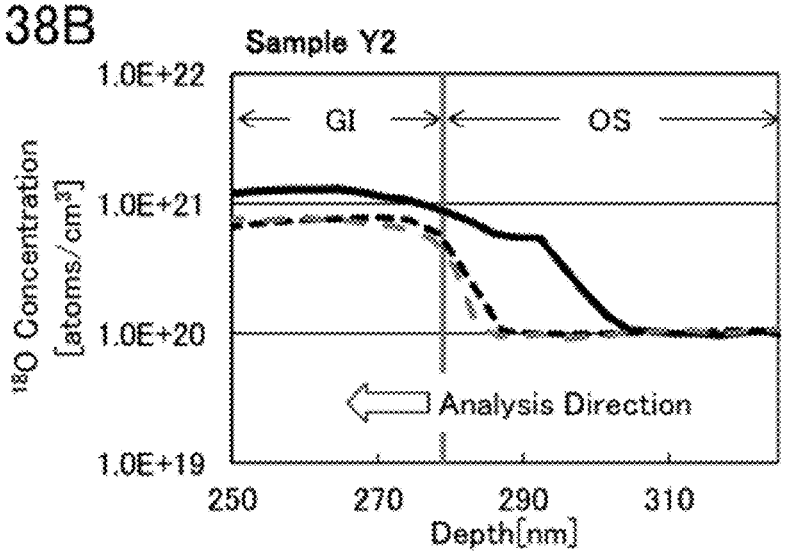
Figure 38C:
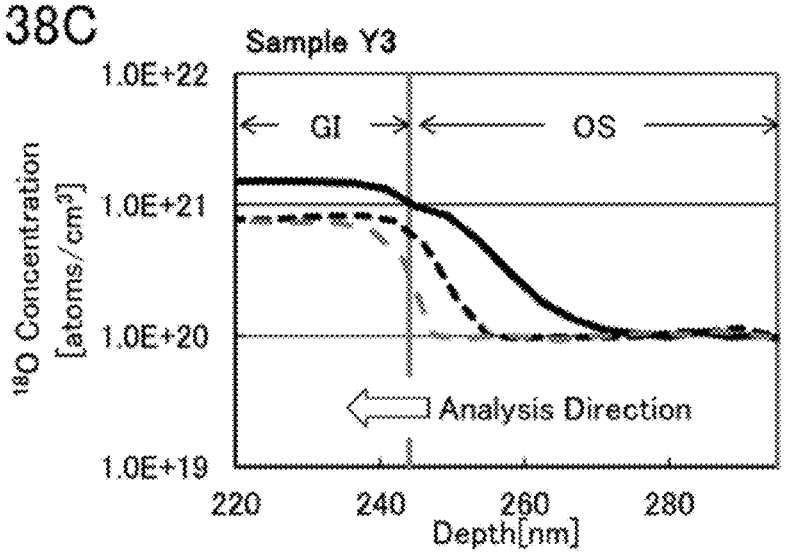

FIGS. 38A to 38C show SIMS measurement results. FIG. 38A, FIG. 38B, and FIG. 38C show SIMS measurement results of Sample Y1, Sample Y2, and Sample Y3, respectively.

FIGS. 38A to 38C show the analysis results of a region including GI and OS. Note that FIGS. 38A to 38C show results of SIMS (also referred to as substrate side depth profile (SSDP)-SIMS) analysis performed from the substrate side.

In FIGS. 38A to 38C, a gray dashed line indicates a profile of Sample in which heat treatment was not performed, a black dashed line indicates a profile of Sample in which heat treatment was performed at 350° C., and a black solid line indicates a profile of Sample in which heat treatment was performed at 450° C.

In each of Samples Y1 to Y3, it is found that $^{18}$O was diffused to GI and also to OS. Furthermore, the position where $^{18}$O was diffused was deeper in the order of Sample Y1, Sample Y2, and Sample Y3. In addition, when heat treatment was performed at 350° C. or 450° C., $^{18}$O was more deeply diffused.

From the above results, it is found that an oxide semiconductor film including both crystal parts having orientation and crystal parts having no orientation and a low proportion of crystal parts having orientation is a film which easily transmits oxygen, in other words, a film in which oxygen is easily diffused. In addition, when heat treatment is performed at 350° C. or 450° C., oxygen in a GI film is diffused to OS.

The above results show that the higher the proportion (density) of crystal parts having orientation is, the more difficult it is for oxygen to be diffused in the thickness direction, and the lower the density is, the easier it is for oxygen to be diffused in the thickness direction. The ease of oxygen diffusion to the oxide semiconductor film can be considered as follows.

In an oxide semiconductor film containing both crystal parts having orientation and submicroscopic crystal parts having no orientation, a region other than the crystal parts which can be obviously observed in a cross-sectional observation image (LGBR) can be a region in which oxygen is easily diffused, that is, can serve as an oxygen diffusion path. As a result, in the case where a source which supplies sufficient oxygen is provided in the vicinity of the oxide semiconductor film, oxygen can be easily supplied through the LGBR to the crystal parts having orientation, and the amount of oxygen vacancy in the film can be reduced.

For example, an oxide film which easily releases oxygen is formed to be in contact with the oxide semiconductor film and heat treatment is performed, so that oxygen released from the oxide film is diffused to the oxide semiconductor film in the thickness direction through the LGBR. Through the LGBR, oxygen can be supplied laterally to crystal parts having orientation. Accordingly, oxygen is easily supplied sufficiently to the crystal parts having orientation and a region other than the crystal parts in the oxide semiconductor film, which leads to an effective reduction of oxygen vacancy in the film.

For example, when a hydrogen atom which is not bonded to a metal atom exists in the oxide semiconductor film, an oxygen atom is bonded to the hydrogen atom, and then OH is formed and fixed in some cases. The state in which a certain amount (e.g., approximately $1\times10^{17}$ cm$^{-3}$) of hydrogen atoms trapped in oxygen vacancy ($V_O$) in the oxide semiconductor film (such a hydrogen atom is referred to as $V_O$H) is formed in the deposition at a low temperature, whereby generation of OH is inhibited. A certain amount of carriers exists in the oxide semiconductor film because $V_O$H generates a carrier. Thus, the oxide semiconductor film with an increased carrier density can be formed. Although oxygen vacancy is formed concurrently with the deposition, the oxygen vacancy can be reduced by introducing oxygen through the LGBR as described above. In this manner, the oxide semiconductor film with a relatively high carrier density and a sufficiently reduced amount of oxygen vacancy can be formed.

A clear grain boundary cannot be observed in the oxide semiconductor film because submicroscopic crystal parts having no orientation at the time of the deposition is formed in a region other than crystal parts having orientation. The submicroscopic crystal part is positioned between a plurality of crystal parts having orientation. The submicroscopic crystal part is bonded to an adjacent crystal part having orientation by growing in the lateral direction with heat at the time of the deposition. The submicroscopic crystal part functions as a region where a carrier is generated. The oxide semiconductor film with such a structure is expected to improve field-effect mobility considerably when used in a transistor.

In addition, plasma treatment in an oxygen atmosphere is preferably performed after the oxide semiconductor film is formed and an oxide insulating film such as a silicon oxide film is formed over the oxide semiconductor film. The treatment can supply oxygen to the film and reduce the hydrogen concentration. For example, during plasma treatment, fluorine which remains in the chamber is doped at the same time to the oxide semiconductor film in some cases. Fluorine exists as a fluorine atom with negative charges and is bonded to a hydrogen atom with positive charges by Coulomb force, and then HF is generated. HF is released to the outside of the oxide semiconductor film during the plasma treatment, and as a result, the hydrogen concentration in the oxide semiconductor film can be reduced. In the plasma treatment, $H_2O$ in which an oxygen atom and hydrogen atoms are bonded is released to the outside of the film in some cases.

A structure in which a silicon oxide film (or a silicon oxynitride film) is stacked over the oxide semiconductor film is considered. Fluorine in the silicon oxide film does not affect electrical characteristics of the oxide semiconductor film because fluorine is bonded to hydrogen in the film and can exist as HF which is electrically neutral. Note that Si—F bond is generated in some cases, which is also electrically neutral. Furthermore, HF in the silicon oxide film does not affect the diffusion of oxygen.

According to the above mechanism, oxygen vacancy in the oxide semiconductor film can be reduced and hydrogen which is not bonded to a metal atom in the film can be reduced, which leads to the improvement of reliability. The electrical characteristics are expected to be improved because the carrier density of the oxide semiconductor film is greater than or equal to a certain amount.

<2-7. Deposition Method of Oxide Semiconductor Film>

A deposition method of the oxide semiconductor film of one embodiment of the present invention is described below.

The oxide semiconductor film of one embodiment of the present invention can be formed by a sputtering method under an atmosphere containing oxygen.

The substrate temperature during the deposition is higher than or equal to room temperature and lower than or equal to 150° C., preferably higher than or equal to 50° C. and lower than or equal to 150° C., further preferably higher than or equal to 100° C. and lower than or equal to 150° C., typified by 130° C. The substrate temperature within the above range can control the ratio of crystal parts having orientation to crystal parts having no orientation.

The oxygen flow rate ratio (partial pressure of oxygen) during the deposition is preferably higher than or equal to 1% and lower than 33%, further preferably higher than or equal to 5% and lower than or equal to 30%, still further preferably higher than or equal to 5% and lower than or equal to 20%, and yet still further preferably higher than or equal to 5% and lower than or equal to 15%, typified by 10%. Low oxygen flow rate can result in a large number of crystal parts having no orientation in the film.

Accordingly, setting the substrate temperature and the oxygen flow rate during the deposition within the above ranges can result in an oxide semiconductor film containing both crystal parts having orientation and crystal parts having no orientation. Furthermore, the proportions of crystal parts having orientation and crystal parts having no orientation can be adjusted by setting the substrate temperature and the oxygen flow rate within the above ranges.

An oxide target that can be used for forming the oxide semiconductor film is not limited to an In—Ga—Zn-based oxide; for example, an In-M-Zn-based oxide (M is Al, Ga, Y, or Sn) can be used.

When an oxide semiconductor film containing crystal parts is formed as the oxide semiconductor film using a sputtering target containing a polycrystalline oxide having a plurality of crystal grains, an oxide semiconductor film with crystallinity can be obtained more easily than the case of using a sputtering target not containing a polycrystalline oxide.

The consideration of the deposition mechanism of the oxide semiconductor film is made below. In the case where a sputtering target contains a plurality of crystal grains each of which has a layered structure and an interface at which the crystal grain is easily cleaved, ion collision with the sputtering target might cleave crystal grains to make plate-like or pellet-like sputtering particles. The obtained plate-like or pellet-like sputtering particles are deposited on a substrate, which probably results in formation of an oxide semiconductor film containing nanocrystals. An oxide semiconductor film containing crystal parts having orientation is likely to be formed when the substrate is heated because the nanocrystals are then bonded to each other or rearranged at a substrate surface.

Note that the above consideration is made on the assumption that a sputtering method is used; a sputtering method is particularly preferable because the crystallinity can be easily adjusted. Instead of a sputtering method, a pulsed laser deposition (PLD) method, a plasma-enhanced chemical vapor deposition (PECVD) method, a thermal chemical vapor deposition (CVD) method, an atomic layer deposition (ALD) method, a vacuum evaporation method, or the like may be used. As an example of the thermal CVD method, a metal organic chemical vapor deposition (MOCVD) method can be given.

At least part of this embodiment can be implemented in combination with any of the other embodiments described in this specification as appropriate.

Embodiment 3

In this embodiment, an example of a display device that includes the semiconductor device of one embodiment of the present invention will be described below with reference to FIG. 39, FIG. 40, FIG. 41, FIG. 42, FIGS. 43A to 43D, FIG. 44, FIG. 45, and FIG. 46.

Figure 39:
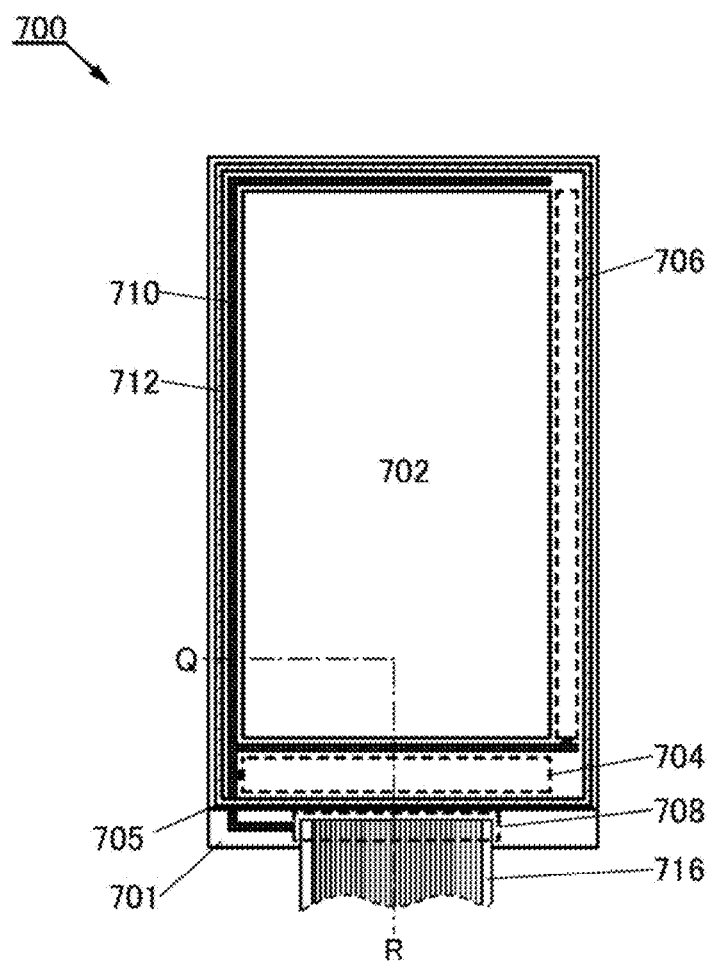
FIG. 39 is a top view illustrating one embodiment of a display device.

FIG. 39 is a top view illustrating an example of a display device. A display device 700 illustrated in FIG. 39 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 39, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. The variety of signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors.

The display device 700 can include any of a variety of elements. As examples of the elements, electroluminescent (EL) element (e.g., an EL element containing organic and inorganic materials, an organic EL element, an inorganic EL element, or an LED), a light-emitting transistor element (a transistor which emits light depending on current), an electron emitter, a liquid crystal element, an electronic ink display, an electrophoretic element, an electrowetting element, a plasma display panel (PDP), a micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink or electrophoretic elements include electronic paper and the like. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used to obtain a full-color display device in which white light (W) is used for a backlight (e.g., an organic EL element, an inorganic EL element, an LED, or a fluorescent lamp). As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 40:
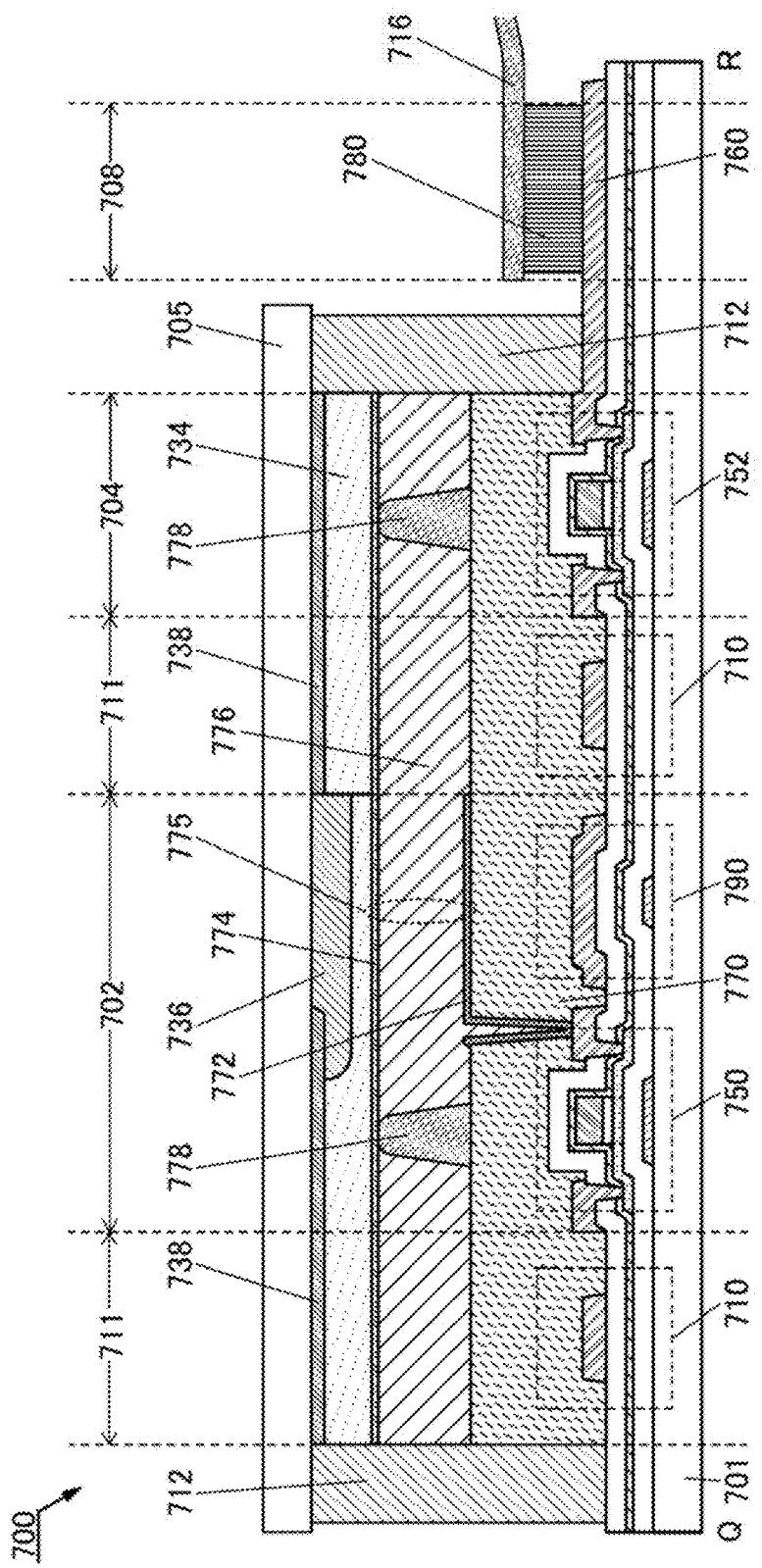
FIG. 40 is a cross-sectional view illustrating one embodiment of a display device.
Figure 41:
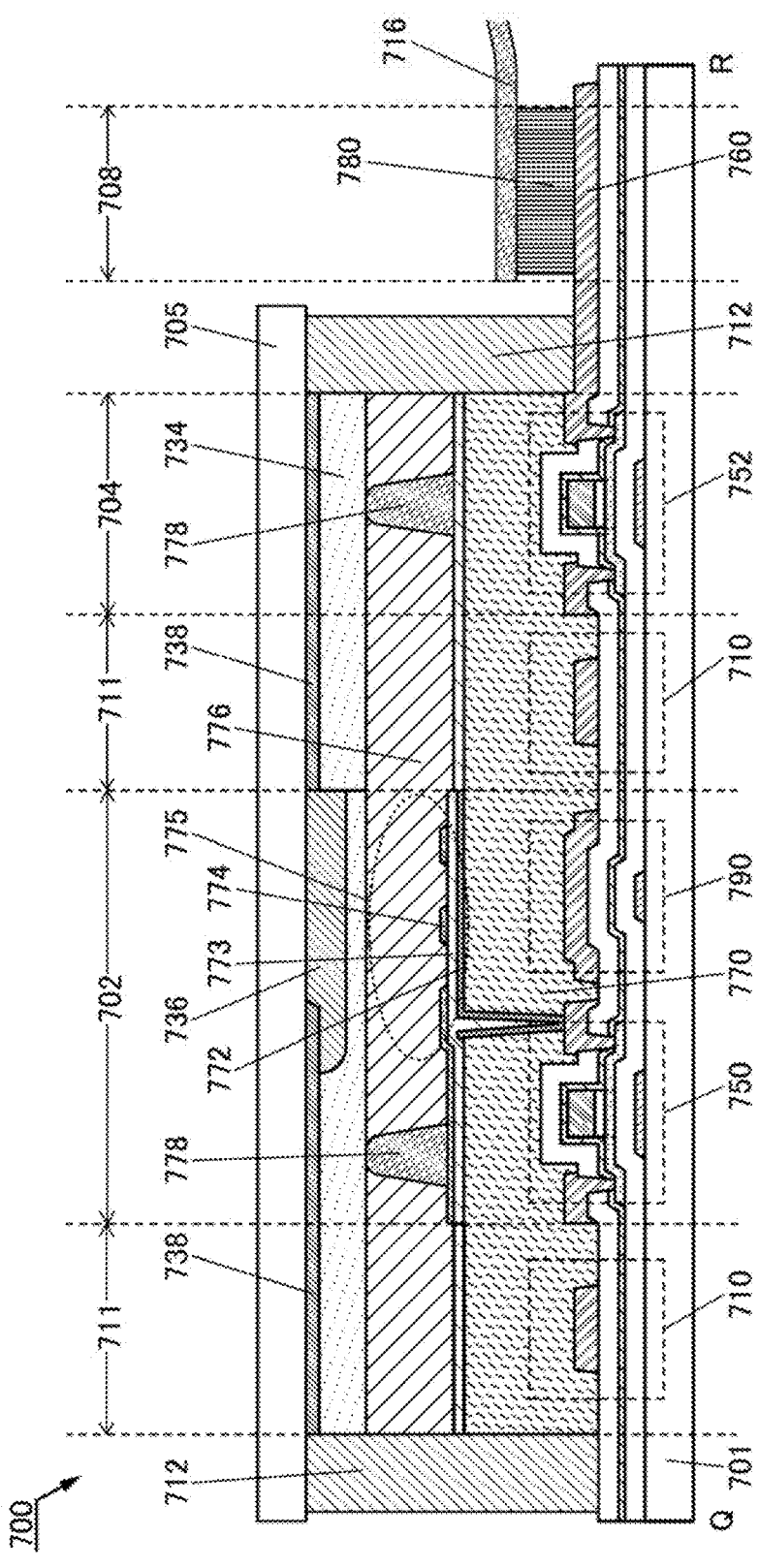
FIG. 41 is a cross-sectional view illustrating one embodiment of a display device.
Figure 42:
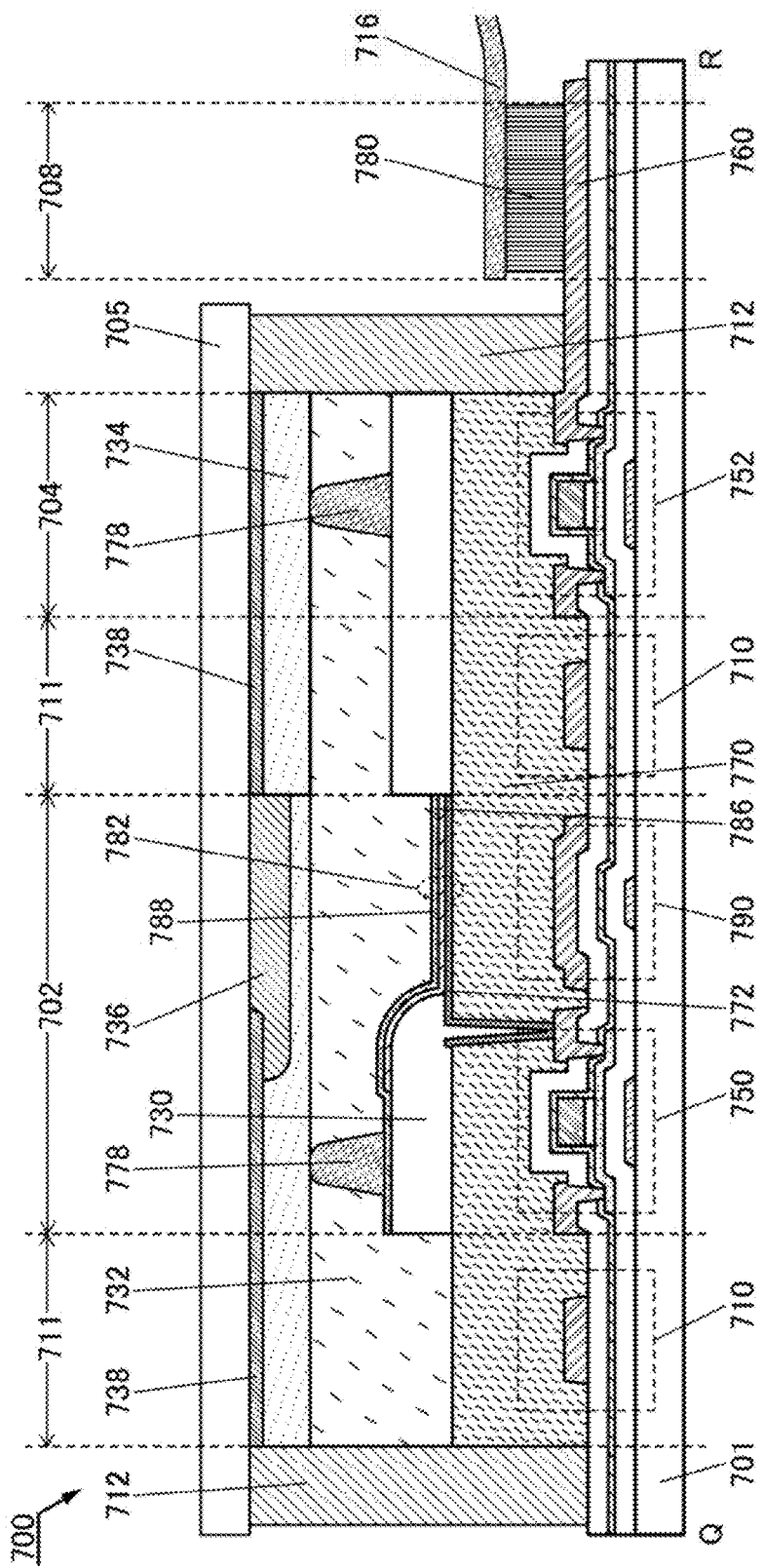
FIG. 42 is a cross-sectional view illustrating one embodiment of a display device.

In this embodiment, a structure including a liquid crystal element and an EL element as display elements is described with reference to FIG. 40, FIG. 41, and FIG. 42. Note that FIG. 40 and FIG. 41 are each a cross-sectional view taken along the dashed-dotted line Q-R shown in FIG. 39 and show a structure including a liquid crystal element as a display element. FIG. 42 is a cross-sectional view taken along dashed-dotted line Q-R in FIG. 39 and illustrates the structure including an EL element as a display element.

Portions common to FIG. 40, FIG. 41, and FIG. 42 are described first, and then different portions are described.

<3-1. Common Portions in Display Devices>

The display device 700 illustrated in FIG. 40, FIG. 41, and FIG. 42 include a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100B described above. Note that the transistor 750 and the transistor 752 may each have the structure of any of the other transistors described in the above embodiments.

The transistors used in this embodiment each include an oxide semiconductor film which is highly purified and in which formation of oxygen vacancies is suppressed. The transistor can have low off-state current. Accordingly, an electrical signal such as an image signal can be held for a longer period, and a writing interval can be set longer in an on state. Accordingly, the frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

A capacitor 790 includes a lower electrode that is formed through a step of processing the same conductive film as a conductive film functioning as a first gate electrode of the transistor 750 and an upper electrode that is formed through a step of processing the same conductive film as a conductive film functioning as a source electrode or a drain electrode of the transistor 750. Furthermore, between the lower electrode and the upper electrode, an insulating film that is formed through a step of forming the same insulating film as an insulating film functioning as a first gate insulating film of the transistor 750 and an insulating film that is formed through a step of forming the same insulating film as an insulating film functioning as a protective insulating film of the transistor 750 are provided. That is, the capacitor 790 has a stacked-layer structure in which the insulating films functioning as a dielectric film are positioned between a pair of electrodes.

In FIG. 40, FIG. 41, and FIG. 42, a planarization insulating film 770 is provided over the transistor 750, the transistor 752, and the capacitor 790.

Although FIG. 40, FIG. 41, and FIG. 42 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a top-gate transistor is used in the pixel portion 702 and a bottom-gate transistor is used in the source driver circuit portion 704, or a structure in which a bottom-gate transistor is used in the pixel portion 702 and a top-gate transistor is used in the source driver circuit portion 704 may be employed. Note that the term "source driver circuit portion 704" can be replaced by the term "gate driver circuit portion".

The signal line 710 is formed through the same process as the conductive films functioning as source electrodes and drain electrodes of the transistors 750 and 752. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<3-2. Structure Example of Display Device Using Liquid Crystal Element>

The display device 700 illustrated in FIG. 40 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 illustrated in FIG. 40 can display an image in such a manner that transmission or non-transmission of light is controlled by the alignment state in the liquid crystal layer 776 which is changed depending on the voltage applied to between the conductive film 772 and the conductive film 774.

The conductive film 772 is electrically connected to the conductive film that functions as a source electrode and a drain electrode included in the transistor 750. The conductive film 772 is formed over the planarization insulating film 770 to function as a pixel electrode, i.e., one electrode of the display element.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light.

In the case where a conductive film that reflects visible light is used as the conductive film 772, the display device 700 becomes a reflective-type liquid crystal display device. In the case where a conductive film that transmits visible light is used as the conductive film 772, the display device 700 becomes a transmissive liquid crystal display device.

When a structure over the conductive film 772 is changed, a driving method of the liquid crystal element can be changed. An example of this case is illustrated in FIG. 41. The display device 700 illustrated in FIG. 41 is an example of employing a transverse electric field mode (e.g., an FFS mode) as a driving mode of the liquid crystal element. In the structure illustrated in FIG. 41, an insulating film 773 is provided over the conductive film 772 and the conductive film 774 is provided over the insulating film 773. In such a structure, the conductive film 774 functions as a common electrode, and an electric field generated between the conductive film 772 and the conductive film 774 through the insulating film 773 can control the alignment state of the liquid crystal layer 776.

Although not illustrated in FIG. 40 and FIG. 41, the conductive film 772 and/or the conductive film 774 may be provided with an alignment film on a side in contact with the liquid crystal layer 776. Although not illustrated in FIG. 40 and FIG. 41, an optical member (optical substrate) or the like, such as a polarizing member, a retardation member, or an anti-reflection member, may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy, which makes the alignment process unneeded. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Moreover, the liquid crystal material which exhibits a blue phase has a small viewing angle dependence.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

<3-3. Display Device Including Light-Emitting Element>

The display device 700 illustrated in FIG. 42 includes a light-emitting element 782. The light-emitting element 782 includes a conductive film 772, an EL layer 786, and a conductive film 788. The display device 700 shown in FIG. 42 is capable of displaying an image by light emission from the EL layer 786 included in the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. The quantum dot containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The above-described organic compound and the inorganic compound can be deposited by a method such as an evaporation method (including a vacuum evaporation method), a droplet discharging method (also referred to as an ink-jet method), a coating method, or a gravure printing method. A low molecular material, a middle molecular material (including an oligomer and a dendrimer), or a high molecular material may be included in the EL layer 786.

Here, a method for forming the EL layer 786 by a droplet discharge method is described with reference to FIGS. 43A to 43D. FIGS. 43A to 43D are cross-sectional views illustrating the method for forming the EL layer 786.

Figure 43A:
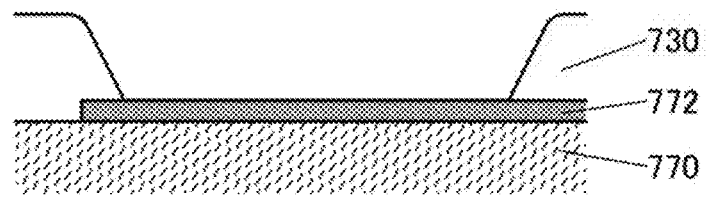
FIGS. 43A to 43D are cross-sectional views illustrating a method for forming an EL layer.
Figure 43B:
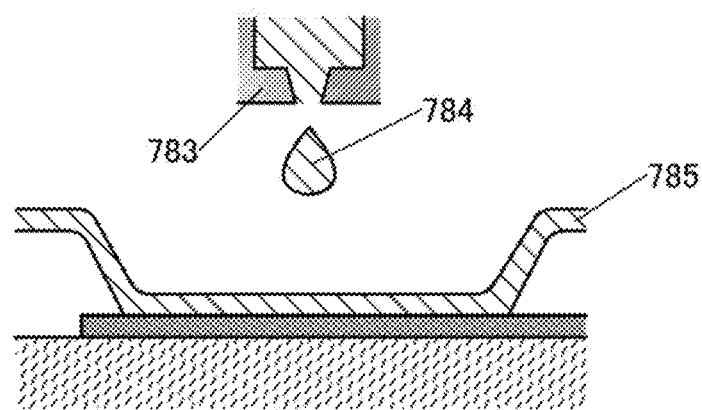

First, the conductive film 772 is formed over the planarization insulating film 770, and an insulating film 730 is formed to cover part of the conductive film 772 (see FIG. 43A).

Next, a droplet 784 is discharged to an exposed portion of the conductive film 772, which is an opening of the insulating film 730, from a droplet discharge apparatus 783, so that a layer 785 containing a composition is formed. The droplet 784 is a composition containing a solvent and is attached over the conductive film 772 (see FIG. 43B).

Note that the method for discharging the droplet 784 may be performed under reduced pressure.

Figure 43C:
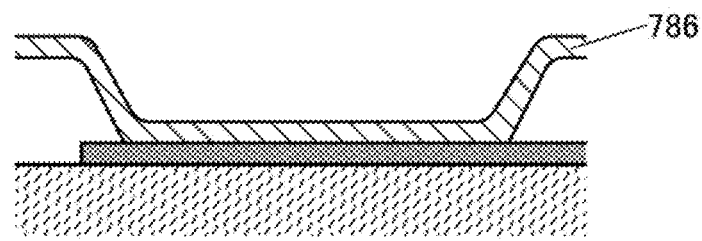

Then, the solvent is removed from the layer 785 containing the composition, and the resulting layer is solidified to form the EL layer 786 (see FIG. 43C).

The solvent may be removed by drying or heating.

Figure 43D:
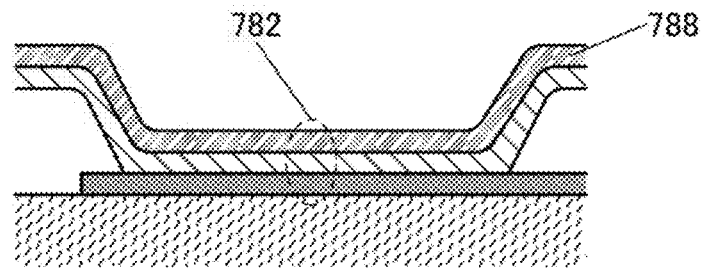

Next, the conductive film 788 is formed over the EL layer 786; thus, the light-emitting element 782 is formed (see FIG. 43D)

When the EL layer 786 is formed by a droplet discharging method as described above, the composition can be selectively discharged; accordingly, waste of material can be reduced. Furthermore, a lithography process or the like for shaping is not needed, and thus, the process can be simplified and cost reduction can be achieved.

The droplet discharge method described above is a general term for a means including a nozzle equipped with a composition discharge opening or a means to discharge droplets such as a head having one or a plurality of nozzles.

Figure 44:
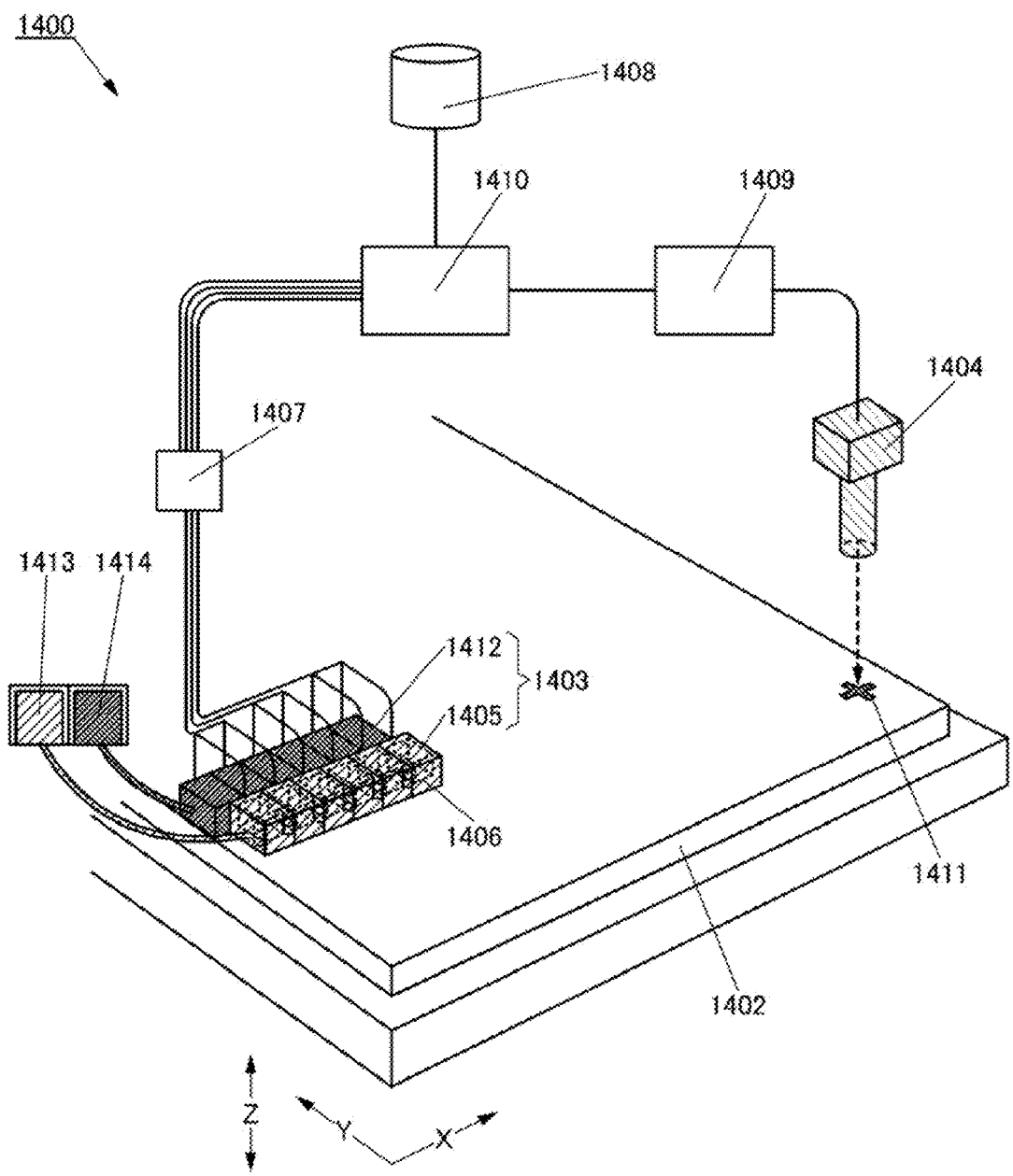
FIG. 44 is a conceptual diagram illustrating a droplet discharge apparatus.

Next, a droplet discharge apparatus used for the droplet discharge method is described with reference to FIG. 44. FIG. 44 is a conceptual diagram illustrating a droplet discharge apparatus 1400.

The droplet discharge apparatus 1400 includes a droplet discharge means 1403. In addition, the droplet discharge means 1403 is equipped with a head 1405 and a head 1412.

The heads 1405 and 1412 are connected to a control means 1407, and this control means 1407 is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. Then, the digital signal is recognized by the computer 1410, and then, a control signal is generated and transmitted to the control means 1407.

An image sensor or the like using a charge coupled device (CCD) or a complementary metal oxide semiconductor (CMOS) can be used as the imaging means 1404. Data about a pattern to be formed over the substrate 1402 is stored in a storage medium 1408, and the control signal is transmitted to the control means 1407 based on the data, so that each of the heads 1405 and 1412 of the droplet discharging means 1403 can be individually controlled. The heads 1405 and 1412 are supplied with a material to be discharged from material supply sources 1413 and 1414 through pipes, respectively.

Inside the head 1405, a space as indicated by a dotted line 1406 to be filled with a liquid material and a nozzle which is a discharge outlet are provided. Although it is not shown, an inside structure of the head 1412 is similar to that of the head 1405. When the nozzle sizes of the heads 1405 and 1412 are different from each other, different materials with different widths can be discharged simultaneously. Each head can discharge and draw a plurality of light emitting materials. In the case of drawing over a large area, the same material can be simultaneously discharged to be drawn from a plurality of nozzles in order to improve throughput. When a large substrate is used, the heads 1405 and 1412 can freely scan the substrate in directions indicated by arrows X, Y, and Z in FIG. 44, and a region in which a pattern is drawn can be freely set. Thus, a plurality of the same patterns can be drawn over one substrate.

Further, a step of discharging the composition may be performed under reduced pressure. Also, a substrate may be heated when the composition is discharged. After discharging the composition, either drying or baking or the both is performed. Both the drying and baking are heat treatments but different in purpose, temperature, and time period. The steps of drying and baking are performed under normal pressure or under reduced pressure by laser irradiation, rapid thermal annealing, heating using a heating furnace, or the like. Note that the timing of the heat treatment and the number of times of the heat treatment are not particularly limited. The temperature for performing each of the steps of drying and baking in a favorable manner depends on the materials of the substrate and the properties of the composition.

In the above manner, the EL layer 786 can be formed with the droplet discharge apparatus.

The display device 700 shown in FIG. 42 is described again.

In the display device 700 in FIG. 42, an insulating film 730 is provided over the planarization insulating film 770 and the conductive film 772. The insulating film 730 covers part of the conductive film 772. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 772 side, or a dual-emission structure in which light is emitted to both the conductive film 772 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the display device 700 in FIG. 42, the structure is not limited thereto. In the case where the EL layer 786 is formed by a separate coloring method, the coloring film 736 is not necessarily provided.

<3-4. Structure Example of Display Device Provided with Input/Output Device>

An input/output device may be provided in the display device 700 illustrated in FIG. 41 and FIG. 42. As an example of the input/output device, a touch panel or the like can be given.

Figure 45:
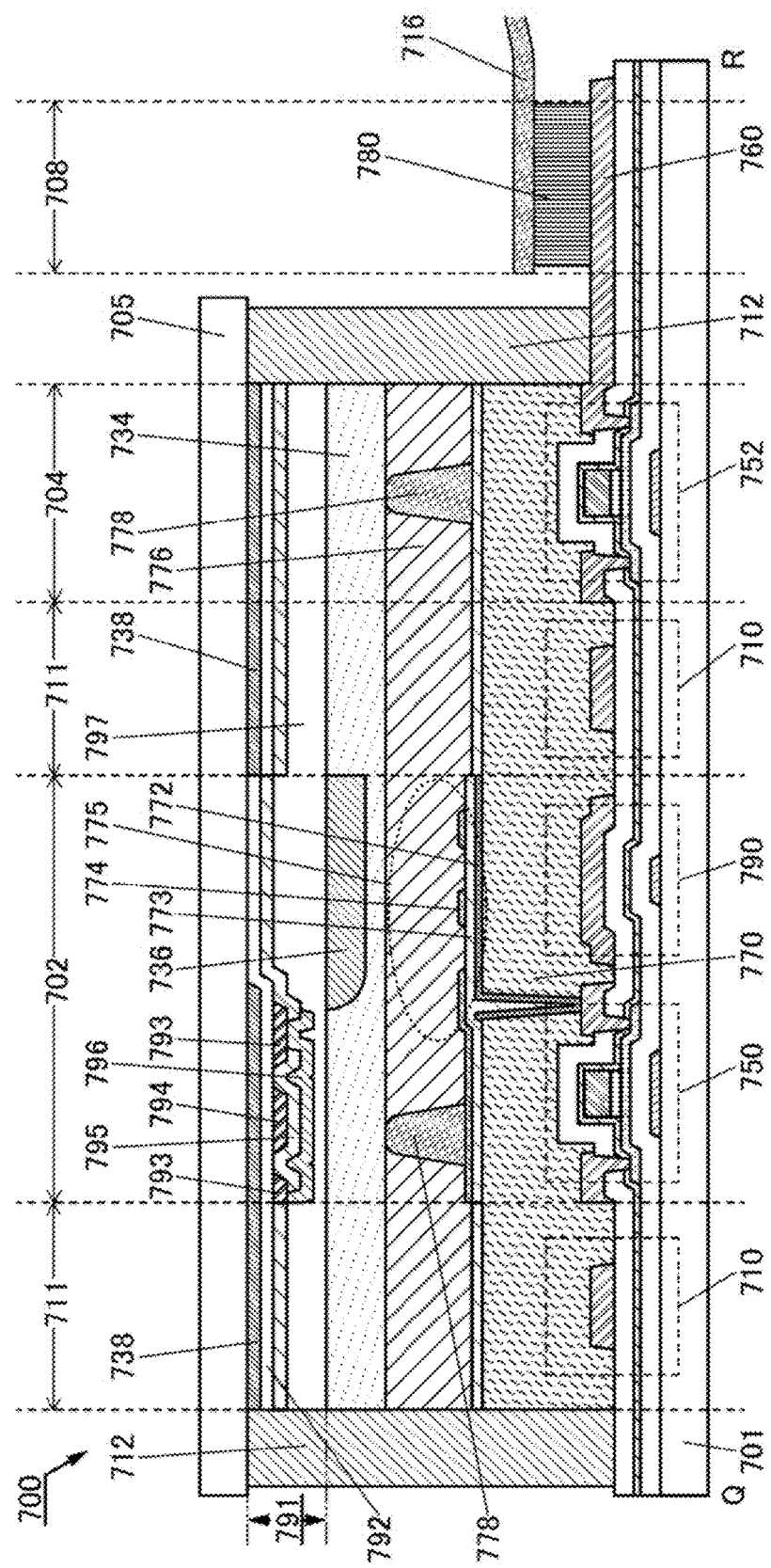
FIG. 45 is a cross-sectional view illustrating one embodiment of a display device.
Figure 46:
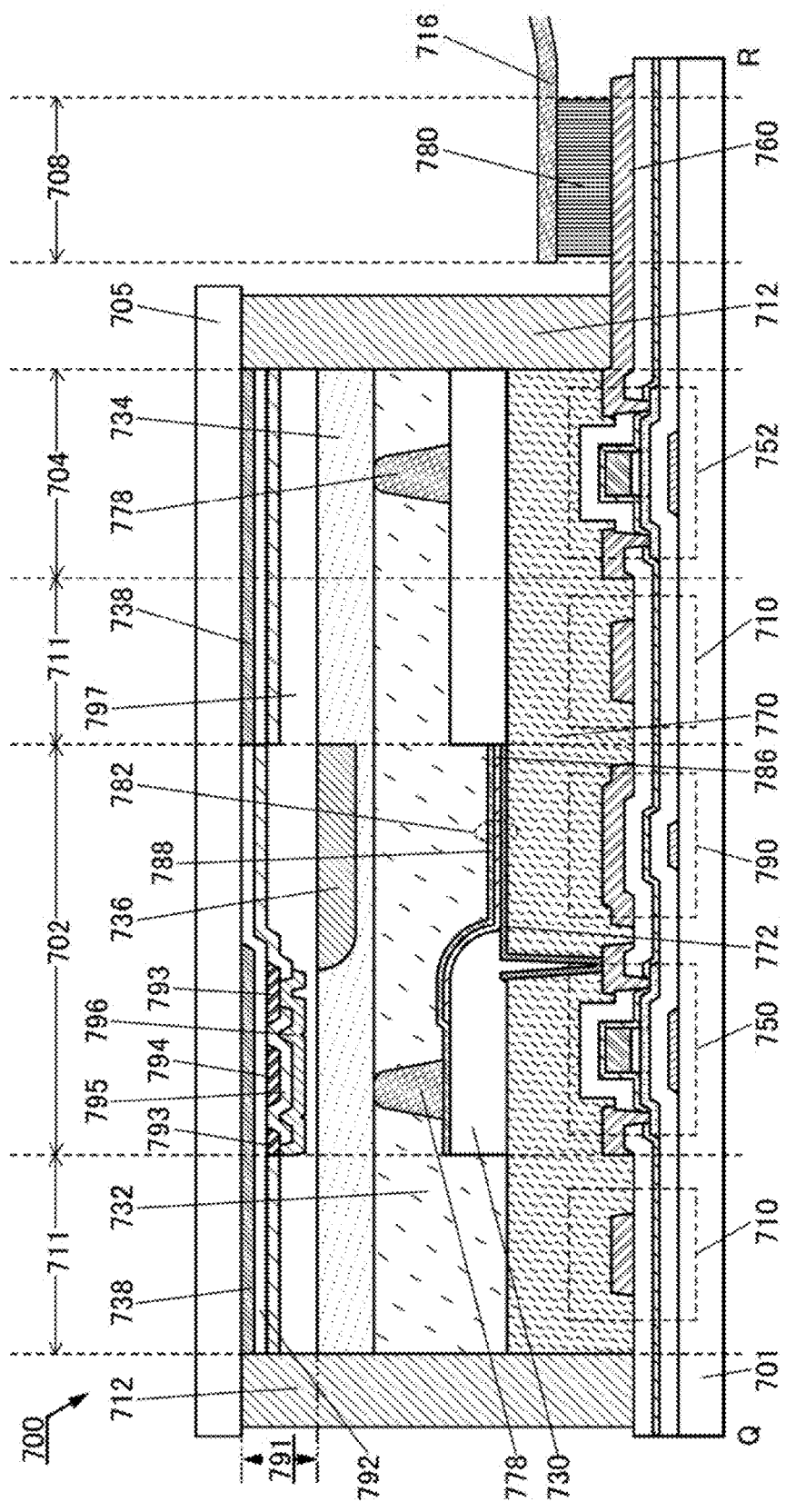
FIG. 46 is a cross-sectional view illustrating one embodiment of a display device.

FIG. 45 illustrates a structure in which the display device 700 shown in FIG. 41 includes a touch panel 791. FIG. 46 illustrates a structure in which the display device 700 shown in FIG. 42 includes the touch panel 791.

FIG. 45 is a cross-sectional view of the structure in which the touch panel 791 is provided in the display device 700 illustrated in FIG. 41. FIG. 46 is a cross-sectional view of the structure in which the touch panel 791 is provided in the display device 700 illustrated in FIG. 42.

First, the touch panel 791 illustrated in FIG. 45 and FIG. 46 is described below.

The touch panel 791 illustrated in FIG. 45 and FIG. 46 is an in-cell touch panel provided between the substrate 705 and the coloring film 736. The touch panel 791 is formed on the substrate 705 side before the light-blocking film 738 and the coloring film 736 are formed.

The touch panel 791 includes the light-blocking film 738, an insulating film 792, an electrode 793, an electrode 794, an insulating film 795, an electrode 796, and an insulating film 797. A change in the mutual capacitance between the electrode 793 and the electrode 794 can be sensed when an object such as a finger or a stylus approaches, for example.

A portion in which the electrode 793 intersects with the electrode 794 is illustrated in the upper portion of the transistor 750 illustrated in FIG. 45 and FIG. 46. Through openings in the insulating film 795, the electrode 796 is electrically connected to the two electrodes 793 between which the electrode 794 is positioned. Note that a structure in which a region where the electrode 796 is provided is provided in the pixel portion 702 is illustrated in FIG. 45 and FIG. 46 as an example; however, one embodiment of the present invention is not limited thereto. For example, the region where the electrode 796 is provided may be provided in the source driver circuit portion 704.

The electrodes 793 and 794 are provided in a region overlapping with the light-blocking film 738. As illustrated in FIG. 45, it is preferable that the electrode 793 do not overlap with the light-emitting element 782. As illustrated in FIG. 46, it is preferable that the electrode 793 do not overlap with the liquid crystal element 775. In other words, the electrode 793 has an opening in its region overlapping with the light-emitting element 782 and the liquid crystal element 775. That is, the electrode 793 has a mesh shape. With this structure, the electrode 793 does not block light emitted from the light-emitting element 782. Alternatively, the electrode 793 can have a structure which does not block light transmitted through the liquid crystal element 775. Thus, since luminance is hardly reduced even when the touch panel 791 is placed, a display device with high visibility and low power consumption can be achieved. Note that the electrode 794 can have a similar structure.

In addition, since the electrodes 793 and 794 do not overlap with the light-emitting element 782, the electrodes 793 and 794 can be formed using a metal material with low visible light transmittance. In the case where the electrode 793 and the electrode 794 do not overlap with the liquid crystal element 775, a metal material having low transmittance with respect to visible light can be used for the electrode 793 and the electrode 794.

Accordingly, the resistance of the electrodes 793 and 794 can be reduced as compared with an electrode using an oxide material with high visible light transmittance, so that the sensitivity of the touch panel can be increased.

For example, conductive nanowires may be used for the electrodes 793, 794, and 796. The nanowires may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of the electrodes 664, 665, and 667, the transmittance of visible light can be greater than or equal to 89% and the sheet resistance can be greater than or equal to 40 Ω/square and less than or equal to 100 Ω/square.

Although the structure of the in-cell touch panel is illustrated in FIG. 45 and FIG. 46, one embodiment of the present invention is not limited thereto. For example, a touch panel formed over the display device 700 (an on-cell touch panel), or a touch panel attached to the display device 700 (an out-cell touch panel) may be used.

In this manner, the display device of one embodiment of the present invention can be combined with various types of touch panels.

At least part of this embodiment can be implemented in combination with any of the other embodiments described in this specification as appropriate.

Embodiment 4

In this embodiment, an example of a semiconductor device of one embodiment of the present invention will be described. A transistor in this embodiment is suitable for miniaturization.

<4-1. Structure Example of Transistor Suitable for Miniaturization>

Figure 47A:
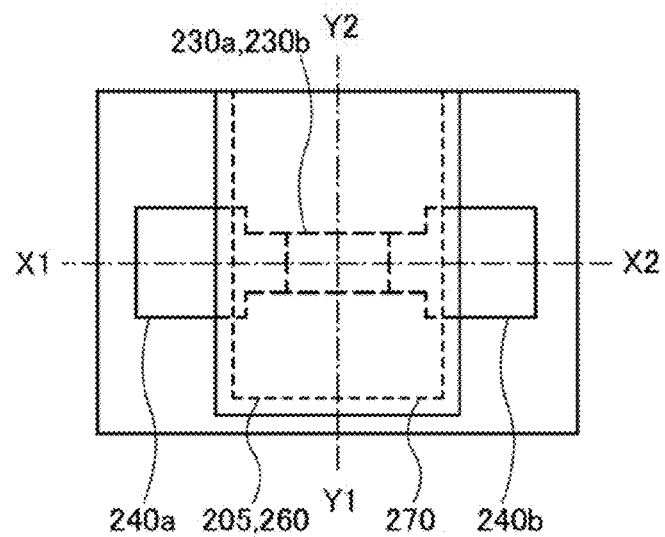
FIGS. 47A to 47C illustrate cross sections of a semiconductor device.
Figure 47B:
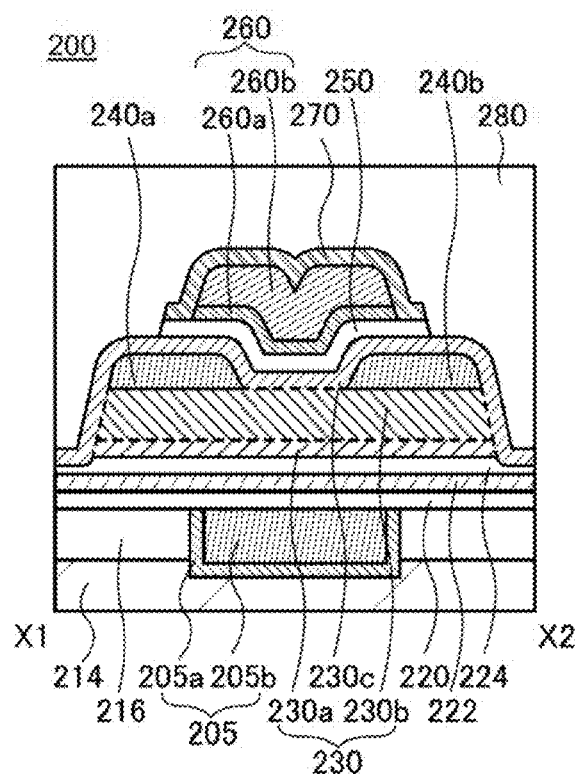
Figure 47C:
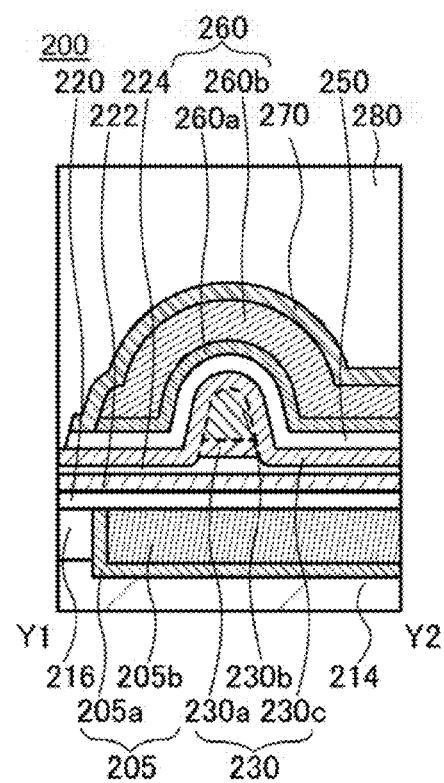

FIGS. 47A to 47C illustrate a top surface of a transistor 200. FIG. 47A illustrates a top surface of the transistor 200. For simplification of the figure, some films are omitted in FIG. 47A. FIG. 47B is a cross-sectional view taken along dashed-dotted line X1-X2 in FIG. 47A. FIG. 47C is a cross-sectional view taken along dashed-dotted line Y1-Y2 in FIG. 47A.

The transistor 200 includes a conductor 205 (a conductor 205*a* and a conductor 205*b*) and a conductor 260 (a conductor 260*a* and a conductor 260*b*) that function as gate electrodes; an insulator 220, an insulator 222, an insulator 224, and an insulator 250 that function as gate insulating layers; an oxide semiconductor 230 (an oxide semiconductor 230*a*, an oxide semiconductor 230*b*, and an oxide semiconductor 230*c*) that includes a region where a channel is formed; a conductor 240*a* that functions as one of a source and a drain; a conductor 240*b* that functions as the other of the source and the drain; and an insulator 280 that includes excess oxygen.

The oxide semiconductor 230 includes the oxide semiconductor 230*a*, the oxide semiconductor 230*b* over the oxide semiconductor 230*a*, and the oxide semiconductor 230*c* over the oxide semiconductor 230*b*. When the transistor 200 is turned on, a current flows (a channel is formed) mainly in the oxide semiconductor 230*b*. Although current sometimes flows through a region in the vicinity of the interface (a mixed region in some cases) between the oxide semiconductor 230*b* and the oxide semiconductors 230*a* and 230*c*, the oxide semiconductors 230*a* and 230*c* function as insulators at the other region.

FIGS. 47A to 47C illustrate a stacked-layer structure in which the conductor 260 serving as a gate electrode includes the conductor 260*a* and the conductor 260*b*. The insulator 270 is provided over the conductor 260 serving as a gate electrode.

The conductor 205 is formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

For example, a conductor having a barrier property with respect to hydrogen, e.g., tantalum nitride, may be used as the conductor 205*a*, and tungsten, which has high conductivity, may be stacked thereover as the conductor 205*b*. The use of the combination of the materials can prevent diffusion of hydrogen into the oxide semiconductor 230 while conductivity of a wiring is ensured. A two-layer structure of a conductor 205*a* and a conductor 205*b* is shown in FIGS. 47A to 47C, but the structure of the conductor 205 is not limited thereto, and a single-layer structure or a stacked-layer structure of three or more layers may be used.

Each of the insulators 220 and 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). In the case where such an insulator containing excess oxygen is provided in contact with an oxide in the transistor 200, oxygen vacancies in the oxide can be compensated. Note that the insulators 220 and 224 are not necessarily formed of the same material.

The insulator 222 preferably has a single-layer structure or a stacked-layer structure using one or more of insulators such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), and (Ba,Sr)TiO$_3$ (BST). Aluminum oxide, bismuth oxide, germanium oxide, niobium oxide, silicon oxide, titanium oxide, tungsten oxide, yttrium oxide, or zirconium oxide may be added to the insulator, for example.

The insulator may be subjected to nitriding treatment. A layer of silicon oxide, silicon oxynitride, or silicon nitride may be stacked over the insulator.

Note that the insulator 222 may have a stacked-layer structure of two or more layers. In this case, the stacked layers are not necessarily formed of the same material but may be formed of different materials.

In the case where the insulator 222 including a high-k material is provided between the insulator 220 and the insulator 224, electrons can be trapped in the insulator 222 under specific conditions, and the threshold voltage can be increased. As a result, the insulator 222 is negatively charged in some cases.

For example, in the case where the insulator 220 and the insulator 224 are formed using silicon oxide and the insulator 222 is formed using a material having a lot of electron trap states such as hafnium oxide, aluminum oxide, or tantalum oxide, the state where the potential of the conductor 205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide in the transistor 200 to the conductor 205. At this time, some of the moving electrons are trapped by the electron trap states of the insulator 222.

In the transistor in which a necessary amount of electrons is trapped by the electron trap states of the insulator 222, the threshold voltage is shifted in the positive direction. By controlling the voltage of the conductor 205, the amount of electrons to be trapped can be controlled, and thus the threshold voltage can be controlled. The transistor 200 having the structure is a normally-off transistor which is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging.

The threshold voltages can be controlled by appropriate adjustment of the thicknesses of the insulator 220, the insulator 222, and the insulator 224. A transistor having a low leakage current in an off state can be provided. A transistor with stable electrical characteristics can be provided. A transistor having a high on-state current can be provided. A transistor with a small subthreshold swing value can be provided. A highly reliable transistor can be provided.

The oxide semiconductor 230*a*, the oxide semiconductor 230*b*, and the oxide semiconductor 230*c* are formed using metal oxide such as In-M-Zn oxide (M is Al, Ga, Y, or Sn). In—Ga oxide or In—Zn oxide may be used as the oxide semiconductor 230.

The insulator 250 can have a single-layer structure or a stacked-layer structure using one or more of insulators such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), and (Ba,Sr)TiO$_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

As the insulator 250, like the insulator 224, an oxide insulator that contains oxygen in excess of the stoichiometric composition is preferably used. When such an insulator containing excess oxygen is provided in contact with the oxide semiconductor 230, oxygen vacancies in the oxide semiconductor 230 can be reduced.

As the insulator 250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties with respect to oxygen and hydrogen, can be used. The insulator formed of such a material functions as a layer that prevents release of oxygen from the oxide semiconductor 230 or entry of an impurity such as hydrogen from the outside.

Note that the insulator 250 may have a stacked-layer structure similar to that of the insulator 220, the insulator 222, and the insulator 224. When the insulator 250 includes an insulator in which a necessary amount of electrons is trapped by electron trap states, the threshold voltage of the transistor 200 can be shifted in the positive direction. The transistor 200 having the structure is a normally-off transistor which is in a non-conduction state (also referred to as an off state) even when the gate voltage is 0 V.

In addition to the insulator 250, a barrier film may be provided between the oxide semiconductor 230 and the conductor 260 in the semiconductor device illustrated in FIGS. 47A to 47C. The oxide semiconductor 230c may have a barrier property.

For example, an insulating film containing excess oxygen is provided in contact with the oxide semiconductor 230 and covered by a barrier film, whereby the composition of the oxide can be almost the same as the stoichiometric composition or can be in a supersaturated state containing more oxygen than that in the stoichiometric composition. It is also possible to prevent entry of impurities such as hydrogen into the oxide semiconductor 230.

One of a pair of the conductor 240a and the conductor 240b functions as a source electrode, and the other pair functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 240a and 240b. Although a single layer structure is shown in figures, a stacked-layer structure of two or more layers may be used.

For example, a titanium film and an aluminum film are may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

The conductor 260 functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. Furthermore, one or both of manganese and zirconium may be used. Alternatively, a semiconductor typified by polycrystalline silicon doped with an impurity element such as phosphorus, or a silicide such as nickel silicide may be used.

For example, a two-layer structure in which a titanium film is stacked over an aluminum film. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. Alternatively, an alloy film or a nitride film that contains aluminum and one or more elements selected from titanium, tantalum, tungsten, molybdenum, chromium, neodymium, and scandium may be used.

The conductor 260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

The conductor 260a is formed by a thermal CVD method, an MOCVD method, and an ALD method. In particular, the conductor 260a is preferably formed by an atomic layer deposition (ALD) method. Plasma damage to the insulator 250 can be reduced by using an ALD method and the like. In addition, the ALD method is preferable because coverage can be improved. Accordingly, a highly reliable transistor 200 can be provided.

The conductor 260b is formed by a material with high conductivity such as tantalum, tungsten, copper, or aluminum.

The insulator 270 may be provided to cover the conductor 260. In the case where the insulator 280 is formed using an oxide material from which oxygen is released, the insulator 270 is formed using a substance having a barrier property with respect to oxygen to prevent the conductor 260 from being oxidized by the released oxygen.

For example, the insulator 270 can be formed using metal oxide such as aluminum oxide. The insulator 270 is formed to a thickness with which the oxidation of the conductor 260 is prevented. For example, the thickness of the insulator 270 is set greater than or equal to 1 nm and less than or equal to 10 nm, preferably greater than or equal to 3 nm and less than or equal to 7 nm.

Thus, the oxidation of the conductor 260 can be prevented, and oxygen released from the insulator 280 can be supplied to the oxide semiconductor 230 efficiently.

An insulator 280 is provided over the transistor 200. The insulator 280 preferably includes oxide containing oxygen in excess of that in the stoichiometric composition. That is, in the insulator 280, a region containing oxygen in excess of that in the stoichiometric composition (hereinafter also referred to as excess-oxygen region) is preferably formed. In particular, in the case of using an oxide semiconductor in the transistor 200, when an insulator including an excess-oxygen region is provided as an interlayer film or the like in the vicinity of the transistor 200, oxygen vacancies in the transistor 200 are reduced, whereby the reliability can be improved.

As the insulator including the excess-oxygen region, specifically, an oxide material that releases part of oxygen by heating is preferably used.

For example, as such a material, a material containing silicon oxide or silicon oxynitride is preferably used. Alternatively, a metal oxide can be used. Note that in this specification, silicon oxynitride refers to a material that contains oxygen at a higher proportion than nitrogen, and silicon nitride oxide refers to a material that contains nitrogen at a higher proportion than oxygen.

The insulator 280 covering the transistor 200 may function as a planarization film that covers a roughness thereunder.

<4-2. Application Example of Transistor Suitable for Miniaturization>

An example of stacking transistors with different compositions is described below.

Figure 48:
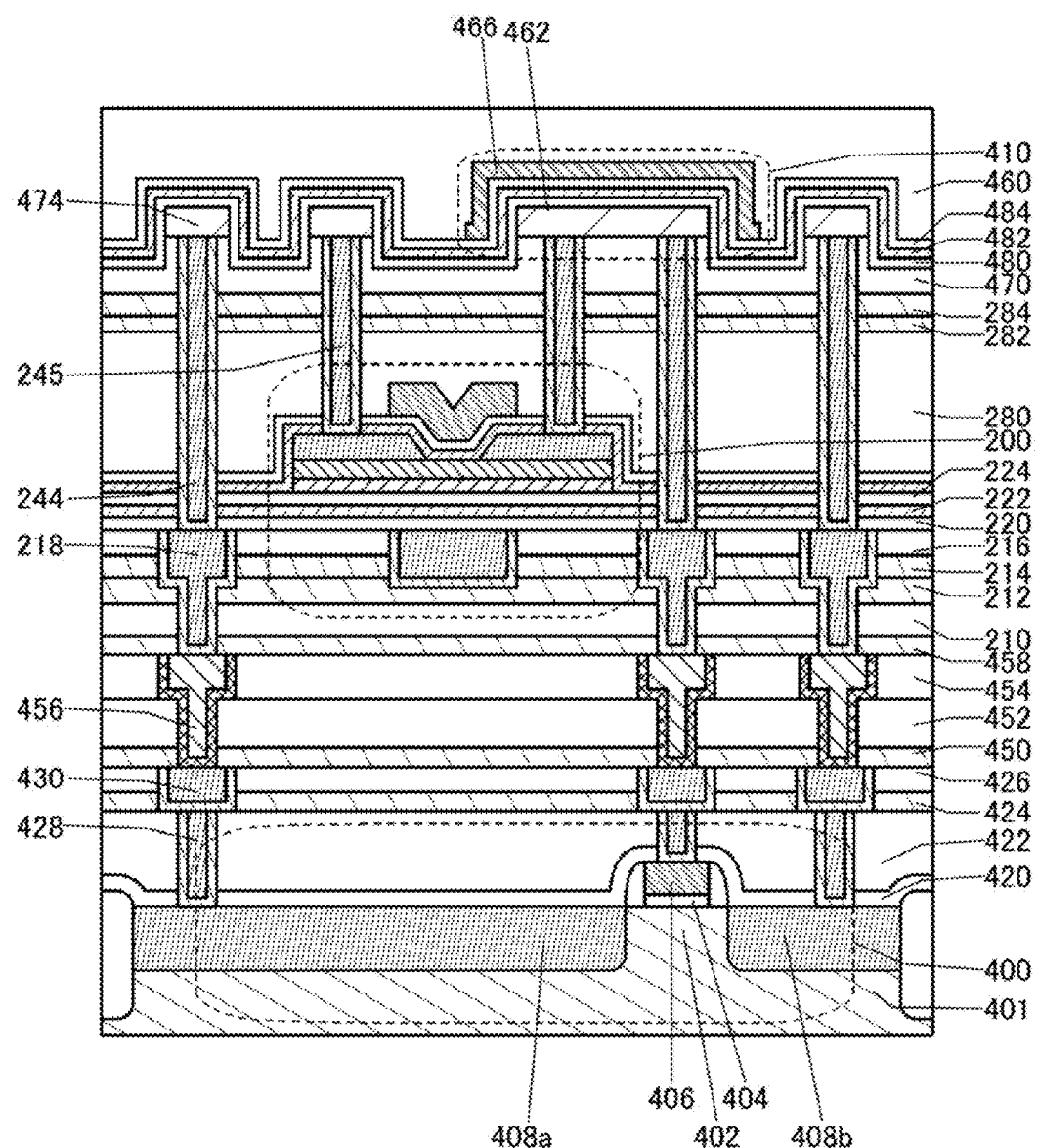
FIG. 48 illustrates a cross section of a semiconductor device.

A semiconductor device shown in FIG. 48 includes a transistor 400, a transistor 200, and a capacitor 410.

The transistor 200 is a transistor in which a channel is formed in a semiconductor layer including an oxide semiconductor. Since the off-state current of the transistor 200 is small, by using the transistor 200 in the semiconductor device (memory device), stored data can be held for a long time. In other words, it is possible to obtain a semiconductor device (memory device) which does not require refresh operation or has an extremely low frequency of the refresh operation, which leads to a sufficient reduction in power consumption.

The semiconductor device includes the transistor 400, the transistor 200, and the capacitor 410 as shown in FIG. 48. The transistor 200 is provided over the transistor 400, and the capacitor 410 is provided over the transistor 400 and the transistor 200.

The transistor 400 is provided over a substrate 401 and includes a conductor 406, an insulator 404, a semiconductor region 402 that is a part of the substrate 401, and low-resistance regions 408a and 408b functioning as a source region and a drain region.

The transistor 400 may be a p-channel transistor or an n-channel transistor.

It is preferable that a region of the semiconductor region 402 where a channel is formed, a region in the vicinity thereof, the low-resistance regions 408a and 408b functioning as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 400 may be a high-electron-mobility transistor (HEMT) with GaAs and GaAlAs or the like.

The low-resistance regions 408a and 408b contain an element which imparts n-type conductivity, such as arsenic or phosphorus, or an element which imparts p-type conductivity, such as boron, in addition to a semiconductor material used for the semiconductor region 402.

The conductor 406 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a material of the conductor determines the work function, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Note that the transistor 400 shown in FIG. 48 is just an example and is not limited to the structure shown therein; an appropriate transistor may be used in accordance with a circuit configuration or a driving method.

An insulator 420, an insulator 422, an insulator 424, and an insulator 426 are stacked sequentially and cover the transistor 400.

As the insulator 420, the insulator 422, the insulator 424, and the insulator 426, for example, silicon oxide, silicon oxynitride, silicon nitride oxide, silicon nitride, aluminum oxide, aluminum oxynitride, aluminum nitride oxide, or aluminum nitride may be used.

The insulator 422 functions as a planarization film for eliminating a level difference caused by the transistor 400 or the like underlying the insulator 422. A top surface of the insulator 422 may be planarized by planarization treatment using a chemical mechanical polishing (CMP) method or the like to increase the level of planarity.

The insulator 424 is preferably formed using, for example, a film having a barrier property that prevents hydrogen or impurities from diffusing from the substrate 401, the transistor 400, or the like into a region where the transistor 200 is formed.

As an example of the film having a barrier property with respect to hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 400. Specifically, the film that prevents hydrogen diffusion is a film from which hydrogen is less likely to be released.

Note that the dielectric constant of the insulator 426 is preferably lower than that of the insulator 424. For example, the relative dielectric constant of the insulator 426 is preferably lower than 4, further preferably lower than 3. For example, the relative dielectric constant of the insulator 424 is preferably 0.7 times or less that of the insulator 426, further preferably 0.6 times or less that of the insulator 426. In the case where a material with a low dielectric constant is used as an interlayer film, the parasitic capacitance between wirings can be reduced.

A conductor 428, a conductor 430, and the like that are electrically connected to the capacitor 410 or the transistor 200 are embedded in the insulator 420, the insulator 422, the insulator 424, and the insulator 426. Note that the conductor 428 and the conductor 430 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 428 and the conductor 430), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

Furthermore, the conductor 428 and the conductor 430 preferably include a conductor having a barrier property with respect to hydrogen. The conductor having a barrier property with respect to hydrogen is formed particularly in an opening portion of the insulator 424 having a barrier property with respect to hydrogen. In such a structure, the transistor 400 and the transistor 200 can be separated by a layer having a barrier property, so that diffusion of hydrogen from the transistor 400 to the transistor 200 can be prevented.

Note that as the conductor having a barrier property with respect to hydrogen, tantalum nitride may be used, for example. By stacking tantalum nitride and tungsten, which has high conductivity, diffusion of hydrogen from the transistor 400 can be prevented while the conductivity of a wiring is ensured. In this case, a tantalum nitride layer having a barrier property with respect to hydrogen is preferably in contact with the insulator 424 having a barrier property with respect to hydrogen.

A wiring layer may be provided over the insulator 426 and the conductor 430. For example, in FIG. 48, an insulator 450, an insulator 452, and an insulator 454 are stacked sequentially. The conductor 456 is formed in the insulator 450, the insulator 452, and the insulator 454. The conductor 456 functions as a plug or a wiring. Note that the conductor 456 can be formed using a material similar to that used for forming the conductor 428 and the conductor 430.

In addition, the conductor 456 is preferably formed using a low-resistance conductive material such as aluminum or copper. The use of a low-resistance conductive material can reduce wiring resistance. When copper is used as the conductor 456, the conductor 456 is preferably stacked with the conductor which inhibits diffusion of copper. As the conductor which inhibits diffusion of copper, for example, tantalum, an alloy containing tantalum such as tantalum nitride, ruthenium, an alloy containing ruthenium, or the like is preferably used.

Furthermore, an insulator which inhibits diffusion of copper or has a barrier property against oxygen and hydrogen is preferably used as the insulator 450. For example, a silicon nitride film can be used as a film which inhibits diffusion of copper. Therefore, the insulator 450 can be formed using a material similar to that used for forming the insulator 424.

In particular, it is preferable to provide the conductor which inhibits diffusion of copper in contact with an opening of the insulator 450 which inhibits diffusion of copper. Copper is preferably stacked over the conductor which inhibits diffusion of copper. In such a structure, diffusion of copper around wirings can be prevented.

An insulator 458, an insulator 210, an insulator 212, and an insulator 214 are stacked in this order over the insulator 454. A material inhibiting diffusion of copper or a material having a barrier property against oxygen or hydrogen is preferably used for one or all of the insulator 458, the insulator 210, the insulator 212, and the insulator 214.

The insulator 458 and the insulator 212 are preferably formed using, for example, a film inhibiting diffusion of copper or a film having a barrier property that prevents hydrogen or impurities from diffusing from a region where the substrate 401 or the transistor 400 is formed or the like into a region where the transistor 200 is formed. Therefore, the insulator 458 and the insulator 212 can be formed using a material similar to that used for forming the insulator 424.

The insulator 210 can be formed using a material similar to that of the insulator 420. For example, a silicon oxide film, a silicon oxynitride film, or the like can be used as the insulator 210.

As the insulator 214, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

An insulator 216 is provided over the insulator 214. The insulator 216 can be formed using a material similar to that used for forming the insulator 420. For example, a silicon oxide film, a silicon oxynitride film, or the like can be used as the insulator 216.

A conductor 218, a conductor 205 forming the transistor 200, and the like are embedded in the insulator 458, the insulator 210, the insulator 212, the insulator 214, and the insulator 216. Note that the conductor 218 functions as a plug or a wiring that is electrically connected to the capacitor 410 or the transistor 400. The conductor 218 can be formed using a material similar to that used for forming the conductor 428 and the conductor 430.

In particular, the conductor 218 in contact with the insulator 458, the insulator 212, and the insulator 214 is preferably a conductor inhibiting diffusion of copper or having a barrier property against oxygen, hydrogen, and water. In this structure, the transistor 400 and the transistor 200 can be completely separated by a layer inhibiting diffusion of copper or having a barrier property against oxygen, hydrogen, and water. In other words, diffusion of copper from the conductor 456 can be inhibited and diffusion of hydrogen from the transistor 400 to the transistor 200 can be prevented.

The transistor 200 and the insulator 280 are provided over the insulator 214. Note that the transistor 200 shown in FIG. 48 is just an example and is not limited to the structure shown therein; an appropriate transistor may be used in accordance with a circuit configuration or a driving method.

An insulator 282, an insulator 284, and an insulator 470 are stacked sequentially over the insulator 280. A conductor 244 and the like are embedded in an insulator 220, an insulator 222, an insulator 224, the insulator 280, the insulator 282, the insulator 284, and the insulator 470. A conductor 245 and the like which connect a conductor in an above layer are provided over the conductor such as the conductor 240a and the conductor 240b included in the transistor 200. Note that the conductor 244 functions as a plug or a wiring that is electrically connected to the capacitor 410, the transistor 200, or the transistor 400. The conductor 244 can be formed using a material similar to that used for forming the conductor 428 and the conductor 430.

A material having a barrier property against oxygen or hydrogen is preferably used for one or both of the insulator 282 and the insulator 284. Thus, the insulator 282 can be formed using a material similar to that used for forming the insulator 214. The insulator 284 can be formed using a material similar to that used for forming the insulator 212.

As the insulator 282, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

The insulator 284 is preferably formed using, for example, a film having a barrier property that prevents hydrogen or impurities from diffusing from a region where the capacitor 410 is formed into a region where the transistor 200 is formed. Therefore, the insulator 284 can be formed using a material similar to that used for forming the insulator 424.

As an example of the film having a barrier property against hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 400. Specifically, the film that prevents hydrogen diffusion is a film from which hydrogen is less likely to be released.

Therefore, a structure can be obtained in which the transistor 200 and the insulator 280 including the excess-oxygen region are positioned between a stacked-layer structure of the insulator 210, the insulator 212, and the insulator 214 and a stacked-layer structure of the insulator 282 and the insulator 284. The insulator 210, the insulator 212, the insulator 214, the insulator 282 and the insulator 284 have a barrier property that prevents diffusion of oxygen or impurities such as hydrogen and water.

Accordingly, oxygen released from the insulator 280 and the transistor 200 can be prevented from diffusing into the layer where the capacitor 410 is formed or the layer where the transistor 400 is formed. Furthermore, impurities such as hydrogen and water can be prevented from diffusing from a layer over the insulator 282 and a layer under the insulator 214 into the transistor 200.

That is, oxygen can be efficiently supplied from the excess-oxygen region of the insulator 280 to oxide where a channel is formed in the transistor 200, so that oxygen vacancies can be reduced. Moreover, oxygen vacancies can be prevented from being formed by impurities in the oxide where a channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

The capacitor 410 and a conductor 474 are provided over the insulator 470. The capacitor 410 is provided over the insulator 470 and includes the conductor 462, the insulator 480, the insulator 482, the insulator 484, and the conductor 466. Note that the conductor 474 functions as a plug or a wiring that is electrically connected to the capacitor 410, the transistor 200, or the transistor 400.

The conductor 462 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 462 is formed concurrently with another component such as a conductor, Cu (copper), Al (aluminum), or the like which is a low-resistance metal material may be used.

Note that the conductor 474 can be formed using a material similar to that used for forming the conductor 462 functioning as an electrode of the capacitor.

The insulator 480, the insulator 482, the insulator 484 are provided over the conductor 474 and the conductor 462. As the insulator 480, the insulator 482, and the insulator 484, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like may be used. Although a three-layer structure is shown in the drawings, a single layer, two-layer, or stacked-layer structure of four or more layers may be used.

For example, a material with high dielectric strength such as silicon oxynitride is preferably used as the insulator 480 and the insulator 484. In addition, as the insulator 484, a high dielectric constant (high-k) material such as aluminum oxide is preferably stacked with a material with high dielectric strength such as silicon oxynitride. With this structure, the capacitor 410 can have a sufficient capacitance owing to a high dielectric constant (high-k) insulator and can have a higher dielectric strength owing to an insulator with high dielectric strength for avoiding electrostatic breakdown.

The conductor 466 is provided over the conductor 462 with the insulator 480, the insulator 482, and the insulator 484 provided therebetween. Note that the conductor 466 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 466 is formed concurrently with another component such as a conductor, Cu (copper), Al (aluminum), or the like which is a low-resistance metal material may be used.

For example, the insulator 480, the insulator 482, and the insulator 484 are provided to cover the top surface and the side surface of the conductor 462 as illustrated in FIG. 48. Furthermore, the conductor 466 is provided to cover the top surface and the side surface of the conductor 462 with the insulator 480, the insulator 482, and the insulator 484 provided therebetween.

That is, a capacitance is formed also on the side surface of the conductor 462, so that a capacitance per projected area of a capacitor can be increased. Thus, the semiconductor device can be reduced in area, highly integrated, and miniaturized.

An insulator 460 is provided over the conductor 466 and the insulator 484. The insulator 460 can be formed using a material similar to that used for forming the insulator 420. The insulator 460 covering the capacitor 410 may function as a planarization film that covers a roughness thereunder.

The above is the description of the application example.

At least part of this embodiment can be implemented in combination with any of the other embodiments described in this specification as appropriate.

Embodiment 5

In this embodiment, a display device that includes the semiconductor device of one embodiment of the present invention is described with reference to FIGS. 49A to 49C.
<5. Circuit Configuration of Display Device>

The display device illustrated in FIG. 49A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (image signal) from which a data signal is derived, as well as a signal for driving the shift register, through the terminal portion 507. The source driver 504b has a function of generating a data signal to be written to the pixel circuit 501 which is based on the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches, for example. The source driver 504b can output, as the data signals, signals obtained by time-dividing the image signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n in accordance with the potential of the scan line GL_m.

Figure 49A:
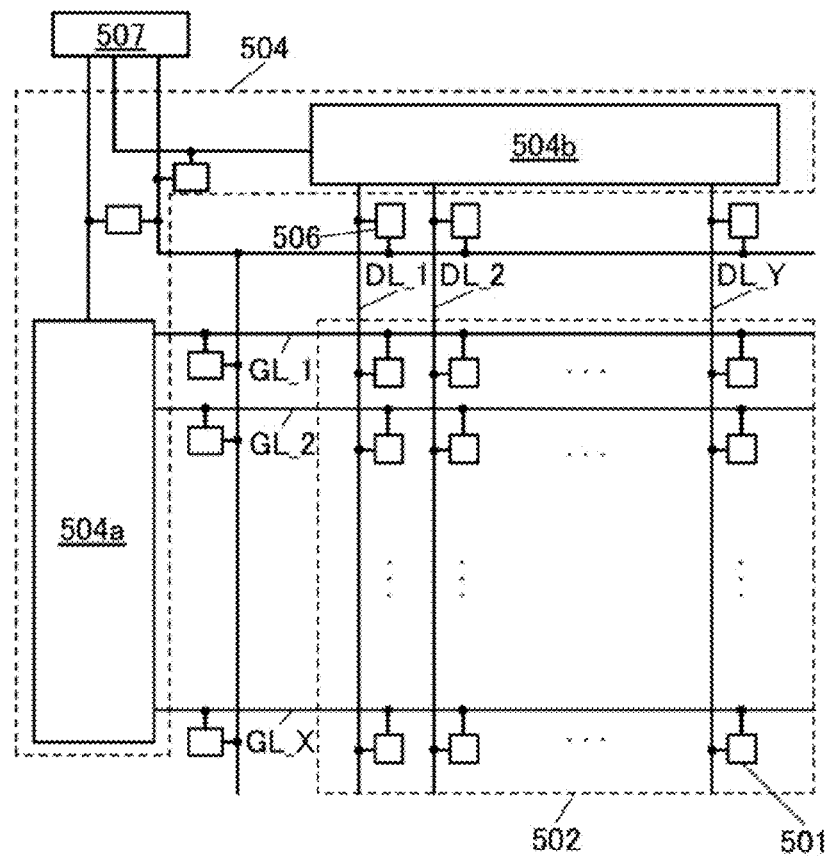
FIGS. 49A to 49C are a block diagram and circuit diagrams illustrating a display device.

The protection circuit 506 in FIG. 49A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and image signals to the display device from external circuits.

The protection circuit 506 is a circuit that electrically connects a wiring connected to the protection circuit to another wiring when a potential out of a certain range is applied to the wiring connected to the protection circuit.

As shown in FIG. 49A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 49A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 49B:
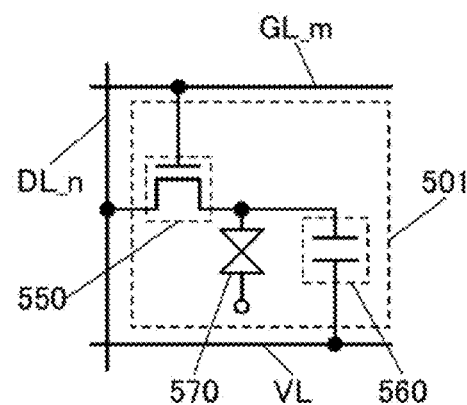

Each of the plurality of pixel circuits 501 in FIG. 49A can have the structure illustrated in FIG. 49B, for example.

The pixel circuit 501 in FIG. 49B includes a liquid crystal element 570, a transistor 550, and a capacitor 560. As the transistor 550, any of the transistors described in the above embodiment, for example, can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the method of driving the display device include an electrically controlled birefringence (ECB) mode, a polymer-dispersed liquid crystal (PDLC) mode, a polymer network liquid crystal (PNLC) mode, and a guest-host mode. A variety of liquid crystal elements and the driving methods thereof can be used.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 49B, the pixel circuits 501 are sequentially selected row by row by the gate driver 504a illustrated in FIG. 49A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 49C:
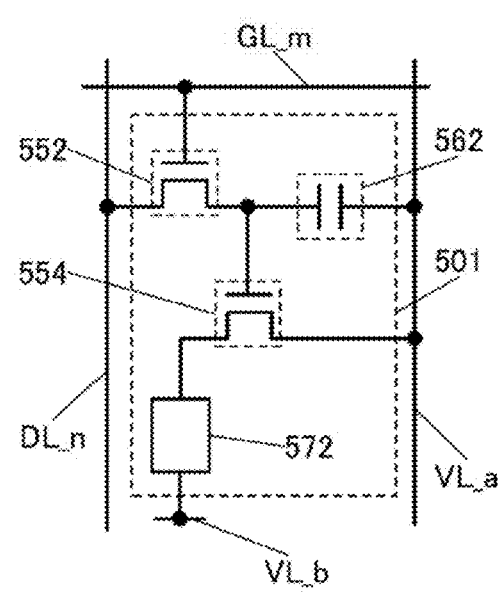

Alternatively, each of the plurality of pixel circuits 501 in FIG. 49A can have the structure illustrated in FIG. 49C, for example.

The pixel circuit 501 illustrated in FIG. 49C includes transistors 552 and 554, a capacitor 562, and a light-emitting element 572. Any of the transistors described in the above embodiment, for example, can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) can be used, for example. Note that the light-emitting element 572 is not limited to an organic EL element; an inorganic EL element including an inorganic material may be used.

Note that a high power supply potential VDD is supplied to one of the potential supply line VL_a and the potential supply line VL_b, and a low power supply potential VSS is supplied to the other.

For example, in the display device including the pixel circuit 501 in FIG. 49C, the pixel circuits 501 are sequentially selected row by row by the gate driver 504a illustrated in FIG. 49A, whereby the transistor 552 is turned on and a data signal is written.

When the transistor 552 is turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with luminance corresponding to the amount of flowing current. This operation is sequentially performed row by row; thus, an image is displayed.

At least part of this embodiment can be implemented in combination with any of the other embodiments described in this specification as appropriate.

Embodiment 6

In this embodiment, circuit configuration examples to which the transistors described in the above embodiments can be applied will be described with reference to FIGS. 50A to 50C, FIGS. 51A to 51C, FIGS. 52A and 52B, and FIGS. 53A and 53B.

<6. Configuration Example of Inverter Circuit>

Figure 50A:
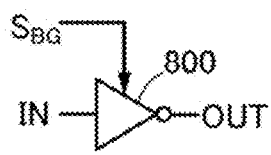
FIGS. 50A to 50C are circuit diagrams and a timing chart illustrating one embodiment of the present invention.

FIG. 50A is a circuit diagram of an inverter which can be used for a shift register, a buffer, or the like included in the driver circuit. An inverter 800 outputs a signal whose logic is inverted from the logic of a signal supplied to an input terminal IN to an output terminal OUT. The inverter 800 includes a plurality of OS transistors. A signal $S_{BG}$ can switch electrical characteristics of the OS transistors.

Figure 50B:
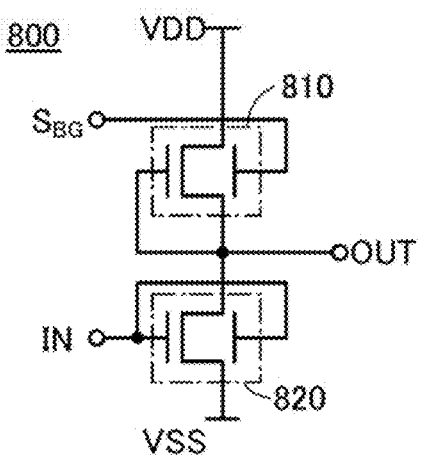

FIG. 50B illustrates an example of the inverter 800. The inverter 800 includes OS transistors 810 and 820. The inverter 800 can be formed using only n-channel transistors; thus, the inverter 800 can be formed at lower cost than an inverter formed using a complementary metal oxide semiconductor (i.e., a CMOS inverter).

Note that the inverter 800 including the OS transistors can be provided over a CMOS circuit including Si transistors. Since the inverter 800 can be provided so as to overlap with the CMOS circuit, no additional area is required for the inverter 800, and thus, an increase in the circuit area can be suppressed.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal $S_{BG}$. The first terminal of the OS transistor 810 is connected to a wiring which supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring which supplies a voltage VSS.

Figure 50C:
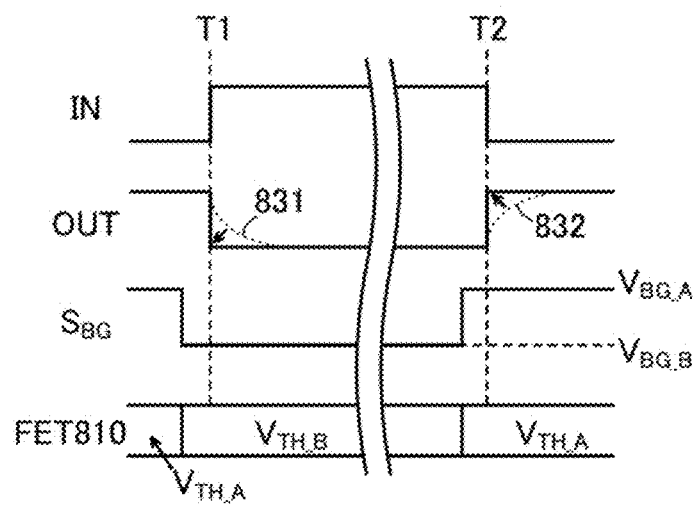

FIG. 50C is a timing chart illustrating the operation of the inverter 800. The timing chart in FIG. 50C illustrates changes of a signal waveform of the input terminal IN, a signal waveform of the output terminal OUT, a signal waveform of the signal $S_{BG}$, and the threshold voltage of the OS transistor 810.

The signal $S_{BG}$ can be supplied to the second gate of the OS transistor 810 to control the threshold voltage of the OS transistor 810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_B}$ when the voltage $V_{BG\_B}$ is applied to the second gate.

Figure 51A:
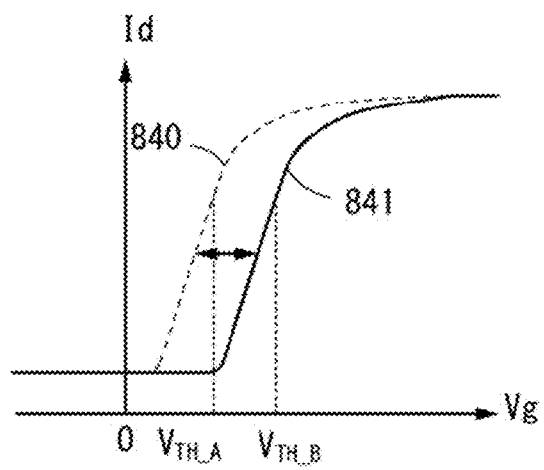
FIGS. 51A to 51C are a graph and circuit diagrams illustrating one embodiment of the present invention.

To visualize the above description, FIG. 51A shows an $I_d$-$V_g$ curve, which is one of indicators of the transistor's electrical characteristics.

When a high voltage such as the voltage $V_{BG\_A}$ is applied to the second gate, the electrical characteristics of the OS transistor 810 can be shifted to match a curve shown by a dashed line 840 in FIG. 51A. When a low voltage such as the voltage $V_{BG\_B}$ is applied to the second gate, the electrical characteristics of the OS transistor 810 can be shifted to match a curve shown by a solid line 841 in FIG. 51A. As shown in FIG. 51A, switching the signal $S_{BG}$ between the voltage $V_{BG\_A}$ and the voltage $V_{BG\_B}$ enables the threshold voltage of the OS transistor 810 to be shifted in the positive direction or the negative direction.

Figure 51B:
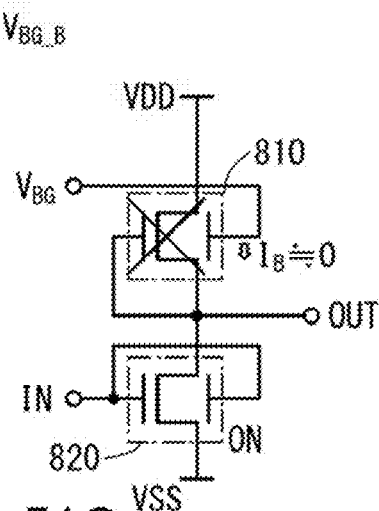

The shift of the threshold voltage in the positive direction toward the threshold voltage $V_{TH\_B}$ can make current less likely to flow in the OS transistor 810. FIG. 51B visualizes the state.

As illustrated in FIG. 51B, a current $I_B$ that flows in the OS transistor 810 can be extremely low. Thus, when a signal supplied to the input terminal IN is at a high level and the OS transistor 820 is on (ON), the voltage of the output terminal OUT can drop sharply.

Since a state in which a current is less likely to flow in the OS transistor 810 as illustrated in FIG. 51B can be obtained, a signal waveform 831 of the output terminal in the timing chart in FIG. 50C can be made steep. Shoot-through current between the wiring that supplies the voltage VDD and the wiring that supplies the voltage VSS can be low, leading to low-power operation.

Figure 51C:
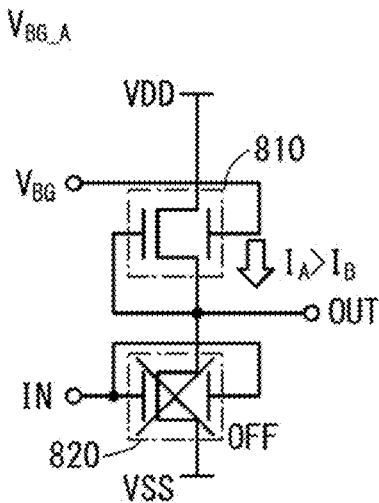

The shift of the threshold voltage in the negative direction toward the threshold voltage $V_{TH\_A}$ can make current flow easily in the OS transistor 810. FIG. 51C visualizes the state. As illustrated in FIG. 51C, a current IA flowing at this time can be higher than at least the current $I_B$. Thus, when a signal supplied to the input terminal IN is at a low level and the OS transistor 820 is off (OFF), the voltage of the output terminal OUT can be increased sharply. Since a state in which current is likely to flow in the OS transistor 810 as shown in FIG. 51C can be obtained, a signal waveform 832 of the output terminal in the timing chart in FIG. 50C can be made steep.

Note that the threshold voltage of the OS transistor 810 is preferably controlled by the signal $S_{BG}$ before the state of the OS transistor 820 is switched, i.e., before Time T1 or T2. For example, as in FIG. 50C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 50C, it is preferable that the threshold voltage of the OS transistor 810 be switched from the threshold voltage $V_{TH\_B}$ to the threshold voltage $V_{T\_A}$ before time T2 at which the level of the signal supplied to the input terminal IN is switched to a low level.

Figure 52A:
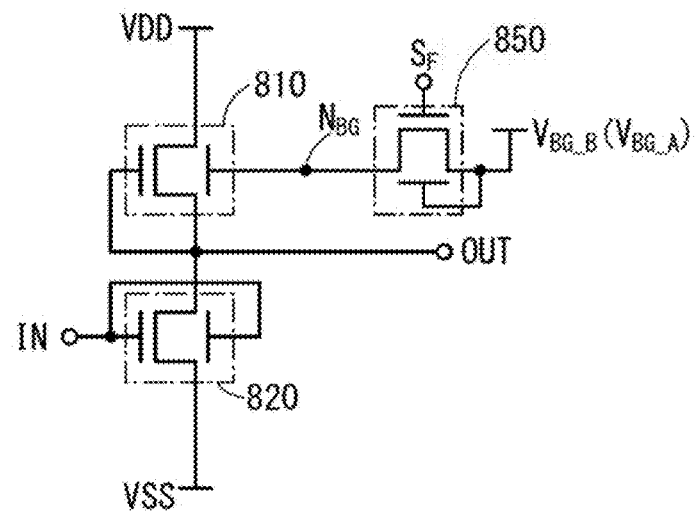
FIGS. 52A and 52B are a circuit diagram and a timing chart illustrating one embodiment of the present invention.

Although the timing chart in FIG. 50C shows the structure in which the level of the signal $S_{BG}$ is switched in accordance with the signal supplied to the input terminal IN, a different structure may be employed in which voltage for controlling the threshold voltage is held by the second gate of the OS transistor 810 in a floating state, for example. FIG. 52A illustrates an example of such a circuit configuration.

The circuit configuration in FIG. 52A is the same as that in FIG. 50B, except that an OS transistor 850 is added. A first terminal of the OS transistor 850 is connected to the second gate of the OS transistor 810. A second terminal of the OS transistor 850 is connected to a wiring which supplies the voltage $V_{BG\_B}$ (or the voltage $V_{BG\_A}$). A first gate of the OS transistor 850 is connected to a wiring which supplies a signal $S_F$. A second gate of the OS transistor 850 is connected to the wiring which supplies the voltage $V_{BG\_B}$ (or the voltage $V_{BG\_A}$).

Figure 52B:
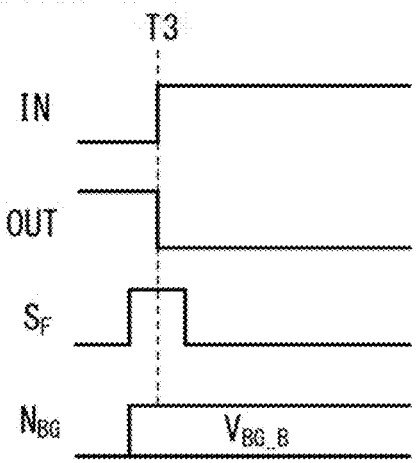

The operation with the circuit configuration in FIG. 52A will be described with reference to a timing chart in FIG. 52B.

The voltage for controlling the threshold voltage of the OS transistor 810 is supplied to the second gate of the OS transistor 810 before Time T3 at which the level of the signal supplied to the input terminal IN is changed to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held by the node $N_{BG}$ can be retained while the OS transistor 850 remains off. Therefore, the number of times of operation of supplying the voltage $V_{BG\_B}$ to the second gate of the OS transistor 850 can be reduced and accordingly the power consumed to rewrite the voltage $V_{BG\_B}$ can be reduced.

Figure 53A:
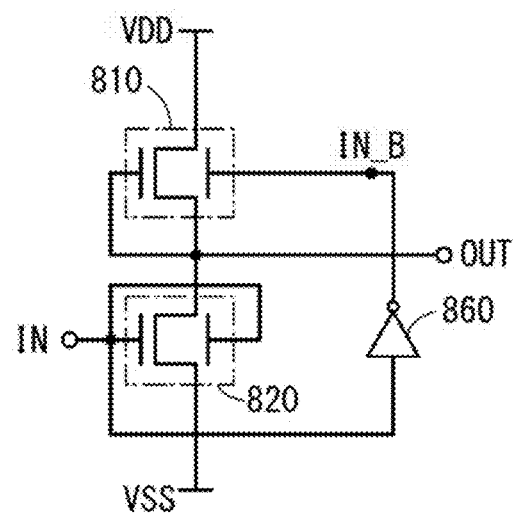
FIGS. 53A and 53B are a circuit diagram and a timing chart illustrating one embodiment of the present invention.

Although FIGS. 50B and 52A illustrate the case where the voltage is supplied to the second gate of the OS transistor 810 by control from the outside, a different configuration in which voltage for controlling the threshold voltage is generated on the basis of the signal supplied to the input terminal IN and supplied to the second gate of the OS transistor 810 may be employed, for example. FIG. 53A illustrates an example of such a circuit structure.

The circuit configuration in FIG. 53A is the same as that in FIG. 50B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit structure in FIG. 53A will be described with reference to a timing chart in FIG. 53B. The timing chart in FIG. 53B illustrates changes of a signal waveform of the input terminal IN, a signal waveform of the output terminal OUT, an output waveform IN_B of the CMOS inverter 860, and a threshold voltage of the OS transistor 810.

The output waveform IN_B which corresponds to a signal whose logic is inverted from the logic of the signal supplied to the input terminal IN can be used as a signal that controls the threshold voltage of the OS transistor 810. Therefore, the threshold voltage of the OS transistor 810 can be controlled as described with reference to FIGS. 51A to 51C. For example, the signal supplied to the input terminal IN is at a high level and the OS transistor 820 is turned on at time T4 in FIG. 53B. At this time, the output waveform IN_B is at a low level. Accordingly, current can be made less likely to flow in the OS transistor 810; thus, the voltage of the output terminal OUT can be sharply decreased.

Figure 53B:
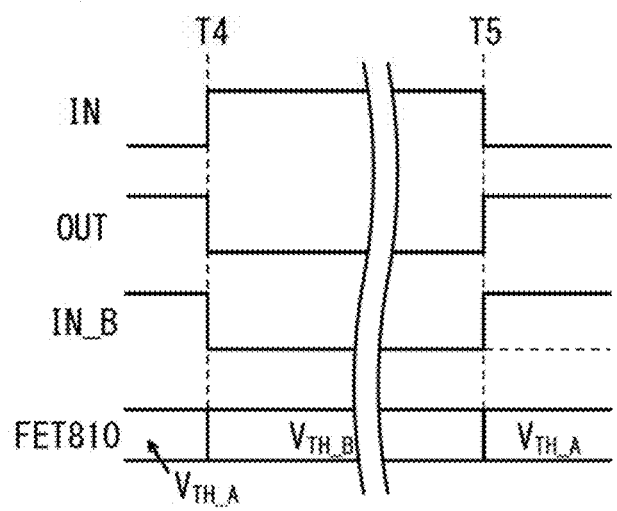

Moreover, the signal supplied to the input terminal IN is at a low level and the OS transistor 820 is turned off at Time T5 in FIG. 53B. At this time, the output waveform IN_B is at a high level. Accordingly, current can easily flow in the OS transistor 810; thus, a rise in the voltage of the output terminal OUT can be made steep.

As described above, in the structure of the inverter including the OS transistor in this embodiment, the voltage of the back gate is switched in accordance with the logic of the signal supplied to the input terminal IN. In such a structure, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

At least part of this embodiment can be implemented in combination with any of the other embodiments described in this specification as appropriate.

Embodiment 7

In this embodiment, examples of a semiconductor device in which the transistor including an oxide semiconductor (OS transistor) described in any of the above embodiments is used in a plurality of circuits will be described with reference to FIGS. 54A to 54E, FIGS. 55A and 55B, FIGS. 56A and 56B, and FIGS. 57A to 57C.

<7. Circuit Configuration Example of Semiconductor Device>

Figure 54A:
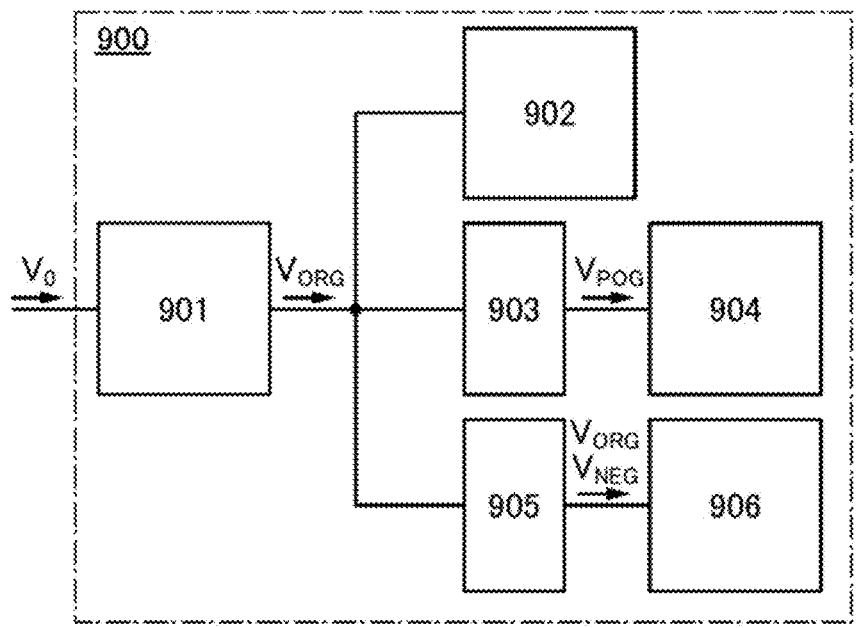
FIGS. 54A to 54E are a block diagram, circuit diagrams, and waveform diagrams illustrating one embodiment of the present invention.

FIG. 54A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without supply of a plurality of power supply voltages from the outside.

The circuits 902, 904, and 906 operate with different power supply voltages. For example, the power supply voltage of the circuit 902 is a voltage applied on the basis of the voltage $V_{ORG}$ and the voltage $V_{SS}$ ($V_{ORG}>V_{SS}$). For example, the power supply voltage of the circuit 904 is a voltage applied on the basis of the voltage $V_{POG}$ and the voltage $V_{SS}$ ($V_{POG}>V_{SS}$). For example, the power supply voltages of the circuit 906 are voltages applied on the basis of the voltage $V_{ORG}$, the voltage $V_{SS}$, and a voltage $V_{NEG}$ ($V_{ORG}>V_{SS}>V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 54B:
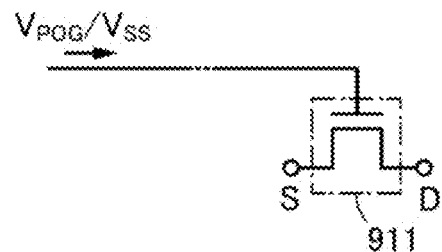
Figure 54C:
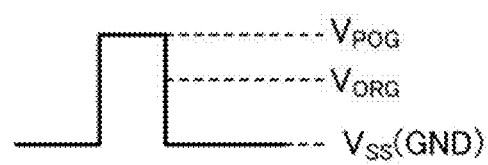

FIG. 54B illustrates an example of the circuit 904 that operates with the voltage $V_{POG}$ and FIG. 54C illustrates an example of a waveform of a signal for operating the circuit 904.

FIG. 54B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ to turn on the transistor 911 and on the basis of the voltage $V_{SS}$ to turn off the transistor 911. As illustrated in FIG. 54C, the voltage $V_{POG}$ is higher than the voltage $V_{ORG}$. Thus, a source (S) and a drain (D) of the transistor 911 can be electrically connected to each other more surely. As a result, the frequency of malfunction of the circuit 904 can be reduced.

Figure 54D:
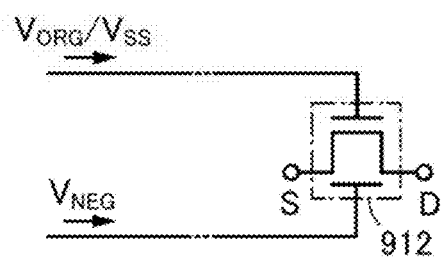
Figure 54E:
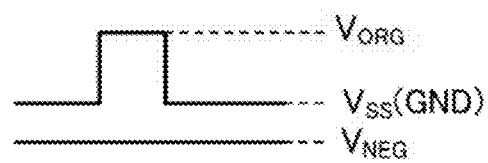

FIG. 54D illustrates an example of the circuit 906 that operates with the voltage $V_{NEG}$ and FIG. 54E illustrates an example of a waveform of a signal for operating the circuit 906.

FIG. 54D illustrates a transistor 912 having a back gate. A signal supplied to a gate of the transistor 912 is generated on the basis of, for example, the voltage $V_{ORG}$ and the voltage $V_{SS}$. The signal is generated on the basis of the voltage $V_{ORG}$ to turn on the transistor 912 and on the basis of the voltage $V_{SS}$ to turn off the transistor 912. A signal supplied to the back gate of the transistor 912 is generated on the basis of the voltage $V_{NEG}$. As illustrated in FIG. 54E, the voltage $V_{NEG}$ is lower than the voltage $V_{SS}$ (GND). Thus, the threshold voltage of the transistor 912 can be controlled to shift in the positive direction. Thus, the transistor 912 can be surely turned off and the amount of current flowing between the source (S) and the drain (D) can be small. As a result, the frequency of malfunction of the circuit 906 can be reduced and the power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may also be supplied to the back gate of the transistor 912.

Figure 55A:
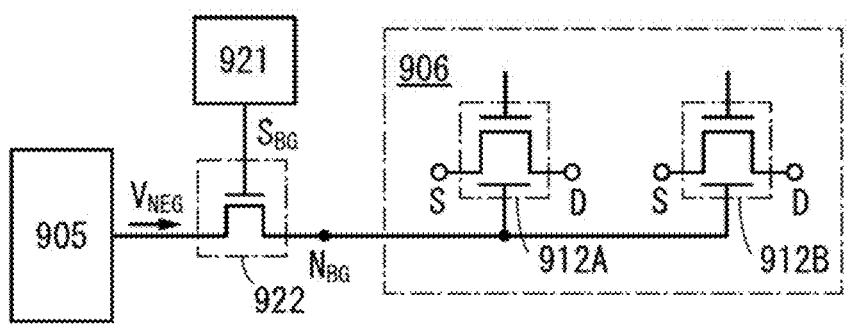
FIGS. 55A and 55B are a circuit diagram and a timing chart illustrating one embodiment of the present invention.
Figure 55B:
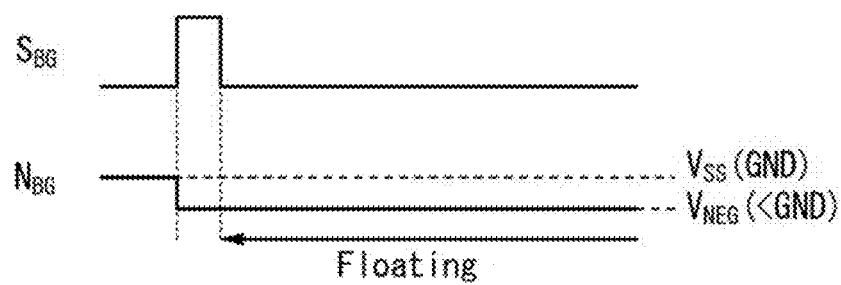

FIGS. 55A and 55B illustrate a modification example of FIGS. 54D and 54E.

In a circuit diagram illustrated in FIG. 55A, a transistor 922 whose conduction state can be controlled by a control circuit 921 is provided between the voltage generation circuit 905 and the circuit 906. The transistor 922 is an n-channel OS transistor. A control signal $S_{BG}$ output from the control circuit 921 is a signal for controlling the conduction state of the transistor 922. Transistors 912A and 912B included in the circuit 906 are OS transistors like the transistor 922.

A timing chart in FIG. 55B shows changes in the potential of the control signal $S_{BG}$ and the potential of a node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ which has been supplied can be held.

Figure 56A:
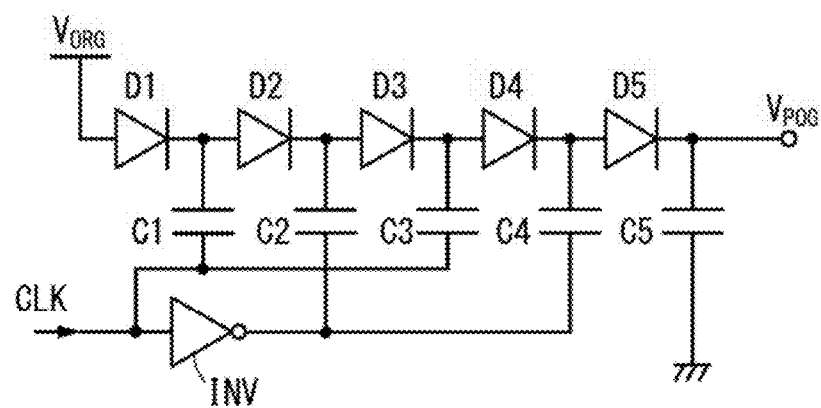
FIGS. 56A and 56B are circuit diagrams each illustrating one embodiment of the present invention.

FIG. 56A illustrates an example of a circuit configuration applicable to the above-described voltage generation circuit 903. The voltage generation circuit 903 illustrated in FIG. 56A is a five-stage charge pump including diodes D1 to D5, capacitors C1 to C5, and an inverter INV. A clock signal CLK is supplied to the capacitors C1 to C5 directly or through the inverter INV. When the power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that a forward voltage of the diodes D1 to D5 is 0 V. A desired voltage $V_{POG}$ can be obtained when the number of stages of the charge pump is changed.

Figure 56B:
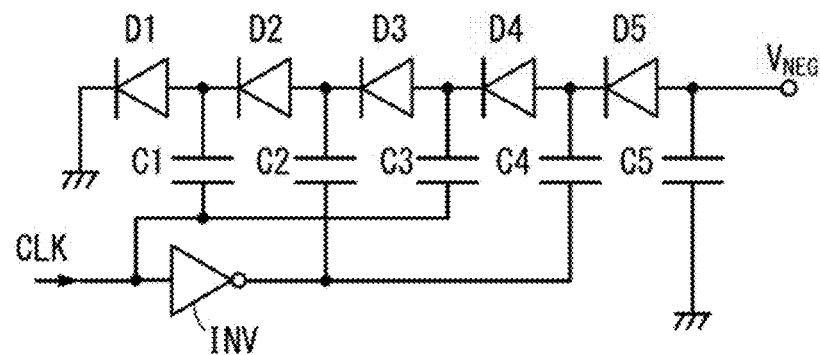

FIG. 56B illustrates an example of a circuit configuration applicable to the above-described voltage generation circuit 905. The voltage generation circuit 905 illustrated in FIG. 56B is a four-stage charge pump including the diodes D1 to D5, the capacitors C1 to C5, and the inverter INV. A clock signal CLK is supplied to the capacitors C1 to C5 directly or through the inverter INV. When the power supply voltage of the inverter INV is a voltage applied on the basis of the voltage $V_{ORG}$ and the voltage $V_{SS}$, the voltage $V_{NEG}$, which has been reduced from the ground voltage, i.e., the voltage $V_{SS}$ to a negative voltage having a negatively quadrupled value of the voltage $V_{ORG}$ by application of the clock signal CLK, can be obtained. Note that a forward voltage of the diodes D1 to D5 is 0 V. A desired voltage $V_{NEG}$ can be obtained when the number of stages of the charge pump is changed.

Figure 57A:
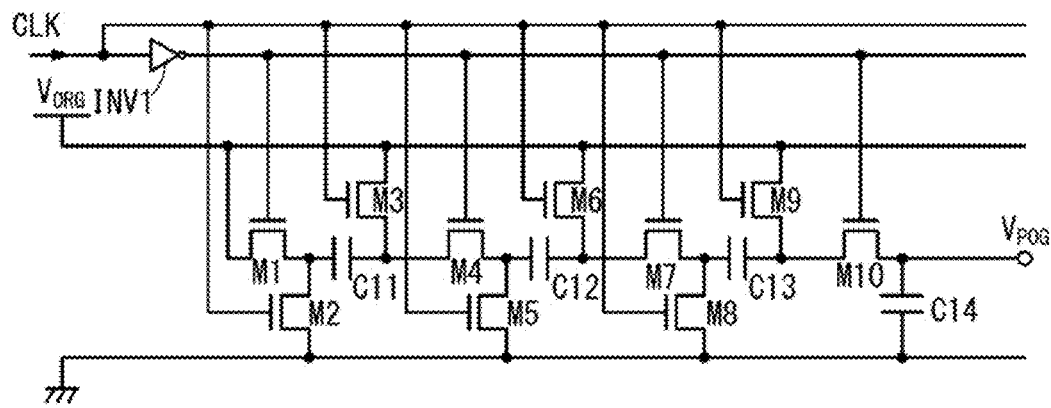
FIGS. 57A to 57C are circuit diagrams each illustrating one embodiment of the present invention.
Figure 57B:
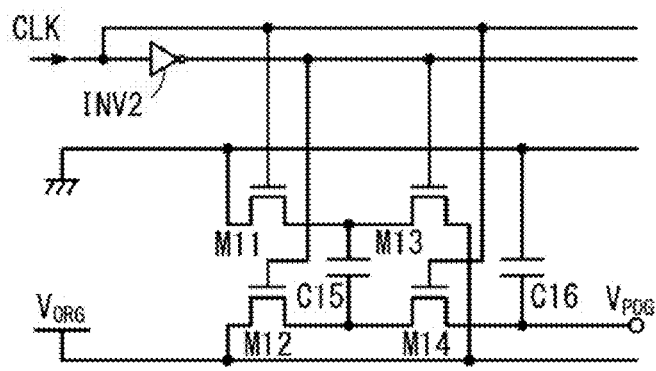
Figure 57C:
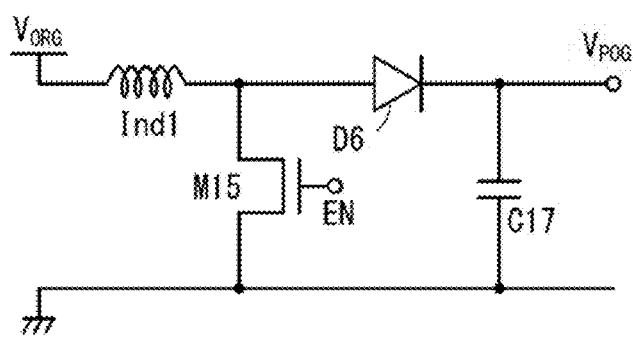

The circuit configuration of the voltage generation circuit 903 is not limited to the configuration in the circuit diagram illustrated in FIG. 56A. Modification examples of the voltage generation circuit 903 are illustrated in FIGS. 57A to 57C. Note that further modification examples of the voltage generation circuit 903 can be realized by changing voltages supplied to wirings or arrangement of elements in voltage generation circuits 903A to 903C illustrated in FIGS. 57A to 57C.

A voltage generation circuit 903A illustrated in FIG. 57A includes transistors M1 to M10, capacitors C11 to C14, and an inverter INV1. The clock signal CLK is supplied to gates of the transistors M1 to M10 directly or through the inverter INV1. The voltage $V_{POG}$ can be obtained by increasing the voltage $V_{ORG}$ by a voltage four times the potential difference between the voltage $V_{ORG}$ and the voltage $V_{SS}$ with the application of the clock signal CLK. A desired voltage $V_{POG}$ can be obtained when the number of stages is changed. In the voltage generation circuit 903A in FIG. 57A, off-state current of each of the transistors M1 to M10 can be low when the transistors M1 to M10 are OS transistors, and leakage of charge held in the capacitors C11 to C14 can be suppressed. Accordingly, raising from the voltage $V_{ORG}$ to the voltage $V_{POG}$ can be efficiently performed.

The voltage generation circuit 903B illustrated in FIG. 57B includes transistors M11 to M14, capacitors C15 and C16, and an inverter INV2. The clock signal CLK is supplied to gates of the transistors M11 to M14 directly or through the inverter INV2. The voltage $V_{POG}$ can be obtained by increasing the voltage $V_{ORG}$ by a voltage twice the potential difference between the voltage $V_{ORG}$ and the voltage $V_{SS}$ with the application of the clock signal CLK. In the voltage generation circuit 903B in FIG. 57B, off-state current of each of the transistors M11 to M14 can be low when the transistors M11 to M14 are OS transistors, and leakage of charge held in the capacitors C15 and C16 can be suppressed. Accordingly, raising from the voltage $V_{ORG}$ to the voltage $V_{POG}$ can be efficiently performed.

A voltage generation circuit 903C shown in FIG. 57C includes an inductor Ind1, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 57C increases the voltage using the inductor Ind1, the voltage can be efficiently increased.

As described above, in any of the structures of this embodiment, a voltage required for circuits included in a semiconductor device can be internally generated. Thus, in the semiconductor device, the number of power supply voltages supplied from the outside can be reduced.

At least part of this embodiment can be implemented in combination with any of the other embodiments described in this specification as appropriate.

Embodiment 8

In this embodiment, a display module and electronic devices, each of which includes a semiconductor device of one embodiment of the present invention, will be described with reference to FIG. 58, FIGS. 59A to 59E, FIGS. 60A to 60G, and FIGS. 61A and 61B.

<8-1. Display Module>

Figure 58:
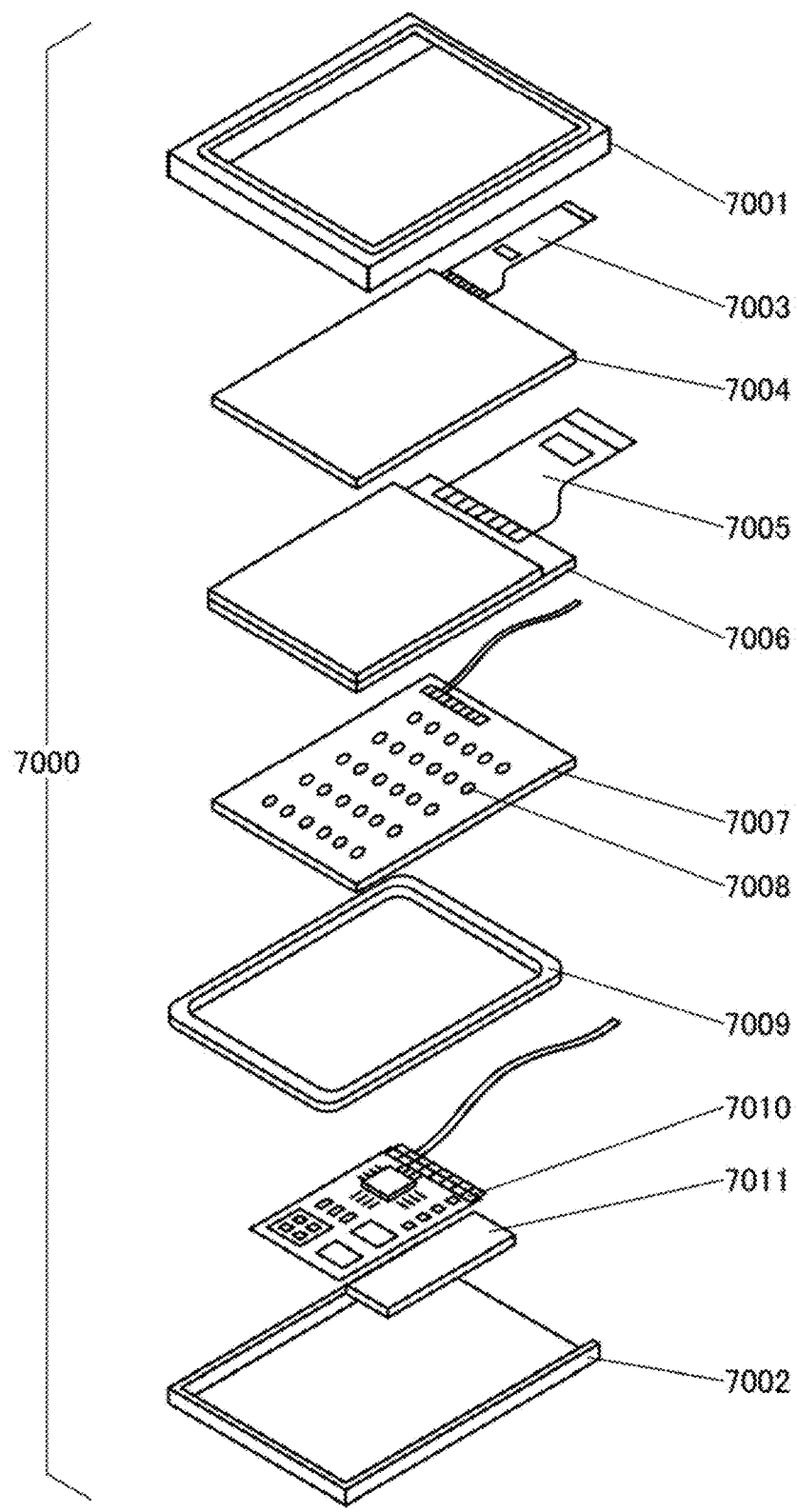
FIG. 58 illustrates a display module.

In a display module 7000 illustrated in FIG. 58, a touch panel 7004 connected to an FPC 7003, a display panel 7006 connected to an FPC 7005, a backlight 7007, a frame 7009, a printed board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 58, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed board 7010. The frame 7009 may also function as a radiator plate.

The printed board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

<8-2. Electronic Device 1>

Next, FIGS. 59A to 59E illustrate examples of electronic devices.

Figure 59A:
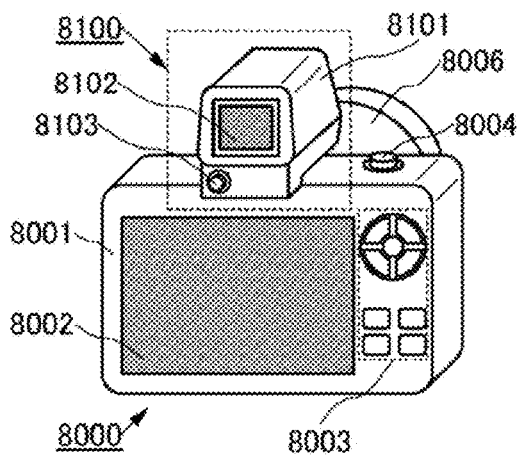
FIGS. 59A to 59E illustrate electronic devices.

FIG. 59A is an external view of a camera 8000 to which a finder 8100 is attached.

The camera 8000 includes a housing 8001, a display portion 8002, operation buttons 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 which serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 functions as a power supply button. With the button 8103, the display portion 8102 can be turned on and off.

A display device of one embodiment of the present invention can be used in the display portion 8002 of the camera 8000 and the display portion 8102 of the finder 8100.

Although the camera 8000 and the finder 8100 are separate and detachable electronic devices in FIG. 59A, the housing 8001 of the camera 8000 may include a finder having a display device.

Figure 59B:
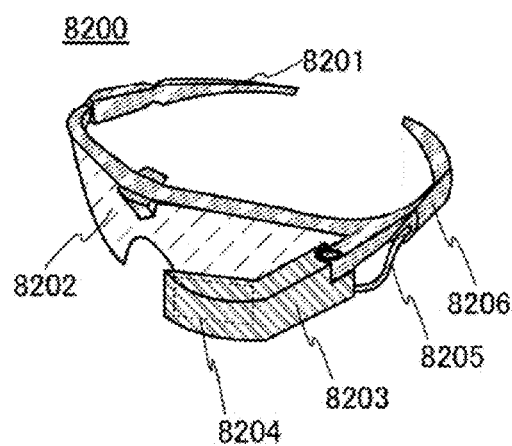

FIG. 59B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 59C:
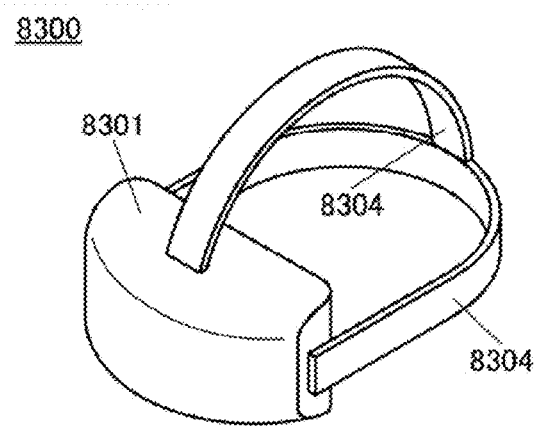
Figure 59D:
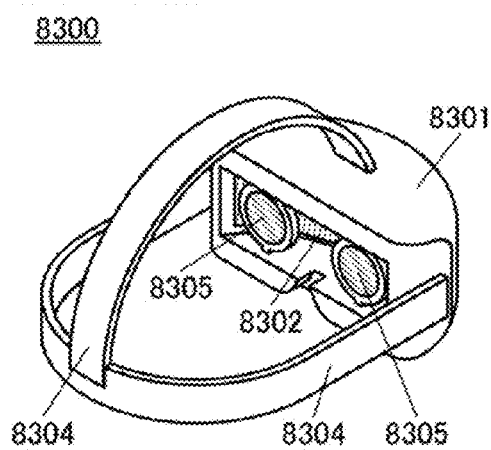
Figure 59E:
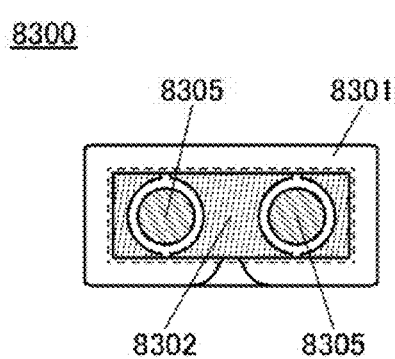

FIGS. 59C to 59E are external views of a head-mounted display 8300. The head-mounted display 8300 includes a housing 8301, a display portion 8302, fixing bands 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 59E, the user does not perceive pixels, and thus a more realistic image can be displayed.

<8-3. Electronic Device 2>

Next, FIGS. 59A to 59E illustrate examples of electronic devices that are different from those illustrated in FIGS. 60A to 60G.

Electronic devices illustrated in FIGS. 60A to 60G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 60A to 60G can have a variety of functions. For example, a function of displaying a lot of information (e.g., a still image, a moving image, and a text image) on a display portion; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; a function of reading a program or data stored in a memory medium and displaying the program or data on a display portion. Note that functions which can be provided for the electronic devices illustrated in FIGS. 60A to 60G are not limited them, and the electronic devices can have a variety of functions. Although not illustrated in FIGS. 60A to 60G, the electronic devices may each have a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 60A to 60G will be described in detail below.

Figure 60A:
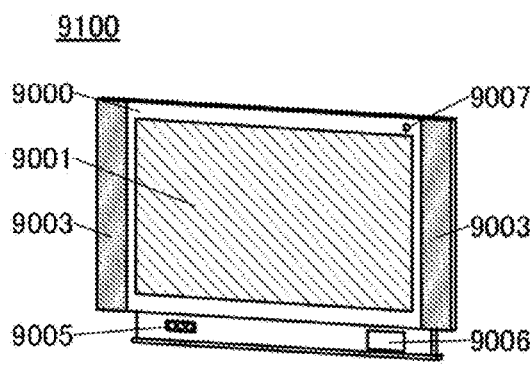
FIGS. 60A to 60G illustrate electronic devices.

FIG. 60A is a perspective view illustrating a television device 9100. The television device 9100 can include the display portion 9001 having a large screen size of, for example, 50 inches or more, or 100 inches or more.

Figure 60D:
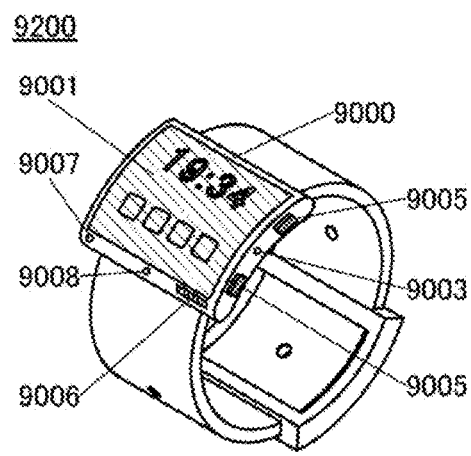
Figure 60B:
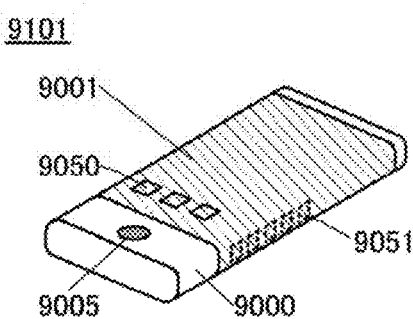

FIG. 60B is a perspective view of a portable information terminal 9101. The portable information terminal 9101 functions as, for example, one or more of a telephone set, a notebook, an information browsing system, and the like. Specifically, the portable information terminal can be used as a smartphone. Note that the portable information terminal 9101 may include the speaker 9003, the connection terminal 9006, the sensor 9007, or the like. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 60E:
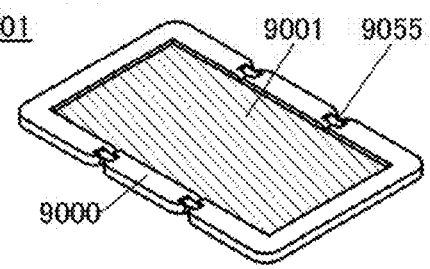
Figure 60C:
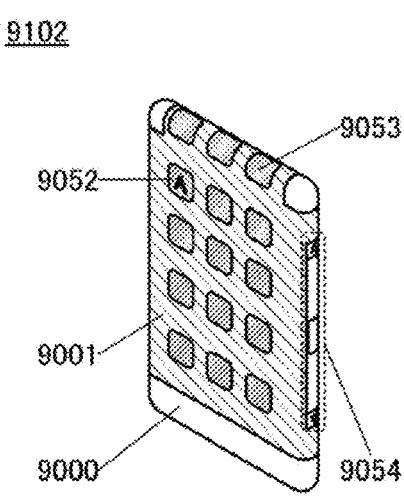

FIG. 60C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 60D is a perspective view illustrating a wrist-watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 60F:
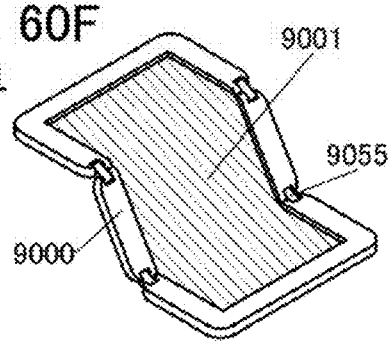
Figure 60G:
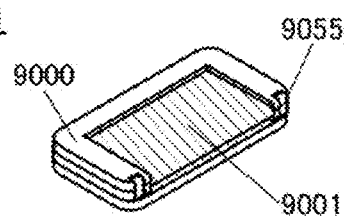

FIGS. 60E to 60G are perspective views of a foldable portable information terminal 9201. FIG. 60E is a perspective view of the foldable portable information terminal 9201 that is opened. FIG. 60F is a perspective view of the foldable portable information terminal 9201 that is being opened or being folded. FIG. 60G is a perspective view of the foldable portable information terminal 9201 that is folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

Figure 61A:
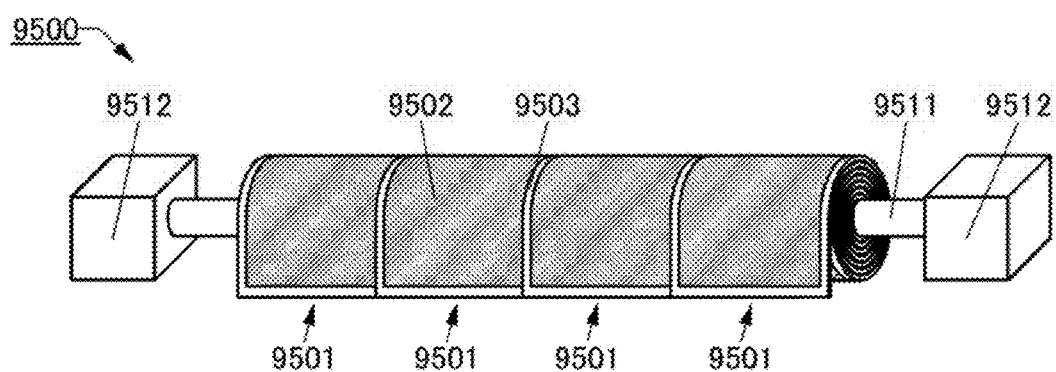
FIGS. 61A and 61B are perspective views illustrating a display device.
Figure 61B:
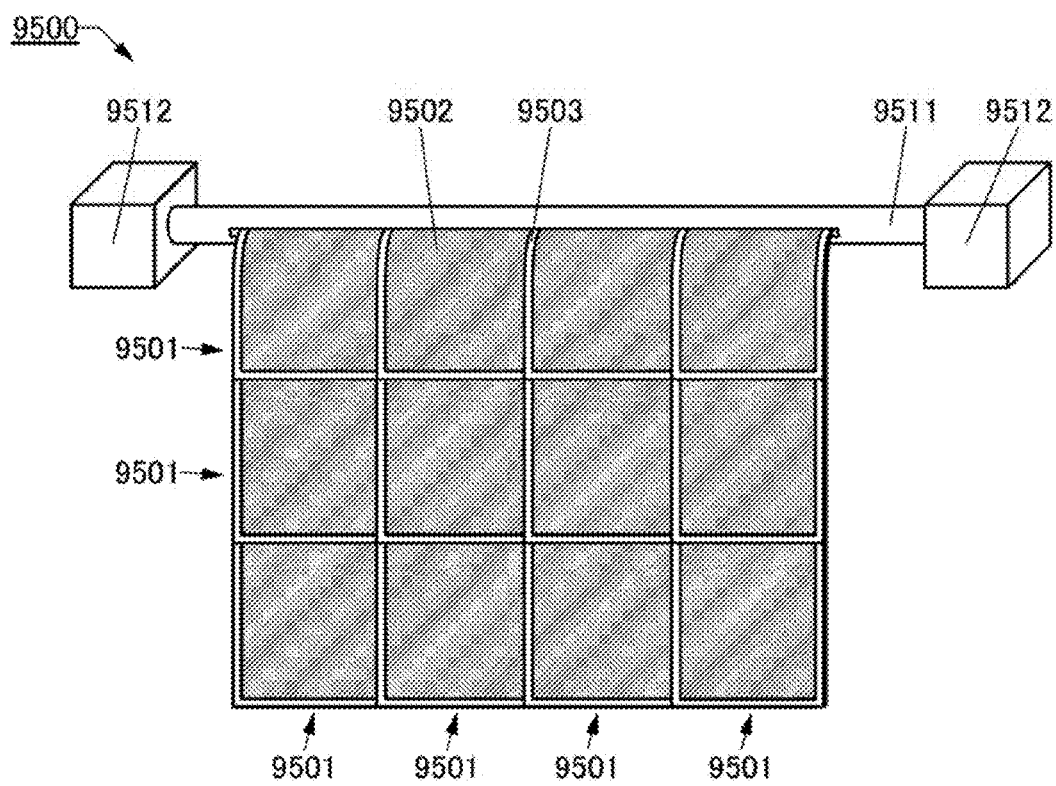
Figure 62:
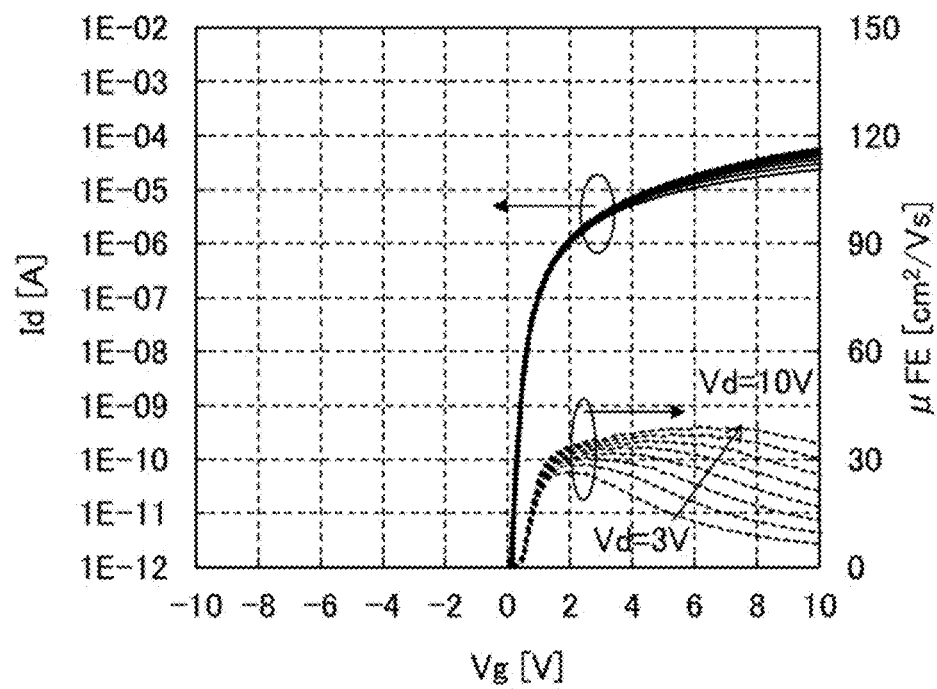
FIG. 62 shows $I_d$-$V_g$ characteristics of transistors in Example.
Figure 63:
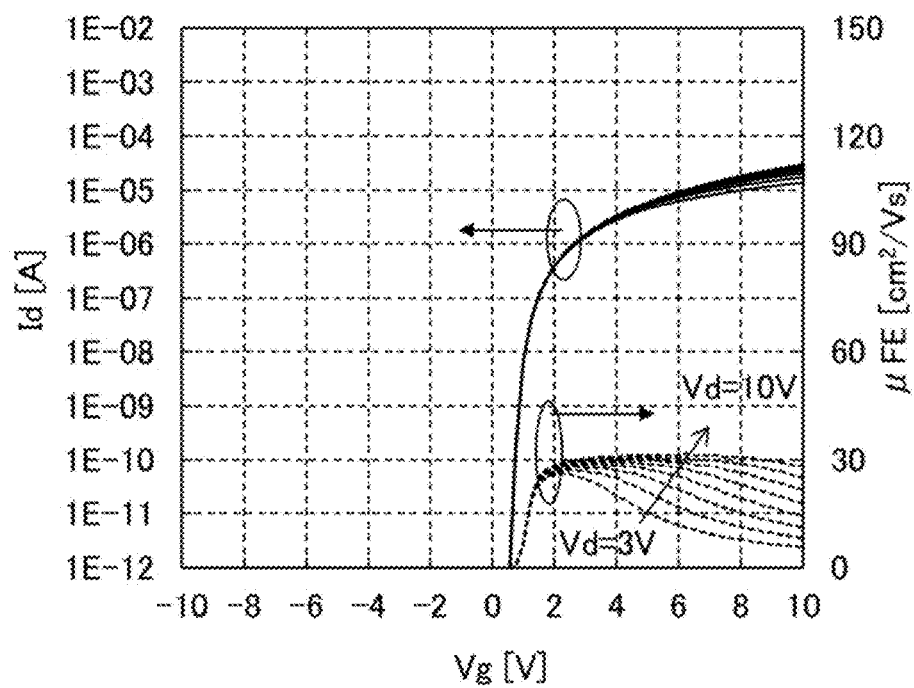
FIG. 63 shows $I_d$-$V_g$ characteristics of transistors in Example.
Figure 64:
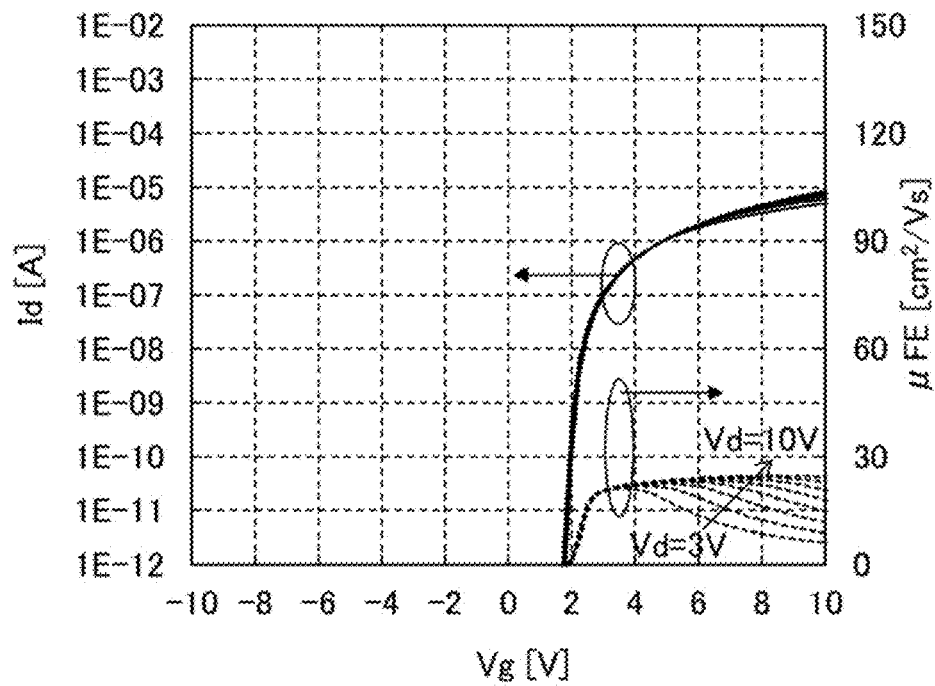
FIG. 64 shows $I_d$-$V_g$ characteristics of transistors in Example.
Figure 65:
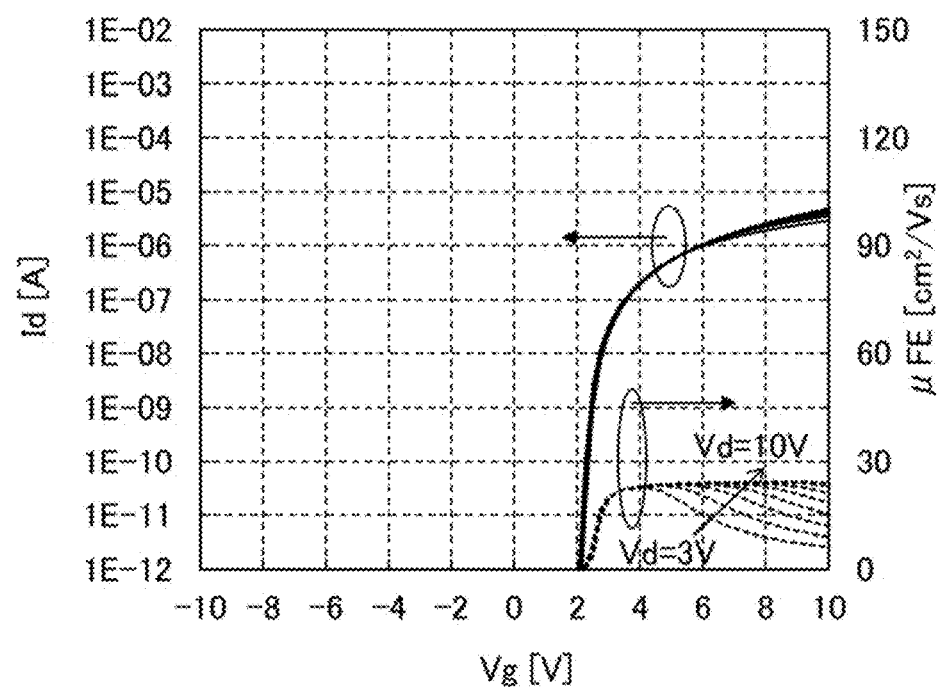
FIG. 65 shows $I_d$-$V_g$ characteristics of transistors in Example.

Next, FIGS. 61A and 61B illustrate examples of electronic devices that are different from those illustrated in FIGS. 59A to 59E and FIGS. 60A to 60G. FIGS. 61A and 61B are perspective views of a display device including a plurality of display panels. Note that the plurality of display panels are wound in the perspective view in FIG. 61A and are unwound in the perspective view in FIG. 61B.

A display device 9500 illustrated in FIGS. 61A and 61B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 61A and 61B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the semiconductor device of one embodiment of the present invention can also be used for an electronic device that does not have a display portion.

At least part of this embodiment can be implemented in combination with any of the other embodiments described in this specification as appropriate.

Example

In this example, samples (Samples C1 to C4, Sample D1, and Sample E1) including transistors were fabricated, and the electrical characteristics of the transistors were evaluated.

<1-1. Structures of Samples>

In Samples C1 to C4, an oxide semiconductor film is used in a channel region. In Sample D1, n-type low temperature poly silicon (LTPS) is used in a channel region. In Sample E1, p-type LTPS is used in a channel region. That is, Samples C1 to C4 are samples of one embodiment of the present invention and Samples D1 and E1 are samples for comparison.

Note that Samples C1 to C4 with different transistor sizes were fabricated through the same process.

The sizes of transistors in Sample C1, Sample C2, Sample C3, and Sample C4 were L/W=2 μm/3 μm, L/W=3 μm/3 μm, L/W=6 μm/3 μm, and L/W=10 μm/3 μm, respectively.

The size of each transistor in Samples D1 and E1 for comparison was L/W=6 μm/3 μm.

<1-2. Fabrication Method of Samples C1 to C4>

First, a fabrication method of Samples C1 to C4 is described.

Samples C1 to C4 were fabricated by a method similar to that for fabricating Sample A3 in Embodiment 1.

<1-3. Fabrication Method of Samples D1 and E1>

In Samples D1 and E1, LTPS is used for a semiconductor layer and the fabrication method of the transistor is similar to that of Samples C1 to C4.

<1-4. $I_d$-$V_g$ Characteristics of Transistors>

Figure 66:
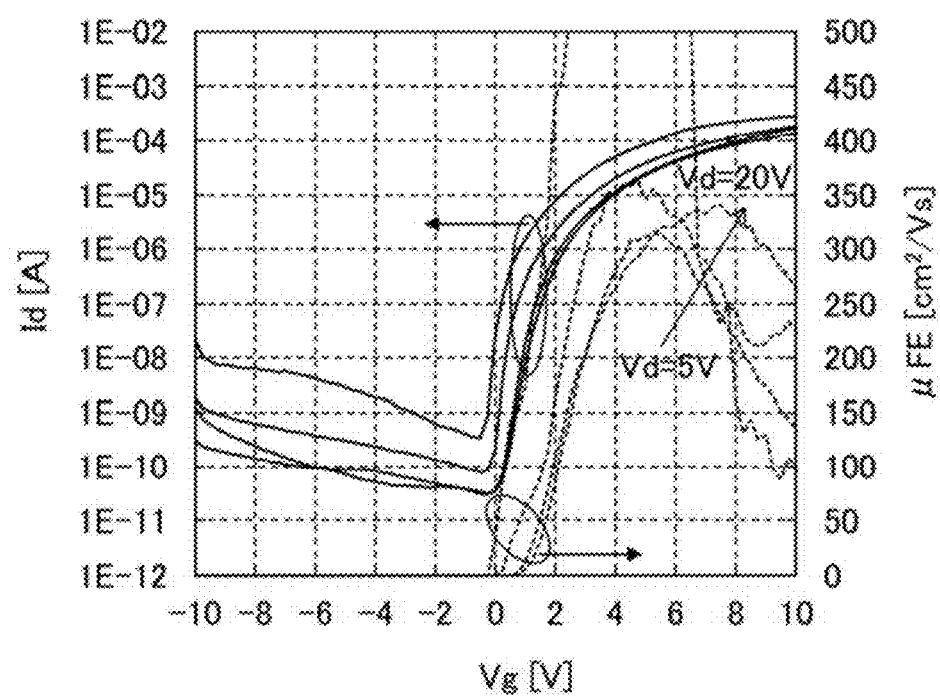
FIG. 66 shows $I_d$-$V_g$ characteristics of transistors in Example.
Figure 67:
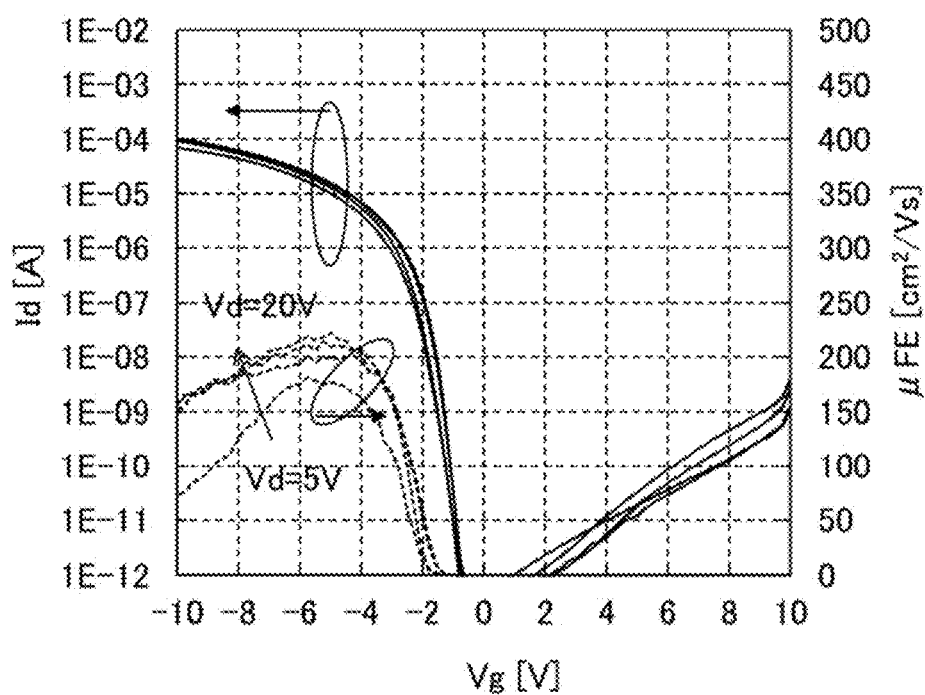
FIG. 67 shows $I_d$-$V_g$ characteristics of transistors in Example.

FIG. 62, FIG. 63, FIG. 64, and FIG. 65 show $I_d$-$V_g$ characteristics of transistors formed in Sample C1, Sample C2, Sample C3, and Sample C4, respectively. FIG. 66 and FIG. 67 show $I_d$-$V_g$ characteristics of transistors formed in Sample D1 and Sample E1, respectively.

As conditions for measuring the $I_d$-$V_g$ characteristics of each transistor, a voltage applied to the conductive film serving as a first gate electrode (hereinafter the voltage is also referred to as gate voltage ($V_g$)) and a voltage applied to the conductive film serving as the second gate electrode (hereinafter the voltage is also referred to as back gate voltage ($V_{bg}$)) were changed from −10 V to +10 V in increments of 0.25 V. A voltage applied to the conductive film serving as a source electrode (hereinafter the voltage is also referred to as source voltage ($V_s$)) was 0 V (comm) and different voltages (hereinafter the voltages are also referred to as drain voltage ($V_d$)) were applied to the conductive film serving as a drain electrode in each sample.

As the measurement conditions of the $I_d$-$V_g$ characteristics of transistors formed in Samples C1 to C4, the drain voltages ($V_d$) were 3 V, 4 V, 5 V, 6 V, 7 V, 8 V, 9 V, and 10 V. As the measurement conditions of the $I_d$-$V_g$ characteristics of transistors formed in Samples D1 and E1, the drain voltages ($V_d$) were 5 V, 10 V, 15 V, and 20 V.

In FIG. 62, FIG. 63, FIG. 64, and FIG. 65, the measurement results when the drain voltages ($V_d$) were 3 V, 4 V, 5 V, 6 V, 7 V, 8 V, 9 V, and 10 V overlap with each other. In FIG. 66 and FIG. 67, the measurement results when the drain voltages ($V_d$) were 5 V, 10 V, 15 V, and 20 V overlap with each other.

In FIG. 62, FIG. 63, FIG. 64, FIG. 65, FIG. 66, and FIG. 67, the first vertical axis represents $I_d$ (A), the second vertical axis represents field-effect mobility (μFE) (cm$^2$/Vs), and the horizontal axis represents $V_g$ (V).

As shown in FIG. 62, FIG. 63, FIG. 64, and FIG. 65, in Samples C1 to C4 of one embodiment of the present invention, mobility curves in saturation regions have favorable saturation. Then, from the mobility curves of Samples C1 to C4 in FIG. 62, FIG. 63, FIG. 64, and FIG. 65 in the range of $V_g$ from 3 V to 10 V, the maximum values and the minimum values of the field-effect mobilities and values each obtained by subtracting the minimum value from the maximum value are obtained. Table 3 shows the results.

TABLE 3

| | | $\mu_{FE}$ [cm$^2$/Vs] | | |
|---|---|---|---|---|
| | $V_d$ [V] | Max | Min | Max − Min |
| Sample C1 | 3 | 23.8 | 6.5 | 17.4 |
| | 4 | 27.5 | 9.5 | 18.0 |
| | 5 | 30.0 | 12.9 | 17.1 |
| | 6 | 31.8 | 16.7 | 15.1 |
| | 7 | 33.4 | 21.0 | 12.4 |
| | 8 | 35.2 | 25.6 | 9.6 |
| | 9 | 37.0 | 30.3 | 6.7 |
| | 10 | 39.2 | 34.2 | 4.9 |
| Sample C2 | 3 | 24.5 | 5.7 | 18.8 |
| | 4 | 26.6 | 8.2 | 18.4 |
| | 5 | 27.7 | 11.0 | 16.8 |
| | 6 | 28.6 | 14.1 | 14.5 |
| | 7 | 29.4 | 17.7 | 11.7 |
| | 8 | 30.2 | 21.5 | 8.7 |
| | 9 | 30.7 | 24.9 | 5.9 |
| | 10 | 31.7 | 28.1 | 3.6 |
| Sample C3 | 3 | 21.1 | 6.1 | 15.0 |
| | 4 | 21.8 | 8.7 | 13.1 |
| | 5 | 22.4 | 11.6 | 10.8 |
| | 6 | 22.9 | 14.7 | 8.2 |
| | 7 | 23.5 | 17.8 | 5.6 |
| | 8 | 23.9 | 20.4 | 3.5 |
| | 9 | 24.2 | 20.4 | 3.8 |
| | 10 | 24.7 | 20.6 | 4.1 |
| Sample C4 | 3 | 22.5 | 6.2 | 16.4 |
| | 4 | 23.0 | 8.8 | 14.2 |
| | 5 | 23.3 | 11.8 | 11.5 |
| | 6 | 23.5 | 15.1 | 8.4 |
| | 7 | 23.7 | 18.3 | 5.4 |
| | 8 | 23.9 | 19.4 | 4.5 |
| | 9 | 24.1 | 19.3 | 4.8 |
| | 10 | 24.2 | 19.0 | 5.2 |

As shown in FIG. 62, FIG. 63, FIG. 64, FIG. 65, and Table 3, in the semiconductor device of one embodiment of the present invention, the mobility curve has favorable saturation and a difference between the maximum value and the minimum value of the field-effect mobility in the saturation region is less than or equal to 15 cm$^2$/Vs. In contrast, in each of Samples D1 and E1 for comparison, a difference between the maximum value and the minimum value of the field-effect mobility is large as shown in FIG. 66 and FIG. 67.

As described above, in the semiconductor device of one embodiment of the present invention, the saturation of the mobility curve is extremely favorable. When a transistor having such a characteristic is used as a transistor for a pixel of an organic EL display, for example, high reliability can be obtained. Alternatively, when the above transistor is used for a sensor or the like, stable output characteristics can be obtained. The above characteristic is not achieved when LTPS is used for a semiconductor layer of a transistor, and is an excellent effect obtained when the oxide semiconductor film of one embodiment of the present invention is used for a semiconductor layer of a transistor.

Figure 68:
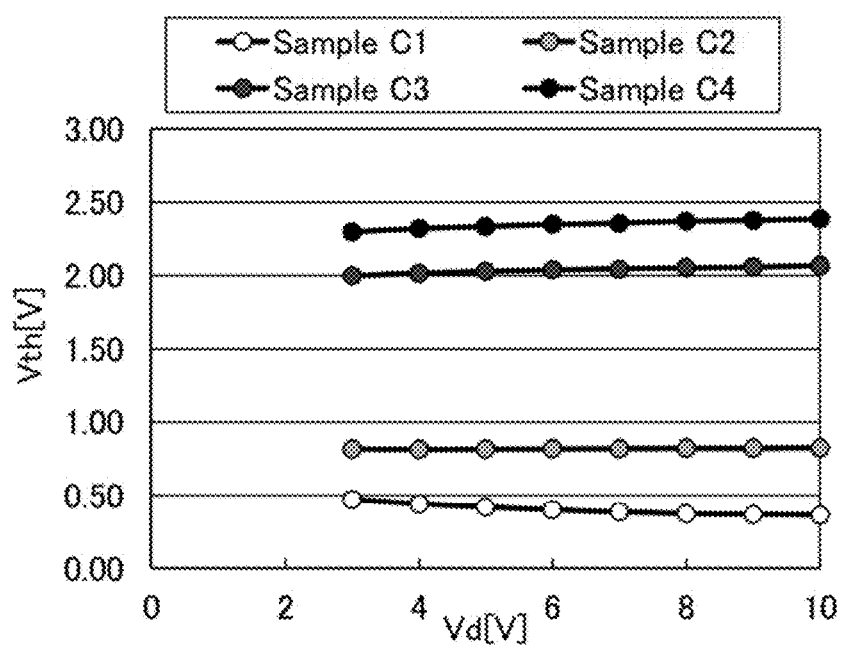
FIG. 68 shows threshold voltages of transistors in Example.

Next, FIG. 68 shows calculation results of the threshold voltages ($V_{th}$) of Samples C1 to C4. The threshold voltages ($V_{th}$) of the transistors are calculated by a constant current method. The constant current method is a method in which, from the results of $I_d$-$V_g$ characteristics, $I_d$ is normalized to be L/W=1 and $V_g$ in the case where a constant current (here, 1 nA) flows is set to a threshold voltage ($V_{th}$).

As shown in FIG. 68, the threshold voltages of Samples C1 to C4 are substantially constant even when $V_d$ is increased. Thus, Samples C1 to C4 of one embodiment of the present invention have stable electrical characteristics.

Note that the structures described in this example can be used in combination with any of the structures described in the other embodiments as appropriate.

EXPLANATION OF REFERENCE

100A: transistor, 100B: transistor, 100C: transistor, 100D: transistor, 100E: transistor, 100F: transistor, 100G: transistor, 100H: transistor, 100J: transistor, 102: substrate, 104: insulating film, 106: conductive film, 108: oxide semiconductor film, 108_1: oxide semiconductor film, 108_2: oxide semiconductor film, 108_3: oxide semiconductor film, 108*d*: drain region, 108*f*: regions, 108*i*: channel region, 108*s*: source region, 110: insulating film, 112: conductive film, 112_1: conductive film, 112_2: conductive film, 116: insulating film, 118: insulating film, 120*a*: conductive film, 120*b*: conductive film, 122: insulating film, 141*a*: opening, 141*b*: opening, 143: opening, 200: transistor, 205: conductor, 205*a*: conductor, 205*b*: conductor, 210: insulator, 212: insulator, 214: insulator, 216: insulator, 218: conductor, 220: insulator, 222: insulator, 224: insulator, 230: oxide semiconductor, 230*a*: oxide semiconductor, 230*b*: oxide semiconductor, 230*c*: oxide semiconductor, 240*a*: conductor, 240*b*: conductor, 244: conductor, 245: conductor, 250: insulator, 260: conductor, 260*a*: conductor, 260*b*: conductor, 270: insulator, 280: insulator, 282: insulator, 284: insulator, 400: transistor, 401: substrate, 402: semiconductor region, 404: insulator, 406: conductor, 408*a*: low-resistance region, 408*b*: low-resistance region, 410: capacitor, 420: insulator, 422: insulator, 424: insulator, 426: insulator, 428: conductor, 430: conductor, 450: insulator, 452: insulator, 454: insulator, 456: conductor, 458: insulator, 460: insulator, 462: conductor, 466: conductor, 470: insulator, 474: conductor, 480: insulator, 482: insulator, 484: insulator, 501: pixel circuit, 502: pixel portion, 504: driver circuit portion, 504*a*: gate driver, 504*b*: source driver, 506: protection circuit, 507: terminal portion, 550: transistor, 552: transistor, 554: transistor, 560: capacitor, 562: capacitor, 570: liquid crystal element, 572: light-emitting element, 664: electrode, 665: electrode, 667: electrode, 700: display device, 701: substrate, 702: pixel portion, 704: source driver circuit portion, 705: substrate, 706: gate driver circuit portion, 708: FPC terminal portion, 710: signal line, 711: lead wiring portion, 712: sealant, 716: FPC, 730: insulating film, 732: sealing film, 734: insulating film, 736: coloring film, 738: light-blocking film, 750: transistor, 752: transistor, 760: connection electrode, 770: planarization insulating film, 772: conductive film, 773: insulating film, 774: conductive film, 775: liquid crystal element, 776: liquid crystal layer, 778: structure body, 780: anisotropic conductive film, 782: light-emitting element, 783: droplet discharge apparatus, 784: droplet, 785: layer, 786: EL layer, 788: conductive film, 790: capacitor, 791: touch panel, 792: insulating film, 793: electrode, 794: electrode, 795: insulating film, 796: electrode, 797: insulating film, 800: inverter, 810: OS transistor, 820: OS transistor, 831: signal waveform, 832: signal waveform, 840: dashed line, 841: solid line, 850: OS transistor, 860: CMOS inverter, 900: semiconductor device, 901: power supply circuit, 902: circuit, 903: voltage generation circuit, 903A: voltage generation circuit, 903B: voltage generation circuit, 903C: voltage generation circuit, 904: circuit, 905: voltage generation circuit, 906: circuit, 911: transistor, 912: transistor, 912A: transistor, 912B: transistor, 921: control circuit, 922: transistor, 1400: droplet discharge apparatus, 1402: substrate, 1403: droplet discharge means, 1404: imaging means, 1405: head, 1406: dotted line, 1407: control means, 1408: storage medium, 1409: image processing means, 1410: computer, 1411: marker, 1412: head, 1413: material supply source, 1414: material supply source, 7000: display module, 7001: upper cover, 7002: lower cover, 7003: FPC, 7004: touch panel, 7005: FPC, 7006: display panel, 7007: backlight, 7008: light source, 7009: frame, 7010: printed board, 7011: battery, 8000: camera, 8001: housing, 8002: display portion, 8003: operation buttons, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing bands, 8305: lenses, 9000: housing, 9001: display portion, 9003: speaker, 9005: operation key, 9006: connection terminal, 9007: sensor, 9008: microphone, 9050: operation buttons, 9051: information, 9052: information, 9053: information, 9054: information, 9055: hinges, 9100: television device, 9101: portable information terminal, 9102: portable information terminal, 9200: portable information terminal, 9201: portable information terminal, 9500: display device, 9501: display panels, 9502: display region, 9503: region, 9511: hinge, 9512: bearing.

This application is based on Japanese Patent Application serial no. 2016-024579 filed with Japan Patent Office on Feb. 12, 2016, and Japanese Patent Application serial no. 2016-125375 filed with Japan Patent Office on Jun. 24, 2016, the entire contents of which are hereby incorporated by reference.

The invention claimed is:

1. A transistor comprising:
a first gate electrode;
an oxide semiconductor film, the oxide semiconductor film including a drain region;
a second gate electrode;
an insulating film over the oxide semiconductor film, the insulating film including an opening; and
a drain electrode over the insulating film, the drain electrode being in contact with the drain region in the opening,
wherein the first gate electrode and the second gate electrode are electrically connected to each other, wherein, under a first condition, a difference between a minimum value and a maximum value of field-effect mobility of the transistor is less than or equal to 15 cm$^2$/Vs, and wherein the first condition is that voltages applied to the first gate electrode and the second gate electrode are in a range from 3 V to 10 V and a voltage applied to the drain region of the oxide semiconductor film is 20 V.

2. The transistor according to claim 1, wherein the oxide semiconductor film comprises In, M (M is at least one of Al, Ga, Y, and Sn), and Zn.

3. The transistor according to claim 2,
wherein an atomic ratio of In to M and Zn is in a neighborhood of In:M:Zn=4:2:3, and
wherein when a proportion of In is 4, a proportion of M is greater than or equal to 1.5 and less than or equal to 2.5, and a proportion of Zn is greater than or equal to 2 and less than or equal to 4.

4. The transistor according to claim 1, further comprising a substrate, wherein a substrate temperature during deposition of the oxide semiconductor film is room temperature.

5. The transistor according to claim 1, further comprising a source electrode electrically connected to the oxide semiconductor film.

6. The transistor according to claim 1, wherein a hydrogen concentration of the oxide semiconductor film measured by secondary ion mass spectrometry (SIMS) is lower than $1\times10^{18}$ atoms/cm$^3$.

7. A semiconductor device comprising the transistor according to claim 1.

8. A transistor comprising:
a first gate electrode;
an oxide semiconductor film, the oxide semiconductor film including a drain region;
a second gate electrode;
an insulating film over the oxide semiconductor film, the insulating film including an opening; and
a drain electrode over the insulating film, the drain electrode being in contact with the drain region in the opening,
wherein the first gate electrode and the second gate electrode are electrically connected to each other,
wherein the oxide semiconductor film comprises nanocrystals,
wherein, under a first condition, a difference between a minimum value and a maximum value of field-effect mobility of the transistor is less than or equal to 15 cm$^2$/Vs, and
wherein the first condition is that voltages applied to the first gate electrode and the second gate electrode are in a range from 3 V to 10 V and a voltage applied to the drain region of the oxide semiconductor film is 20 V.

9. The transistor according to claim 8, wherein the oxide semiconductor film comprises In, M (M is at least one of Al, Ga, Y, and Sn), and Zn.

10. The transistor according to claim 9,
wherein an atomic ratio of In to M and Zn is in a neighborhood of In:M:Zn=4:2:3, and
wherein when a proportion of In is 4, a proportion of M is greater than or equal to 1.5 and less than or equal to 2.5, and a proportion of Zn is greater than or equal to 2 and less than or equal to 4.

11. The transistor according to claim 8, further comprising a substrate, wherein a substrate temperature during deposition of the oxide semiconductor film is room temperature.

12. The transistor according to claim 8, further comprising a source electrode electrically connected to the oxide semiconductor film.

13. The transistor according to claim 8, wherein a hydrogen concentration of the oxide semiconductor film measured by secondary ion mass spectrometry (SIMS) is lower than $1\times10^{18}$ atoms/cm$^3$.

14. A semiconductor device comprising the transistor according to claim 8.

15. A semiconductor device comprising:
a transistor comprising:
a first gate electrode;
a first insulating film over the first gate electrode;
an oxide semiconductor film over the first insulating film;
a second insulating film over the oxide semiconductor film;
a second gate electrode over the second insulating film; and
a third insulating film over the oxide semiconductor film and the second gate electrode,
wherein the oxide semiconductor film comprises a channel region overlapping with the second gate electrode, a source region in contact with the third insulating film, and a drain region in contact with the third insulating film,
wherein the first gate electrode and the second gate electrode are electrically connected to each other,
wherein, under a first condition, a difference between a minimum value and a maximum value of field-effect mobility of the transistor is less than or equal to 15 cm$^2$/Vs, and
wherein the first condition is that voltages applied to the first gate electrode and the second gate electrode are in a range from 3 V to 10 V and a voltage applied to the drain region is 20 V.

16. The semiconductor device according to claim 15, wherein the oxide semiconductor film comprises In, M (M is Al, Ga, Y, and Sn), and Zn.

17. The semiconductor device according to claim 16,
wherein an atomic ratio of In to M and Zn is in a neighborhood of In:M:Zn=4:2:3, and
wherein when a proportion of In is 4, a proportion of M is greater than or equal to 1.5 and less than or equal to 2.5, and a proportion of Zn is greater than or equal to 2 and less than or equal to 4.

18. A display device comprising:
the semiconductor device according to claim 15; and
a display element.

19. A display module comprising:
the display device according to claim 18; and
a touch sensor.

20. The transistor according to claim 1,
wherein, under a second condition, a difference between a minimum value and a maximum value of field-effect mobility of the transistor is less than or equal to 15 cm$^2$/Vs, and,
wherein the second condition is that voltages applied to the first gate electrode and the second gate electrode are in a range from 3 V to 10 V and a voltage applied to the drain region of the oxide semiconductor film is 10 V.

21. The transistor according to claim 8,
wherein, under a second condition, a difference between a minimum value and a maximum value of field-effect mobility of the transistor is less than or equal to 15 cm$^2$/Vs, and,
wherein the second condition is that voltages applied to the first gate electrode and the second gate electrode are in a range from 3 V to 10 V and a voltage applied to the drain region of the oxide semiconductor film is 10 V.

22. The transistor according to claim 15,
wherein, under a second condition, a difference between a minimum value and a maximum value of field-effect mobility of the transistor is less than or equal to 15 $cm^2/Vs$, and,
wherein the second condition is that voltages applied to the first gate electrode and the second gate electrode are in a range from 3 V to 10 V and a voltage applied to the drain region of the oxide semiconductor film is 10 V.

* * * * *